United States Patent
Watanabe et al.

(10) Patent No.: US 10,639,924 B2
(45) Date of Patent: *May 5, 2020

(54) LITHOGRAPHIC PRINTING PLATE PRECURSOR, METHOD OF PRODUCING SAME, LITHOGRAPHIC PRINTING PLATE PRECURSOR LAMINATE, PLATE-MAKING METHOD FOR LITHOGRAPHIC PRINTING PLATE, AND LITHOGRAPHIC PRINTING METHOD

(71) Applicant: FUJIFILM CORPORATION, Minato-ku, Tokyo (JP)

(72) Inventors: Shumpei Watanabe, Shizuoka (JP); Yusuke Ikeyama, Shizuoka (JP); Atsushi Oshima, Shizuoka (JP); Shuji Shimanaka, Shizuoka (JP)

(73) Assignee: FUJIFILM CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/371,121

(22) Filed: Apr. 1, 2019

(65) Prior Publication Data

US 2019/0225002 A1   Jul. 25, 2019

Related U.S. Application Data

(63) Continuation of application No. PCT/JP2018/013905, filed on Mar. 30, 2018.

(30) Foreign Application Priority Data

Mar. 31, 2017  (JP) .................................. 2017-072053

(51) Int. Cl.
*G03F 7/00*  (2006.01)
*B41N 1/14* (2006.01)
(Continued)

(52) U.S. Cl.
CPC .............. *B41N 1/14* (2013.01); *B41C 1/1008* (2013.01); *B41N 1/08* (2013.01); *B41N 3/00* (2013.01);
(Continued)

(58) Field of Classification Search
CPC .............................. B41C 1/1008; G03F 7/004
See application file for complete search history.

(56) References Cited

U.S. PATENT DOCUMENTS 7,910,286 B2  3/2011  Mitsumoto et al.
2006/0046186 A1*  3/2006  Koizumi ................ B41N 1/083
430/270.1

(Continued)

FOREIGN PATENT DOCUMENTS

CN  103568471 A  2/2014
EP  1685957 A2  8/2006
(Continued)

OTHER PUBLICATIONS

International Search Report issued in International Application No. PCT/JP2018/013905 dated Jun. 12, 2018.
(Continued)

*Primary Examiner* — Chanceity N Robinson
(74) *Attorney, Agent, or Firm* — Solaris Intellectual Property Group, PLLC

(57) ABSTRACT

A lithographic printing plate precursor including a hydrophilized aluminum support, and a water-soluble or water-dispersible negative type image recording layer provided on the aluminum support, in which an arithmetic average height Sa of a surface of an outermost layer on a side where the image recording layer is provided is in a range of 0.3 μm to 20 μm; a method of producing a lithographic printing plate precursor; a lithographic printing plate precursor laminate formed of the lithographic printing plate precursor; a plate-
(Continued)

making method for a lithographic printing plate; and a lithographic printing method.

23 Claims, 4 Drawing Sheets

(51) Int. Cl.
    *B41N 3/00*         (2006.01)
    *B41N 1/08*         (2006.01)
    *B41C 1/10*         (2006.01)
    *G03F 7/11*         (2006.01)
    *G03F 7/09*         (2006.01)
    *G03F 7/027*        (2006.01)
    *G03F 7/004*        (2006.01)
    *G03F 7/033*        (2006.01)

(52) U.S. Cl.
    CPC ............... *G03F 7/00* (2013.01); *G03F 7/004* (2013.01); *G03F 7/027* (2013.01); *G03F 7/033* (2013.01); *G03F 7/09* (2013.01); *G03F 7/11* (2013.01)

(56) References Cited

U.S. PATENT DOCUMENTS

| | | | |
|---|---|---|---|
| 2006/0166137 A1* | 7/2006 | Mitsumoto | B41C 1/1008 430/270.1 |
| 2007/0231740 A1 | 10/2007 | Yanaka et al. | |
| 2009/0095184 A1 | 4/2009 | Vermeersch et al. | |
| 2009/0246699 A1 | 10/2009 | Sonokawa | |
| 2010/0075258 A1 | 3/2010 | Munnelly et al. | |
| 2011/0053085 A1 | 3/2011 | Huang et al. | |
| 2011/0134411 A1 | 6/2011 | Mitsumoto et al. | |
| 2014/0326151 A1* | 11/2014 | Namba | B41N 3/034 10/459 |

FOREIGN PATENT DOCUMENTS

| | | |
|---|---|---|
| EP | 1839853 A1 | 10/2007 |
| EP | 2353882 A1 | 8/2011 |
| EP | 2690495 A1 | 1/2014 |
| JP | 2001-117236 A | 4/2001 |
| JP | 2005-14230 A | 1/2005 |
| JP | 2005-81583 A | 3/2005 |
| JP | 2005-142302 A | 6/2005 |
| JP | 2005-297232 A | 10/2005 |
| JP | 2006-62322 A | 3/2006 |
| JP | 2006-297645 A | 11/2006 |
| JP | 2007-55224 A | 3/2007 |
| JP | 2007-272143 A | 10/2007 |
| JP | 2008-503365 A | 2/2008 |
| JP | 2008-89858 A | 4/2008 |
| JP | 2008-258381 A | 10/2008 |
| JP | 4546453 B2 | 9/2010 |
| JP | 2011-173413 A | 9/2011 |
| JP | 2012-206495 A | 10/2012 |
| JP | 2013-503365 A | 1/2013 |

OTHER PUBLICATIONS

Written Opinion of the ISA issued in International Application No. PCT/JP2018/013905 dated Jun. 12, 2018.
English language translation of the following: Office action dated Jul. 23, 2019 from the SIPO in a Chinese patent application No. 201880003893.1 corresponding to the instant patent application. This office action translation is submitted now in order to supplement the understanding of the cited references which are being disclosed in the instant Information Disclosure Statement.
Extended European Search Report dated Feb. 20, 2020, issued in corresponding EP Patent Application No. 18777209.0.

* cited by examiner

LITHOGRAPHIC PRINTING PLATE PRECURSOR, METHOD OF PRODUCING SAME, LITHOGRAPHIC PRINTING PLATE PRECURSOR LAMINATE, PLATE-MAKING METHOD FOR LITHOGRAPHIC PRINTING PLATE, AND LITHOGRAPHIC PRINTING METHOD

CROSS-REFERENCE TO RELATED APPLICATIONS

This application is a Continuation of International Application No. PCT/JP2018/013905 filed on Mar. 30, 2018, which claims priority to Japanese Patent Application No. 2017-072053 filed on Mar. 31, 2017. The entire contents of these applications are incorporated herein by reference.

BACKGROUND OF THE INVENTION

1. Field of the Invention

The present disclosure relates to a lithographic printing plate precursor, a method of producing the same, a lithographic printing plate precursor laminate, a plate-making method for a lithographic printing plate, and a lithographic printing method.

2. Description of the Related Art

A lithographic printing plate precursor is frequently stored and transported as a laminate formed by laminating a plurality of sheets thereof. In this laminate, interleaving paper is typically inserted into the space between lithographic printing plate precursors for the purpose of preventing dislocation in stacking of lithographic printing plate precursors, preventing adhesion between lithographic printing plate precursors, and preventing scratches on a surface of a lithographic printing plate precursor on an image recording layer side. However, in a case where interleaving paper is used, problems of cost increase, a disposal treatment, and the like may occur, and thus the interleaving paper needs to be removed before an exposure step. Therefore, this may also result in risk of occurrence of a load on a plate-making step and occurrence of interleaving paper peeling failure. Accordingly, development of a lithographic printing plate precursor that enables lamination without interleaving paper has been required.

Examples of lithographic printing plate precursors of the related art include those described in JP2008-258381A, JP4546453B, JP2008-089858A, JP2012-206495A, and JP2008-503365A.

JP2008-258381A describes a negative type lithographic printing plate precursor which includes a support; a recording layer on the support; and a protective layer, as an outermost layer, containing an organic resin fine particle whose surface is coated with a hydrophilic polymer and silica.

JP4546453B describes an image formable element including a base; and an image formable layer on the base, in which the image formable layer contains an image formable composition and 0.1 wt % to 2 wt % silicate-coated polymer particles based on the weight of the image formable layer, the silicate-coated polymer particles have a diameter of 1 μm to 20 μm, and the image formable element contains a photothermal conversion material.

JP2008-089858A describes a lithographic printing plate precursor including, in this order, an aluminum support which has a hydrophilic surface; a photosensitive layer which contains a radiation absorbing agent, a polymerization initiator, and a polymerizable compound; and a protective layer which contains polyvinyl alcohol and has a projection formed by adhering fine liquid droplets of an aqueous solution in which a resin is dissolved or dispersed to the surface thereof and drying the liquid droplets on the aluminum support.

JP2012-206495A describes a lithographic printing plate precursor which includes a hydrophilic support and an image recording layer containing (A) polymer fine particles, (B) radical polymerizable compound, and (C) infrared absorbing dye on the hydrophilic support, in which (A) polymer fine particles are obtained by reacting a polyvalent isocyanate compound which is an adduct of a polyhydric phenol compound containing two or more hydroxy groups in a molecule and isophorone diisocyanate with a compound containing an active hydrogen atom.

JP2008-503365A describes an image formable element which includes a lithographic substrate; and a polymer binder containing (a) radical polymerizable component, (b) initiator system capable of generating radicals sufficient to initiate a polymerization reaction when exposed to radiation for forming an image, (c) hydrophobic main chain, and both of (i) constitutional unit that contains a pendant-cyano group directly bonded to the hydrophobic main chain and (ii) constitutional unit that contains a pendant group having a hydrophilic poly(alkylene oxide) segment.

SUMMARY OF THE INVENTION

A lithographic printing plate precursor is typically used by laminating precursors in a state of interposing interleaving paper between precursors for the purpose of preventing dislocation in stacking precursors at the time of producing precursors, preventing adhesion between precursors, preventing multiple precursors from being fed in a plate-making step of taking out precursor from the stack one by one, preventing scratches at the time of producing and stacking precursors, performing transportation and in a series of steps carried out at the time of user plate-making and before printing. However, there is a case where interleaving paper is eliminated for the purpose of preventing interleaving paper peeling failure at the time of user plate-making, improving the plate-making speed, and reducing the cost. In a case where interleaving paper is eliminated, by forming projections in the coating layer on the surface of the support as described in JP2008-258381A and JP4546453B or outside the coating layer as described in JP2008-089858A, the dislocation of precursors, the adhesion between precursors, the feeding of multiple precursors, and the scratches are prevented.

However, these techniques are achieved using a lithographic printing plate (hereinafter, referred to as a "treated plate") to be developed by an alkali developer. However, there are problems of falling of particles and damage to an image recording layer in a case of a lithographic printing plate (hereinafter, referred to as an "untreated plate") to be developed on a printing press because a protective layer is a thin film or is not present and the image recording layer is designed to be brittle in order to impart peeling properties and developability obtained by using tack power of an ink. Particularly, in a case where the roughness is imparted to the surface of the image recording layer of an untreated plate as described in JP2008-258381A, JP4546453B, and JP2008-089858A, the image recording layer (photosensitive layer) is damaged due to concentration of a pressure on the projections thereof. As the result, partial on-press development delay occurs and thus waste paper (the printed material generated until the desired paper quality is obtained) at the initial stage of printing is increased. Further, even in the development carried out using a developer, there is a problem in that the development speed is decreased.

An object of embodiments of the present invention in order to solve the problems is to provide a lithographic printing plate precursor with excellent development delay resistance and an excellent plate feeding property of taking out a precursor from a laminate; a method of producing the same; a lithographic printing plate precursor laminate formed of the lithographic printing plate precursor; a plate-making method for a lithographic printing plate; and a lithographic printing method.

The means for solving the above-described problems includes the following aspects.

<1> A lithographic printing plate precursor comprising: a hydrophilized aluminum support; and a water-soluble or water-dispersible negative type image recording layer provided on the aluminum support, in which an arithmetic average height Sa of a surface of an outermost layer on a side where the image recording layer is provided is in a range of 0.3 μm to 20 μm.

<2> The lithographic printing plate precursor according to <1>, in which the image recording layer contains an infrared absorbing agent, a polymerization initiator, a polymerizable compound, and a polymer compound having a particle shape.

<3> The lithographic printing plate precursor according to <2>, in which the polymer compound having a particle shape that is contained in the image recording layer is obtained by reacting a polyvalent isocyanate compound which is an adduct of a polyhydric phenol compound containing two or more hydroxy groups in a molecule and isophorone diisocyanate with a compound containing an active hydrogen atom.

<4> The lithographic printing plate precursor according to any one of <1> to <3>, further comprising: a protective layer on the image recording layer.

<5> The lithographic printing plate precursor according to <2>, in which the polymer compound having a particle shape that is contained in the image recording layer has a hydrophobic main chain and both of (i) constitutional unit which contains a pendant-cyano group directly bonded to the hydrophobic main chain and (ii) constitutional unit which contains a pendant group having a hydrophilic polyalkylene oxide segment.

<6> The lithographic printing plate precursor according to <1>, in which the image recording layer contains an infrared absorbing agent and a thermoplastic polymer particle.

<7> The lithographic printing plate precursor according to any one of <1> to <6>, in which the image recording layer contains at least one kind of particles having an average particle diameter of 0.5 μm to 20 μm and two or more kinds of particles having different average particle diameters.

<8> The lithographic printing plate precursor according to <4>, in which the protective layer contains at least one kind of particles having an average particle diameter of 0.5 μm to 20 μm.

<9> The lithographic printing plate precursor according to <7> or <8>, in which an in-plane density of the particles having an average particle diameter of 0.5 μm to 20 μm is 10000 pcs/mm$^2$ or less.

<10> The lithographic printing plate precursor according to any one of <7> to <9>, in which the particles having an average particle diameter of 0.5 μm to 20 μm are at least one kind of particles selected from the group consisting of organic resin particles and inorganic particles.

<11> The lithographic printing plate precursor according to <2> or <6>, in which the image recording layer is an outermost layer and has a plurality of protrusions containing, as a main component, a polymer compound on the image recording layer.

<12> The lithographic printing plate precursor according to <4>, in which the protective layer is an outermost layer and has a plurality of protrusions containing, as a main component, a polymer compound on the protective layer.

<13> The lithographic printing plate precursor according to <11> or <12>, in which the polymer compound constituting the protrusions contains at least one selected from the group consisting of a novolak resin such as a phenol formaldehyde resin, an m-cresol formaldehyde resin, a p-cresol formaldehyde resin, an m-/p-mixed cresol formaldehyde resin, or a phenol/cresol-mixed formaldehyde resin, a resol resin, pyrogallol, an acetone resin, an epoxy resin, a saturated copolymer polyester resin, a phenoxy resin, a polyvinyl acetal resin, a vinylidene chloride copolymer resin, polybutene, polybutadiene, polyamide, an unsaturated copolymer polyester resin, polyurethane, polyurea, polyimide, polysiloxane, polycarbonate, chlorinated polyethylene, an aldehyde condensation resin of alkyl phenol, polyvinyl chloride, polyvinylidene chloride, polystyrene, polyacrylate, a carboxyvinyl polymer, an acrylic resin copolymer resin, hydroxy cellulose, hydroxymethyl cellulose, polyvinyl alcohol, polyvinylpyrrolidone, cellulose acetate, methyl cellulose, and carboxymethyl cellulose.

<14> The lithographic printing plate precursor according to any one of <1> to <13>, in which an arithmetic average height Sa of a surface of an outermost layer on a side opposite to the side where the image recording layer is provided is in a range of 0.1 μm to 20 μm.

<15> The lithographic printing plate precursor according to any one of <1> to <14>, in which a total value of the arithmetic average height Sa of the surface of the outermost layer on the side where the image recording layer is provided and the arithmetic average height Sa of the surface of the outermost layer on a side opposite to the side where the image recording layer is provided is greater than 0.3 μm and 20 μm or less.

<16> The lithographic printing plate precursor according to any one of <1> to <15>, which satisfies Expression (1) and Expression (2) in a case where a Bekk smoothness of the surface of the outermost layer on the side where the image recording layer is provided is set as a seconds and a Bekk smoothness of a surface of an outermost layer on a side opposite to the side where the image recording layer is provided is set as b seconds.

$$a \leq 1000, b \leq 1000 \qquad (1)$$

$$1/a + 1/b \geq 0.002 \qquad (2)$$

<17> The lithographic printing plate precursor according to any one of <14> to <16>, in which a back coat layer which contains particles having an average particle diameter of 0.1 μm to 20 μm is provided, as the outermost layer, on the side opposite to the side where the image recording layer is provided.

<18> The lithographic printing plate precursor according to any one of <14> to <16>, in which the surface of the outermost layer on the side opposite to the side where the image recording layer is provided has a plurality of protrusions.

<19> The lithographic printing plate precursor according to <18>, which includes at least one layer between the protrusions, provided on the side opposite to the side where the image recording layer is provided, and the aluminum support.

<20> The lithographic printing plate precursor according to any one of <1> to <19>, in which the aluminum support includes an aluminum plate and an aluminum anodized film disposed on the aluminum plate, the anodized film is positioned closer to the image recording layer side than to the aluminum plate, the anodized film has micropores extending in a depth direction from the surface of the image recording layer side, and the average diameter of the micropores in the surface of the anodized film is in a range of 7 nm to 150 nm.

<21> The lithographic printing plate precursor according to <20>, in which the average diameter of the micropores in the surface of the anodized film is in a range of 10 nm to 100 nm.

<22> The lithographic printing plate precursor according to <20> or <21>, in which the micropores are formed of large-diameter pores extending to a position at a depth of 10 nm to 1000 nm from the surface of the anodized film and small-diameter pores communicating with a bottom of the large-diameter pores and extending to a position at a depth of 20 nm to 2000 nm from a communication position, the average diameter of the large-diameter pores in the surface of the anodized film is in a range of 15 to 150 nm, and the average diameter of the small-diameter pores in the communication position is 13 nm or less.

<23> A lithographic printing plate precursor comprising: a hydrophilized aluminum support; and a water-soluble or water-dispersible negative type image recording layer provided on the aluminum support, in which Expression (1) and Expression (2) are satisfied in a case where a Bekk smoothness of a surface of an outermost layer on a side where the image recording layer is provided is set as a seconds and a Bekk smoothness of a surface of an outermost layer on a side opposite to the side where the image recording layer is provided is set as b seconds.

$$a \leq 1000, b \leq 1000 \quad (1)$$

$$1/a + 1/b \geq 0.002 \quad (2)$$

<24> A lithographic printing plate precursor laminate which is obtained by laminating a plurality of the lithographic printing plate precursors according to any one of <1> to <23>, in which the outermost layer on the side where the image recording layer is provided and the outermost layer on a side opposite to the side where the image recording layer is provided are laminated by being directly brought into contact with each other.

<25> A method of producing the lithographic printing plate precursor according to any one of <1> to <23>, comprising: a step of forming the image recording layer on the aluminum support after one or more days from an anodization treatment performed thereon.

<26> A plate-making method for a lithographic printing plate, comprising: a step of image-exposing the lithographic printing plate precursor according to any one of <1> to <23>; and a step of supplying at least any of printing ink or dampening water and removing an unexposed portion of an image recording layer on a printing press to prepare a lithographic printing plate.

<27> A plate-making method for a lithographic printing plate, comprising: a step of image-exposing the lithographic printing plate precursor according to any one of <1> to <23>; and a step of supplying a developer having a pH of 2 to 14 and removing an unexposed portion of an image recording layer to prepare a lithographic printing plate.

<28> A lithographic printing method comprising: a step of image-exposing the lithographic printing plate precursor according to any one of <1> to <23>; a step of supplying at least any of printing ink or dampening water and removing an unexposed portion of an image recording layer on a printing press to prepare a lithographic printing plate; and a step of performing printing using the obtained lithographic printing plate.

<29> A lithographic printing method comprising: a step of image-exposing the lithographic printing plate precursor according to any one of <1> to <23>; a step of supplying a developer having a pH of 2 to 14 and removing the unexposed portion of an image recording layer to prepare a lithographic printing plate; and a step of performing printing using the obtained lithographic printing plate.

According to the embodiment of the present invention, it is possible to provide a lithographic printing plate precursor with excellent development delay resistance and an excellent plate feeding property of taking out a precursor from a laminate; a method of producing the same; a lithographic printing plate precursor laminate formed of the lithographic printing plate precursor; a plate-making method for a lithographic printing plate, and a lithographic printing method.

DESCRIPTION OF THE PREFERRED EMBODIMENTS

Figure 1:
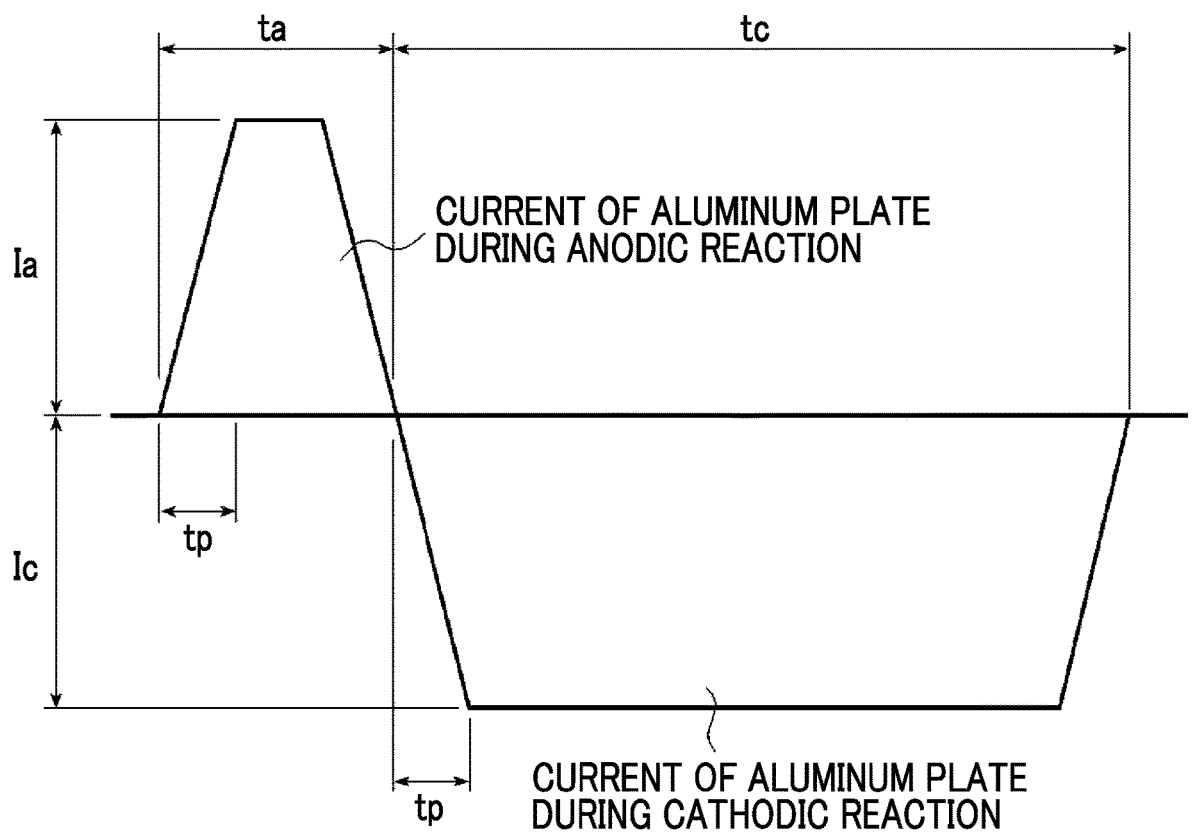
FIG. 1 is a side view illustrating an example of a radial type cell in an electrochemical roughening treatment carried out using the alternating current according to the method of producing an aluminum support.

Hereinafter, the contents of the present disclosure will be described in detail. The description of constituent elements below is made based on representative embodiments of the present disclosure in some cases, but the present disclosure is not limited to such embodiments.

Further, in the present specification, the numerical ranges shown using "to" indicate ranges including the numerical values described before and after "to" as the lower limits and the upper limits.

In the present specification, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both of acryl and methacryl, and the concept of "(meth)acryloyl" includes both of acryloyl and methacryloyl. Further, the term "step" in the present specification indicates not only an independent step but also a step which cannot be clearly distinguished from other steps as long as the intended purpose of the step is achieved. Further, in the present disclosure, "% by mass" has the same definition as that for "% by weight", and "part by mass" has the same definition as that for "part by weight".

Further, in the present disclosure, a combination of two or more preferred aspects is a more preferred aspect.

Further, the weight-average molecular weight (Mw) and the number average molecular weight (Mn) in the present disclosure are molecular weights in terms of polystyrene used as a standard substance, which are detected by using a solvent tetrahydrofuran (THF), a differential refractometer, and a gel permeation chromatography (GPC) analyzer using TSKgel GMHxL, TSKgel G4000HxL, and TSKgel G2000HxL (all trade names, manufactured by Tosoh Corporation) as columns, unless otherwise specified.

In the present specification, the term "lithographic printing plate precursor" includes not only a lithographic printing plate precursor but also a key plate precursor. Further, the term "lithographic printing plate" includes not only a lithographic printing plate prepared by performing operations such as exposure, and development, on a lithographic printing plate precursor as necessary but also a key plate. In a case of a key plate precursor, the operations of exposure, development, and the like are not necessarily required. Further, a key plate is a lithographic printing plate precursor for attachment to a plate cylinder that is not used in a case where printing is performed on a part of a paper surface with one or two colors in color newspaper printing.

Hereinafter, the present disclosure will be described in detail.

(Lithographic Printing Plate Precursor)

A lithographic printing plate precursor according to the present disclosure includes a hydrophilized aluminum support (simply referred to as a "support"); and a water-soluble or water-dispersible negative type image recording layer (simply referred to as an "image recording layer") provided on the aluminum support, in which an arithmetic average height Sa of a surface of an outermost layer on a side where the image recording layer is provided is in a range of 0.3 μm to 20 μm or in which Expression (1) and Expression (2) are satisfied in a case where a Bekk smoothness of a surface of an outermost layer on a side where the image recording layer is provided is set as a seconds and a Bekk smoothness of a surface of an outermost layer on a side opposite to a side where the image recording layer is provided is set as b seconds.

$$a \leq 1000, b \leq 1000 \quad (1)$$

$$1/a + 1/b \geq 0.002 \quad (2)$$

In other words, according to a first embodiment of the lithographic printing plate precursor of the present disclosure, the lithographic printing plate precursor includes a hydrophilized aluminum support (also simply referred to as a "support"); and a water-soluble or water-dispersible negative type image recording layer (also simply referred to as an "image recording layer") provided on the aluminum support, in which an arithmetic average height Sa of a surface of an outermost layer on a side opposite to a side where the image recording layer is provided is in a range of 0.3 μm to 20 μm.

Further, according to a second embodiment of the lithographic printing plate precursor of the present disclosure, the lithographic printing plate precursor includes a hydrophilized aluminum support; and a water-soluble or water-dispersible negative type image recording layer provided on the aluminum support, in which Expression (1) and Expression (2) are satisfied in a case where a Bekk smoothness of a surface of an outermost layer on a side where the image recording layer is provided is set as a seconds and a Bekk smoothness of a surface of an outermost layer on a side opposite to a side where the image recording layer is provided is set as b seconds.

$$a \leq 1000, b \leq 1000 \quad (1)$$

$$1/a + 1/b \geq 0.002 \quad (2)$$

Hereinafter, the "lithographic printing plate precursor according to the present disclosure" includes both of the first embodiment and the second embodiment.

As the result of intensive examination conducted by the present inventors, it was found that a lithographic printing plate with excellent development delay resistance and an excellent plate feeding property of taking out a precursor from a laminate can be provided in a case where the lithographic printing plate precursor according to the present disclosure has the above-described configuration.

The mechanism in which the above-described excellent effects are obtained is not clear, but can be assumed as follows.

The present inventors found that the lithographic printing plate precursor has a problem in that an image recording layer on a portion on which a pressure is partially concentrated on the surface where the image recording layer is provided is damaged due to the lamination or the like in a case where unevenness is simply imparted to the surface, and thus on-press development delay partially occurs and this results in an increase in waste paper at the initial stage of printing. In addition, the present inventors found that the lithographic printing plate precursor has a problem in that the development speed becomes slow even at the time of development carried out using a developer.

As the result of intensive examination conducted by the present inventors, it was found that the above-described on-press development delay can be eliminated or reduced so that the development delay resistance becomes excellent by setting the arithmetic average height Sa of the surface of the outermost layer on a side where the image recording layer is provided to be in a range of 0.3 μm to 20 μm or by satisfying Expression (1) and Expression (2).

Further, the present inventors found that feeding of multiple precursors is suppressed due to the unevenness in the surface of the outermost layer and the plate feeding property is excellent in a case where lithographic printing plate precursors are taken out from the lithographic printing plate precursor laminate one by one, by setting the arithmetic average height Sa of the surface of the outermost layer on a side where the image recording layer is provided to be in a range of 0.3 μm to 20 μm or by satisfying Expression (1) and Expression (2).

The lithographic printing plate precursor in the present disclosure includes a support and a water-soluble or water-dispersible negative type image recording layer on the support.

Further, the lithographic printing plate precursor according to the present disclosure may include an undercoat layer between the support and the image recording layer, may include a protective layer on the image recording layer, or may include a back coat layer on a side of the support opposite to a side where the image recording layer is provided.

Further, according to the first embodiment of the lithographic printing plate precursor of the present disclosure, the arithmetic average height Sa of the surface of the outermost layer on a side opposite to a side where the image recording layer is provided is in a range of 0.3 µm to 20 µm.

Further, according to the second embodiment of the lithographic printing plate precursor of the present disclosure, the arithmetic average height Sa of the surface of the outermost layer on a side where the image recording layer is provided is in a range of 0.3 µm to 20 µm from the viewpoints of the on-press development delay resistance, the plate feeding property of taking out a precursor from a laminate, rubbing and peeling resistance, scratch resistance, and ease of peeling at the time of lamination without using interleaving paper.

The surface of the outermost layer is a surface of the image recording layer in a case where the image recording layer is an outermost layer, and the surface of the outermost layer is a surface of the protective layer in a case where the protective layer is an outermost layer.

For example, in a case where protrusions described below are formed, the image recording layer of the lithographic printing plate precursor according to the present disclosure is an outermost layer and a plurality of protrusions containing a polymer compound as a main component may be provided on the image recording layer. Further, the protective layer of the lithographic printing plate precursor according to the present disclosure is an outermost layer and a plurality of protrusions containing a polymer compound as a main component may be provided on the protective layer.

According to the first embodiment of the lithographic printing plate precursor of the present disclosure, the arithmetic average height Sa of the surface of the outermost layer on a side where the image recording layer is provided is preferably 0.3 µm or greater and less than µm, more preferably 0.5 µm or greater and less than 10 µm, and particularly preferably 0.5 µm to 7 µm from the viewpoints of the development delay resistance, the plate feeding property of taking out a precursor from a laminate, rubbing and peeling resistance, scratch resistance, and ease of peeling at the time of lamination without using interleaving paper.

According to the second embodiment of the lithographic printing plate precursor of the present disclosure, the arithmetic average height Sa of the surface of the outermost layer on a side where the image recording layer is provided is more preferably 0.3 µm or greater and less than 20 µm, still more preferably 0.5 µm or greater and less than 10 µm, and particularly preferably 0.5 µm to 7 µm from the viewpoints of the development delay resistance, the plate feeding property of taking out a precursor from a laminate, rubbing and peeling resistance, scratch resistance, and ease of peeling at the time of lamination without using interleaving paper.

In the present disclosure, the arithmetic average height Sa is measured in conformity with the measuring method described in ISO 25178. Specifically, the arithmetic average height Sa is obtained by selecting three or more sites from the same sample, performing the measurement thereon using MICROMAP MM3200-M100 (manufactured by Mitsubishi Chemical Systems, Inc.), and averaging the obtained values. In regard to the measurement region, a region having a size of 1 cm×1 cm which has been randomly selected from a surface of the sample is measured.

In the lithographic printing plate precursor according to the present disclosure, from the viewpoints of the development delay resistance, the plate feeding property of taking out a precursor from a laminate, rubbing and peeling resistance, scratch resistance, and ease of peeling at the time of lamination without using interleaving paper, the arithmetic average height Sa of the surface of the outermost layer on a side opposite to a side where the image recording layer is provided is preferably in a range of 0.1 µm to 20 µm, more preferably greater than 0.3 µm and 20 µm or less, still more preferably greater than 0.5 µm and 10 µm or less, and particularly preferably greater than 0.5 µm and 7 µm or less.

As the surface of the outermost layer on a side opposite to a side where the image recording layer is provided, a surface of the support on a side opposite to a side where the image recording layer is provided or a surface of the back coat layer is exemplified.

In the lithographic printing plate precursor according to the present disclosure, from the viewpoints of the development delay resistance and the plate feeding property of taking out a precursor from a laminate, it is preferable that at least one layer is provided between the aluminum support and the protrusions provided on the surface on a side opposite to a side where the image recording layer is provided, and more preferable that a back coat layer containing particles with an average particle diameter of 0.1 µm to 20 µm is provided, as an outermost layer, on the surface on a side opposite to a side where the image recording layer is provided.

Further, in the lithographic printing plate precursor according to the present disclosure, from the viewpoints of the development delay resistance and the plate feeding property of taking out a precursor from a laminate, it is preferable that a plurality of protrusions are provided on the surface of the back coat layer or the surface of the support on a side opposite to a side where the image recording layer is provided.

In the lithographic printing plate precursor according to the present disclosure, from the viewpoints of the development delay resistance, the plate feeding property of taking out a precursor from a laminate, rubbing and peeling resistance, scratch resistance, and ease of peeling at the time of lamination without using interleaving paper, the total value of the arithmetic average height Sa of the surface of the outermost layer on the surface where the image recording layer is provided and the arithmetic average height Sa of the surface of the outermost layer on a side opposite to a side where the image recording layer is provided is preferably greater than of 0.3 µm and 20 µm or less, more preferably greater than 1.0 µm and less than 20 µm, and particularly preferably greater than 1.0 µm and less than 14 µm.

According to the second embodiment of the lithographic printing plate precursor of the present disclosure, from the viewpoints of the development delay resistance, the plate feeding property of taking out a precursor from a laminate, rubbing and peeling resistance, scratch resistance, and ease of peeling at the time of lamination without using interleaving paper, Expression (1) and Expression (2) are satisfied in a case where the Bekk smoothness of the surface of the outermost layer on the surface where the image recording layer is provided is set as a seconds and the Bekk smoothness of the surface of the outermost layer on a side opposite to a side where the image recording layer is provided is set as b seconds.

Further, according to the first embodiment of the lithographic printing plate precursor of the present disclosure, from the viewpoints of the development delay resistance, the plate feeding property of taking out a precursor from a laminate, rubbing and peeling resistance, scratch resistance, and ease of peeling at the time of lamination without using interleaving paper, Expression (1) and Expression (2) are satisfied in a case where the Bekk smoothness of the surface of the outermost layer on the surface where the image recording layer is provided is set as a seconds and the Bekk smoothness of the surface of the outermost layer on a side opposite to a side where the image recording layer is provided is set as b seconds.

$$a \leq 1000, b \leq 1000 \quad (1)$$

$$1/a + 1/b \geq 0.002 \quad (2)$$

A method of measuring the Bekk smoothness (Bekk second) in the present disclosure is set to be performed in conformity with JIS P8119 (1998). According to a specific measurement method, the measurement is performed at one tenth the amount of standard air, in other words, an air amount of 1 mL using a Bekk smoothness tester (manufactured by KUMAGAI RIKI KOGYO Co., Ltd.).

In the lithographic printing plate precursor according to the present disclosure, from the viewpoints of the development delay resistance, the plate feeding property of taking out a precursor from a laminate, rubbing and peeling resistance, scratch resistance, and ease of peeling at the time of lamination without using interleaving paper, the Bekk smoothness a of the surface of the outermost layer on the surface where the image recording layer is provided is preferably 1000 seconds or shorter, more preferably 300 seconds or shorter, and still more preferably 100 seconds or shorter.

Further, in the lithographic printing plate precursor according to the present disclosure, from the viewpoints of the development delay resistance, the plate feeding property of taking out a precursor from a laminate, rubbing and peeling resistance, scratch resistance, and ease of peeling at the time of lamination without using interleaving paper, the Bekk smoothness b of the surface of the outermost layer on a side opposite to a side where the image recording layer is provided is preferably 1000 seconds or shorter, more preferably 300 seconds or shorter, and still more preferably 100 seconds or shorter.

Further, in the lithographic printing plate precursor according to the present disclosure, from the viewpoints of the development delay resistance, the plate feeding property of taking out a precursor from a laminate, rubbing and peeling resistance, scratch resistance, and ease of peeling at the time of lamination without using interleaving paper, the total reciprocal value $1/a+1/b$ of the Bekk smoothness of the surface where the image recording layer is provided and the Bekk smoothness of the surface on a side opposite to a side where the image recording layer is provided is preferably 0.002 $s^{-1}$ or greater, more preferably 0.004 $s^{-1}$ or greater, and still more preferably 0.01 $s^{-1}$ or greater.

In the lithographic printing plate precursor according to the present disclosure, the method of forming unevenness on the outermost layer in order to achieve the arithmetic average height Sa is not particularly limited, and preferred examples thereof include a method of adding particles to a composition for forming an outermost layer and a method of coating the surface of an outermost layer with a composition that contains at least one selected from the group consisting of particles and a polymer compound to form protrusions.

The particles used to form the unevenness are not particularly limited, but at least one kind of particles selected from the group consisting of organic resin particles and inorganic particles are preferable.

Preferred examples of the organic resin particles include polyolefins such as poly(meth)acrylic acid esters, polystyrene and derivatives thereof, polyamides, polyimides, low-density polyethylene, high-density polyethylene, and polypropylene; particles formed of synthetic resins such as polyurethanes, polyureas, and polyesters; and particles formed of natural polymers such as chitin, chitosan, cellulose, crosslinked starch, and crosslinked cellulose.

Among these, synthesis resin particles have advantages that the particle size can be easily controlled and desired surface characteristics can be easily controlled by surface modification.

As a method of producing such organic resin particles, atomization can also be made using a crushing method in a case of a relatively hard resin such as polymethyl methacrylate (PMMA), but a method of synthesizing particles using an emulsion suspension polymerization method is preferably employed from the viewpoints of ease of controlling the particle diameter and the precision.

The method of producing organic resin particles is described in detail in "Ultrafine Particle as Materials" edited by Materials Science Society of Japan, published by SHOKABO Co., Ltd., 1993 and "Manufacturing & Application of Microspheres & Powders" supervised by Haruma Kawaguchi, published by CMC Publishing, 2005.

Examples of commercially available products of the organic resin particles include crosslinked acrylic resins MX-40T, MX-80H3wT, MX-150, MX-180TA, MX-300, MX-500, MX-1000, MX-1500H, MR-2HG, MR-7HG, MR-10HG, MR-3GSN, MR-5GSN, MR-7G, MR-10G, MR-5C, and MR-7GC, and styryl resin-based SX-350H and SX-500H (manufactured by Soken Chemical & Engineering Co., Ltd.), Acrylic resins MBX-5, MBX-8, MBX-12, MBX-15, MBX-20, MB20X-5, MB30X-5, MB30X-8, MB30X-20, SBX-6, SBX-8, SBX-12, and SBX-17 (manufactured by Sekisui Plastics Co., Ltd.), polyolefin resins and CHEMI-PEARL W100, W200, W300, W308, W310, W400, W401, W405, W410, W500, WF640, W700, W800, W900, W950, and WP100 (manufactured by Mitsui Chemicals, Inc.).

Examples of the inorganic particles include silica, alumina, zirconia, titania, carbon black, graphite, $BaSO_4$, ZnS, $MgCO_3$, $CaCO_3$, ZnO, CaO, $WS_2$, $MoS_2$, MgO, $SnO_2$, $\alpha$-$Fe_2O_3$, $\alpha$-FeOOH, SiC, $CeO_2$, BN, SiN, MoC, BC, WC, titanium carbide, corundum, artificial diamond, petroleum stone, garnet, silica stone, tripolite, diatomaceous earth, and dolomite.

As the above-described particles, a particle having a hydrophilic surface is preferable. Examples of the particle having a hydrophilic surface include an organic resin particle having a hydrophilic surface and an inorganic particle having a hydrophilic surface.

As the organic resin particle having a hydrophilic surface, an organic resin particle covered with at least one inorganic compound selected from the group consisting of silica, alumina, titania, and zirconia is preferable and an organic resin particle covered with silica is particularly preferable.

It is preferable that an organic resin constituting an organic resin particle having a hydrophilic surface is at least one resin selected from the group consisting of a polyacrylic resin, a polyurethane-based resin, a polystyrene-based resin, a polyester-based resin, an epoxy-based resin, a phenolic resin, and a melamine resin.

Hereinafter, the organic resin particle having a hydrophilic surface will be described in detail using an organic resin particle covered with silica (hereinafter, also referred to as a "silica-coated organic resin particle") as an example, and the organic resin particle having a hydrophilic surface in the present disclosure is not limited thereto.

The silica-coated organic resin particle is a particle obtained by coating the surface of the particle formed of an organic resin with silica. It is preferable that the organic resin particle constituting the core is not softened or does not become sticky due to the moisture in the air or the temperature thereof.

Examples of the organic resin constituting the organic resin particle in the silica-coated organic resin particles include a polyacrylic resin, a polyurethane-based resin, a polystyrene-based resin, a polyester-based resin, an epoxy-based resin, a phenol resin, and a melamine resin.

As a material forming the silica layer covering the surface of the silica-coated organic resin particle, a compound containing an alkoxysilyl group such as a condensate of an alkoxysiloxane-based compound, particularly, a siloxane-based material, and specifically, silica particles such as silica sol, colloidal silica, and silica nanoparticles are preferably exemplified.

The configuration of the silica-coated organic resin particle may be a configuration in which a silica particle adheres to the surface of an organic resin particle as a solid component or a configuration in which a siloxane-based compound layer is formed on the surface of an organic resin particle by performing a condensation reaction on an alkoxysiloxane-based compound.

Silica does not necessarily cover the entire surface of the organic resin particle, and it is preferable that the surface thereof is covered with at least 0.5% by mass or greater of silica at least with respect to the total mass of the organic resin particles. In other words, in a case where silica is present on at least a part of the surface of the organic resin particle, improvement in affinity for a coexisting water-soluble polymer such as polyvinyl alcohol (PVA) is achieved, falling off of the particle is suppressed even in a case where external stress is applied thereto, and excellent scratch resistance and ease of peeling at the time of lamination without using interleaving paper can be maintained. Accordingly, the expression "covered with silica" in the present disclosure includes a state in which silica is present on at least a part of the surface of the organic resin particle as described above.

The state of the surface being covered with silica can be confirmed by morphological observation using a scanning electron microscope (SEM) or the like. Further, the coating amount of silica can be confirmed by detecting Si atoms through elemental analysis such as fluorescent X-ray analysis and calculating the amount of silica present therein.

A method of producing silica-coated organic resin particles is not particularly limited, and examples thereof include a method of forming a silica surface coating layer simultaneously with formation of organic resin particles by allowing silica particles or a silica precursor compound to coexist with a monomer component which becomes the raw material of the organic resin particles; and a method of forming organic resin particles, physically adhering silica particles to each surface of the organic resin particles, and fixing the silica particles thereto.

Hereinafter, an example of the method of producing silica-coated organic resin particles will be described. First, silica and a raw material resin (more specifically, a raw material resin such as a monomer capable of suspension polymerization, a pre-polymer capable of suspension cross-linking, or a resin liquid, constituting the above-described organic resin) are added to water containing a suspension stabilizer appropriately selected from a water-soluble polymer such as polyvinyl alcohol, methyl cellulose, or polyacrylic acid and an inorganic suspending agent such as calcium phosphate or calcium carbonate, and stirred and mixed with the water to prepare a suspension in which silica and a raw material resin are dispersed. At this time, a suspension having a target particle diameter can be formed by adjusting the type, the concentration, and the stirring rotation speed of the suspension stabilizer. Next, the suspension is heated to start the reaction, and resin particles are generated by performing suspension polymerization or suspension cross-linking on the resin raw material. At this time, the coexisting silica is fixed to the resin particle cured by the polymerization or the cross-linking reaction, particularly, the vicinity of the surface of the resin particle due to the physical properties thereof. Thereafter, the suspension is subjected to solid-liquid separation, the suspension stabilizer adhering to the particles is removed by washing, and the particles are dried. In this manner, silica-coated organic resin particles to which silica is fixed and which have a desired particle diameter and a substantially spherical shape can be obtained.

As described above, silica-coated organic resin particles having a desired particle diameter can be obtained by controlling the conditions during the suspension polymerization or the suspension cross-linking or silica-coated organic resin particles are generated without strictly controlling the conditions and then silica-coated organic particles having a desired size can be obtained by a mesh filtration method or the like.

In regard to the amount of the raw material to be added to the mixture during the production of the silica-coated organic particles according to the above-described method, in a case where the total amount of the raw material resin and the silica is 100 parts by mass, an aspect in which 0.1 parts by mass to 20 parts by mass of the suspension stabilizer is firstly added to 200 parts by mass to 800 parts by mass of water serving as a dispersion medium, and sufficiently dissolved or dispersed therein, 100 parts by mass of a mixture of the raw material resin and the silica is put into the solution, the solution is stirred while the stirring speed is adjusted such that the dispersed particles have a predetermined particle size, and the liquid temperature is increased to 30° C. to 90° C. after the adjustment of the particle size to cause a reaction for 1 hour to 8 hours is preferably exemplified.

The above-described method is merely an example of the method of producing silica-coated organic resin particles and silica-coated organic resin particles obtained by the methods specifically described in JP2002-327036A, JP2002-173410A, JP2004-307837A, JP2006-038246A, and the like can be also suitably used in the present disclosure.

Further, the silica-coated organic resin particles are also available as commercially available products, and specific examples of silica-melamine composite particles include OPTBEADS 2000M, OPTBEADS 3500M, OPTBEADS 6500M, OPTBEADS 10500M, OPTBEADS 3500S, and OPTBEADS 6500S (all manufactured by Nissan Chemical Industries, Ltd.). Specific examples of silica-acrylic composite particles include ART PEARL G-200 transparent, ART PEARL G-400 transparent, ART PEARL G-800 transparent, ART PEARL GR-400 transparent, ART PEARL GR-600 transparent, ART PEARL GR-800 transparent, and ART PEARL J-7P (all manufactured by Negami Chemical Industrial Co., Ltd.). Specific examples of silica-urethane composite particles include ART PEARL C-400 transparent, C-800 transparent, P-800T, U-600T, U-800T, CF-600T, CF800T (all manufactured by Negami Chemical Industrial Co., Ltd.) and DYNAMIC BEADS CN5070D and DANPLACOAT THU (both manufactured by Dainichiseika Color & Chemicals Mfg. Co., Ltd.).

Hereinbefore, the organic resin particles used in the present disclosure have been described using the silica-coated organic resin particles as an example, but the same applies to organic resin particles covered with alumina, titania, or zirconia by using alumina, titania, or zirconia in place of silica.

As the shape of particles, a perfectly spherical shape is preferable, and a flat plate shape or a so-called spindle shape in which a projection view is in an elliptical shape may be employed.

From the viewpoint of the development delay resistance, the average particle diameter of particles used for forming unevenness on the outermost layer on a side where the image recording layer is provided is preferably 0.5 µm or greater and less than 20 µm, more preferably 0.5 µm or greater and less than 10 µm, still more preferably 0.5 µm or greater and less than 7 µm, and particularly preferably 0.5 µm or greater and less than 5 µm.

From the viewpoint of the development delay resistance, the average particle diameter of the particles used for forming unevenness on the outermost layer on a side opposite to a side where the image recording layer is provided below is preferably in a range of 0.1 µm to 20 µm, more preferably in a range of 0.3 µm to 10 µm, still more preferably in a range of 0.5 µm to 7 µm, and particularly preferably in a range of 0.5 µm to 5 µm.

The average particle diameter of the particles in the present disclosure indicates the volume average particle diameter, and the volume average particle diameter can be measured using a laser diffraction and scattering type particle size distribution meter. Examples of the measuring device include a particle size distribution measuring device "Microtrac MT-3300II" (manufactured by Nikkiso Co., Ltd.).

Further, in the present disclosure, the average particle diameter of other particles is set to be measured according to the above-described measurement method unless otherwise specified.

In a case where the particles are added to a composition for forming an outermost layer in order to form unevenness, the in-plane density of the particles on the outermost layer is preferably 10000 pcs/mm$^2$ or less, more preferably in a range of 100 pcs/mm$^2$ to 5000 pcs/mm$^2$, and still more preferably in a range of 100 pcs/mm$^2$ to 3000 pcs/mm$^2$. In a case where the in-plane density thereof is in the above-described range, the plate feeding property of taking out a precursor from a laminate, rubbing and peeling resistance, scratch resistance, and ease of peeling at the time of lamination without using interleaving paper are excellent.

In the present disclosure, the in-plane density can be confirmed by observing a surface of a lithographic printing plate precursor using a scanning electron microscope (SEM).

From the viewpoints of the plate feeding property of taking out a precursor from a laminate, rubbing and peeling resistance, scratch resistance, and ease of peeling at the time of lamination without using interleaving paper, the image recording layer contains at least one kind of particles having an average particle diameter of 0.5 µm to 20 µm and it is preferable that the image recording layer contains two or more kinds of particles having different average particle diameters.

It is preferable that the particles having an average particle diameter of 0.5 µm to 20 µm are particles for forming the unevenness, and examples of other particles include a polymer compound having a particle shape and thermoplastic polymer particles described below.

In the present disclosure, "the image recording layer contains two or more kinds of particles having different average particle diameters" is confirmed by checking whether two or more peaks are present in the particle size distribution. The particle size distribution is measured in the same manner as that for the average particle diameter of the particles or acquired by imaging an electron micrograph of particles, measuring the total number of 5,000 particle diameters of particles on the photograph, dividing the interval from the maximum value of the obtained measured value of the particle diameter to 0 into the logarithmic scale of 50, and plotting the appearance frequency of each particle diameter. Further, the particle diameter of a spherical particle having the same particle area as the particle area on the photograph was set to the particle diameter, as non-spherical particles.

Further, the two or more peaks described above are preferably peaks separated from each other by 10 nm or longer, more preferably peaks separated from each other by 50 nm or longer, and still more preferably peaks separated from each other by 100 nm or longer.

As the polymer compound constituting the protrusions, from the viewpoints of the development delay resistance, the plate feeding property of taking out a precursor from a laminate, and ease of peeling at the time of lamination without using interleaving paper (plate feeding property), at least one polymer compound selected from the group consisting of a novolak resin such as a phenol formaldehyde resin, an m-cresol formaldehyde resin, a p-cresol formaldehyde resin, an m-/p-mixed cresol formaldehyde resin, or a phenol/cresol (any of m-, p-, and m-/p-mixed)-mixed formaldehyde resin, a resol resin, pyrogallol, an acetone resin, an epoxy resin, a saturated copolymer polyester resin, a phenoxy resin, a polyvinyl acetal resin, a vinylidene chloride copolymer resin, polybutene, polybutadiene, polyamide, an unsaturated copolymer polyester resin, polyurethane, polyurea, polyimide, polysiloxane, polycarbonate, chlorinated polyethylene, an aldehyde condensation resin of alkyl phenol, polyvinyl chloride, polyvinylidene chloride, polystyrene, polyacrylate, a carboxyvinyl polymer, an acrylic resin copolymer resin, hydroxy cellulose, hydroxymethyl cellulose, polyvinyl alcohol, polyvinylpyrrolidone, cellulose acetate, methyl cellulose, and carboxymethyl cellulose is preferable.

Among these, from the viewpoint of the on-press developability, a water-soluble polymer compound is more preferable. Specific examples thereof include polyacrylate, a carboxyvinyl polymer, an acrylic resin copolymer resin, hydroxy cellulose, hydroxymethyl cellulose, polyvinyl alcohol, modified polyvinyl alcohol, polyvinylpyrrolidone, cellulose acetate, methyl cellulose, and carboxymethyl cellulose.

As the modified polyvinyl alcohol, acid-modified polyvinyl alcohol containing a carboxy group or a sulfo group is preferably used. Specifically, the modified polyvinyl alcohol described in JP2005-250216A or JP2006-259137A is suitable.

The shape and the height of the protrusions are not particularly limited as long as the arithmetic average height Sa of the surface of the outermost layer on a side where the image recording layer is provided is in a range of 0.3 µm to 20 µm.

As a preferable form of protrusions in a case where protrusion are formed on the surface of the outermost layer, a stripe coated film, a dot coated film, and a dashed line coated film can be exemplified. However, the present disclosure is not limited to these forms.

A method of forming stripe-like protrusions (stripe coated film) is not particularly limited, and the protrusions can be easily formed by applying a composition that contains at least one selected from the group consisting of particles and polymer compounds according to at least one system selected from the group consisting of a bar coating system, an ink jet printing system, a gravure printing system, a screen printing system, a spray coating system, and a slot die coating system.

A method of forming dot-like protrusions (dot coated film) is not particularly limited, and the protrusions can be easily formed by applying a composition that contains at least one selected from the group consisting of particles and polymer compounds according to at least one system selected from the group consisting of a spray coating system, an ink jet printing system, and a screen printing system.

A method of forming dashed line protrusions (dashed line coated film) is not particularly limited, and the protrusions can be easily formed by applying a composition that contains at least one selected from the group consisting of particles and polymer compounds according to at least one system selected from the group consisting of an ink jet printing system and a screen printing system.

From the viewpoints of the rubbing and peeling resistance and the scratch resistance, it is preferable that the lithographic printing plate precursor according to the present disclosure has at least one layer (for example, a back coat layer) between the aluminum support and the protrusions provided on the surface on a side opposite to a side where the image recording layer is provided.

Specifically, the order of the support the back coat layer, and the protrusions is preferably exemplified.

<Support>

The lithographic printing plate precursor according to the present disclosure includes a hydrophilized aluminum support.

As the support used in the lithographic printing plate precursor according to the present disclosure, a known support is used. Among the examples, an aluminum plate which has been subjected to an anodization treatment is preferable and an aluminum plate which has been subjected to a roughening treatment and an anodization treatment is more preferable.

The roughening treatment and the anodization treatment can be performed according to a known method.

The aluminum plate can be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. Nos. 2,714,066A, 3,181,461A, 3,280,734A, and 3,902,734A or polyvinyl phosphonic acid described in U.S. Pat. Nos. 3,276,868A, 4,153,461A, and 4,689,272A as necessary.

The center line average roughness Ra of the support is preferably in a range of 0.10 µm to 1.2 µm.

In the support, the average diameter of micropores in the surface of the anodized film is preferably in a range of 10 to 100 nm.

It is preferable that the aluminum support includes an aluminum plate and an aluminum anodized film disposed on the aluminum plate.

The aluminum plate (aluminum support) is a metal, which is dimensionally stable and contains aluminum as a main component, and is formed of aluminum or an aluminum alloy. Examples of the aluminum plate include a pure aluminum plate, an alloy plate containing aluminum as a main component and a trace amount of heteroelements, and a plastic film or paper formed by laminating or depositing aluminum (alloy). Further, a composite sheet formed by bonding an aluminum sheet onto a polyethylene terephthalate film described in JP1973-018327B (JP-S48-018327B) may be employed.

Examples of the heteroelements contained in the aluminum alloy include silicon, iron, manganese, copper, magnesium, chromium, zinc, bismuth, nickel, and titanium, and the content of the heteroelements in the alloy is 10% by mass or less with respect to the total mass of the alloy. A pure aluminum plate is suitable as an aluminum plate 18, but completely pure aluminum is difficult to produce because of a smelting technology. Therefore, the alloy may contain a trace amount of heteroelements.

The composition of the aluminum plate is not particularly limited, and publicly known materials can be appropriately used (for example, JIS A 1050, JIS A 1100, JIS A 3103, and JIS A 3005).

The width of the aluminum plate is preferably approximately 400 mm to 2000 mm, and the thickness thereof is preferably approximately 0.1 mm to 0.6 mm. The width and the thickness thereof can be appropriately changed depending on the size of the printing press, the size of the printing plate, the printed material to be obtained, and the like.

«Anodized Film»

The anodized film indicates an anodized aluminum film which is prepared on the surface of the aluminum plate by performing an anodization treatment and has micropores. The micropores extend along the thickness direction (the aluminum plate side, the depth direction) from the surface of the anodized film on a side opposite to a side of the aluminum plate.

The average diameter (average opening diameter) of the micropores in the surface of the anodized film is preferably in a range of 7 nm to 150 nm, more preferably in a range of 10 nm to 100 nm, still more preferably in a range of 10 nm to 60 nm, particularly preferably in a range of 15 nm to 60 nm, and most preferably in a range of 18 nm to 40 nm, from the viewpoints of the tone reproducibility, printing durability, and blanket stain properties.

It is preferable that the micropores in the anodized film are formed of large-diameter pores extending to a position at a depth of 10 nm to 1000 nm from the surface of the anodized film and small-diameter pores communicating with a bottom of large-diameter pores and extending from a position at a depth of 20 nm to 2000 nm from the communication position.

Hereinafter, the large-diameter pores and the small-diameter pores will be described in detail.

—Large-Diameter Pores—

The average diameter (average opening diameter) of the large-diameter pores in the surface of the anodized film is preferably in a range of 7 nm to 150 nm, more preferably in a range of 15 nm to 150 nm, still more preferably in a range of 15 nm to 60 nm, and most preferably in a range of 18 nm to 40 nm, from the viewpoints of the tone reproducibility, printing durability, and blanket stain properties.

The average diameter of large-diameter pores is calculated as an arithmetic average value obtained by observing four sheets (N=4) of the surfaces of the anodized film using a field emission scanning electron microscope (FE-SEM) at a magnification of 150000, measuring the diameters of large-diameter pores present in a range of 400×600 $nm^2$ in the obtained four sheets of images, and averaging the values.

Further, in a case where the shape of the large-diameter pores is not circular, an equivalent circle diameter is used. The "equivalent circle diameter" is a diameter of a circle obtained by assuming the shape of an opening portion of a micropore in the surface of the anodized film as a circle having the same projected area as the projected area of the opening portion.

It is preferable that the bottom of the large-diameter pores is positioned at a depth of 70 nm to 1000 nm (hereinafter, also referred to as a "depth A") from the surface of the anodized film. In other words, it is preferable that the large-diameter pores are pores extending in the depth direction (thickness direction) at 70 nm to 1000 nm from the surface of the anodized film. From the viewpoint that the effect of the method of producing the lithographic printing plate precursor according to the present disclosure is high, the depth A is more preferably in a range of 90 nm to 850 nm, more preferably in a range of 90 nm to 800 nm, and particularly preferably in a range of 90 nm to 600 nm.

Further, the depth thereof is a value obtained by capturing (magnification of 150000) an image of a cross section of the anodized film, measuring the depth of 25 or more large-diameter pores, and averaging the obtained values.

The shape of the large-diameter pores is not particularly limited, and examples of the shape thereof include a substantially straight tubular shape (substantially cylindrical shape) and a conical shape whose diameter decreases toward the depth direction (thickness direction). Among the examples, a substantially straight tubular shape is preferable. Further, the shape of the bottom portion of the large-diameter pores is not particularly limited, but may be a curved shape (projection) or a planar shape.

The inner diameter of the large-diameter pores is not particularly limited, but it is preferable that the inner diameter thereof is approximately the same as the diameter of the opening portion or smaller than the diameter of the opening portion. Further, the inner diameter of the large-diameter pores may be different from the diameter of the opening portion by 1 nm to 10 nm.

—Small-Diameter Pores—

The small-diameter pores are pores communicating with the bottom of the large-diameter pores and extending from the communication position to the depth direction (thickness direction). One small-diameter pore may typically communicate with one large-diameter pore or two or more small-diameter pores may communicate with the bottom of one large-diameter pore.

The average diameter of the small-diameter pores in the communication position is preferably 13 nm or less, more preferably 11 nm or less, and particularly preferably 10 nm or less. The lower limit thereof is not particularly limited, but is preferably 5 nm or greater.

The average diameter of small-diameter pores is calculated as an arithmetic average value obtained by observing four sheets (N=4) of the surfaces of the anodized film 20 using a field emission scanning electron microscope (FE-SEM) at a magnification of 150000, measuring the diameters of micropores (small-diameter pores) present in a range of 400×600 nm² in the obtained four sheets of images, and averaging the values. In a case where the depth of the large-diameter pores is large, the average diameter of small-diameter pores may be acquired by cutting (for example, cutting the upper portion using argon gas) the upper portion (a region where large-diameter pores are present) of the anodized film 20 as necessary and observing the surface of the anodized film 20 using the above-described FE-SEM.

Further, in a case where the shape of the small-diameter pores is not circular, an equivalent circle diameter is used. The "equivalent circle diameter" is a diameter of a circle obtained by assuming the shape of an opening portion of a micropore as a circle having the same projected area as the projected area of the opening portion.

The bottom of the small-diameter pores is in a position extending from the communication position (corresponding to the above-described depth A) with the large-diameter pores to a direction at a depth of 20 nm to 2000 nm. In other words, the small-diameter pores are pores extending from the communication position with the large-diameter pores to the depth direction (thickness direction), and the depth of the small-diameter pores is in a range of 20 nm to 2000 nm, more preferably in a range of 100 nm to 1500 nm, and particularly preferably in a range of 200 nm to 1000 nm.

In addition, the depth thereof is a value obtained by capturing (magnification of 50000) an image of a cross section of the anodized film, measuring the depth of 25 or more small-diameter pores, and averaging the obtained values.

The shape of the small-diameter pores is not particularly limited, and examples of the shape thereof include a substantially straight tubular shape (substantially cylindrical shape) and a conical shape whose diameter decreases toward the depth direction (thickness direction). Among the examples, a substantially straight tubular shape is preferable. Further, the shape of the bottom portion of the small-diameter pores is not particularly limited, but may be a curved shape (projection) or a planar shape.

The inner diameter of the small-diameter pores is not particularly limited, but it is preferable that the inner diameter thereof is approximately the same as the diameter in the communication position or may be smaller or larger than the diameter thereof. Further, the inner diameter of the small-diameter pores may be different from the diameter of the opening portion by 1 nm to 10 nm.

The ratio ((average diameter of large-diameter pores in surface of anodized film)/(average diameter of small-diameter pores in communication position)) between the average diameter of the large-diameter pores in the surface of the anodized film and the average diameter of the small-diameter pores in the communication position is preferably in a range of 1.1 to 13 and more preferably in a range of 2.5 to 6.5.

Further, the ratio ((depth of large-diameter pores/depth of small-diameter pores)) between the depth of the large-diameter pores and the depth of the small-diameter pores is preferably in a range of 0.005 to 50 and more preferably in a range of 0.025 to 40.

The method of producing a support used in the present disclosure is not particularly limited, and a known method can be used.

Hereinafter, examples of the method of producing a support will be described, but the present disclosure is not limited thereto.

As the method of producing an aluminum support, for example, as a method of producing an aluminum support having an anodized film with micropores extending from the surface on the side of the image recording layer to the depth direction, a production method of sequentially performing the following steps is preferable.

(Roughening treatment step) A step of performing a roughening treatment on an aluminum plate (Anodization treatment step) A step of anodizing the aluminum plate which has been subjected to the roughening treatment (Pore widening treatment step) A step of widening the diameter of micropores in the anodized film by bringing the aluminum plate having the anodized film obtained in the anodization treatment step into contact with an acid aqueous solution or an alkali aqueous solution Hereinafter, the procedures of each step will be described in detail.

—Roughening Treatment Step—

The roughening treatment step is a step of performing a roughening treatment including an electrochemical roughening treatment on a surface of an aluminum plate. It is preferable that the present step is performed before the anodization treatment step described below, but may not be performed in a case where the surface of the aluminum plate already has a preferable surface shape.

The roughening treatment may be carried out by performing only an electrochemical roughening treatment, but may be carried out by combining an electrochemical roughening treatment and a mechanical roughening treatment and/or a chemical roughening treatment.

In a case where the mechanical roughening treatment is combined with the electrochemical roughening treatment, it is preferable that the electrochemical roughening treatment is performed after the mechanical roughening treatment.

It is preferable that the electrochemical roughening treatment is performed in an aqueous solution mainly containing nitric acid or hydrochloric acid using the direct current or the alternating current.

The method of performing the mechanical roughening treatment is not particularly limited, and the methods described in JP1975-040047B (JP-S50-040047B) are exemplified.

The chemical roughening treatment is also not particularly limited, and known methods are exemplified.

It is preferable that a chemical etching treatment described below is performed after the mechanical roughening treatment.

The chemical etching treatment to be performed after the mechanical roughening treatment is performed in order to smooth an edge portion of the uneven shape of the surface of the aluminum plate, prevent the ink from being caught during printing, improve the stain resistance of the printing plate, and remove unnecessary matter such as abrasive material particles remaining on the surface.

Examples of the chemical etching treatment include etching carried out using an acid and etching carried out using an alkali, and a chemical etching treatment (hereinafter, also referred to as an "alkali etching treatment") carried out using an alkali aqueous solution is exemplified as a particularly excellent method in terms of etching efficiency.

An alkali agent used for the alkali aqueous solution is not particularly limited, and examples thereof include caustic soda, caustic potash, sodium metasilicate, soda carbonate, soda aluminate, and soda gluconate.

The alkali aqueous solution may contain aluminum ions.

The concentration of the alkali agent in the alkali aqueous solution is preferably 0.01% by mass or greater, more preferably 3% by mass or greater, and preferably 30% by mass or less.

In a case where the alkali etching treatment is performed, it is preferable that the chemical etching treatment (hereinafter, also referred to as a "desmutting treatment") is performed using an acidic aqueous solution at a low temperature in order to remove a product generated due to the alkali etching treatment.

The acid used for the acidic aqueous solution is not particularly limited, and examples thereof include sulfuric acid, nitric acid, and hydrochloric acid. Further, the temperature of the acidic aqueous solution is preferably in a range of 20° C. to 80° C.

It is preferable that the roughening treatment step is performed according to a method of performing the treatments shown in an A aspect or a B aspect in order described below.

(A Aspect)
(2) A chemical etching treatment carried out using an alkali aqueous solution (first alkali etching treatment)
(3) A chemical etching treatment carried out using an acidic aqueous solution (first desmutting treatment)
(4) An electrochemical roughening treatment carried out using an aqueous solution that mainly contains nitric acid (first electrochemical roughening treatment)
(5) A chemical etching treatment carried out using an alkali aqueous solution (second alkali etching treatment)
(6) A chemical etching treatment carried out using an acidic aqueous solution (second desmutting treatment)
(7) An electrochemical roughening treatment carried out in an aqueous solution that mainly contains hydrochloric acid (second electrochemical roughening treatment)
(8) A chemical etching treatment carried out using an alkali aqueous solution (third alkali etching treatment)
(9) A chemical etching treatment carried out using an acidic aqueous solution (third desmutting treatment)
(B Aspect)
(10) A chemical etching treatment carried out using an alkali aqueous solution (fourth alkali etching treatment)
(11) A chemical etching treatment carried out using an acidic aqueous solution (fourth desmutting treatment)
(12) An electrochemical roughening treatment carried out using an aqueous solution that mainly contains hydrochloric acid (third electrochemical roughening treatment)
(13) A chemical etching treatment carried out using an alkali aqueous solution (fifth alkali etching treatment)
(14) A chemical etching treatment carried out using an acidic aqueous solution (fifth desmutting treatment)

The mechanical roughening treatment (1) may be performed before the treatment (2) of the A aspect described above or before the treatment (10) of the B aspect described above, as necessary.

The amount of the aluminum plate to be dissolved in the first alkali etching treatment and the fourth alkali etching treatment is preferably in a range of 0.5 g/m$^2$ to 30 g/m$^2$ and more preferably in a range of 1.0 g/m$^2$ to 20 g/m$^2$.

As the aqueous solution that mainly contains nitric acid used for the first electrochemical roughening treatment according to the A aspect, an aqueous solution used for an electrochemical roughening treatment carried out using the direct current or the alternating current is exemplified. For example, an aqueous solution obtained by adding aluminum nitrate, sodium nitrate, or ammonium nitrate to a 1 g/L to 100 g/L nitric acid aqueous solution is exemplified.

As the aqueous solution that mainly contains hydrochloric acid used for the second electrochemical roughening treatment according to the A aspect and the third electrochemical roughening treatment according to the B aspect, a typical aqueous solution used for an electrochemical roughening treatment carried out using the direct current or the alternating current is exemplified. For example, an aqueous solution obtained by adding 0 g/L to 30 g/L of sulfuric acid to a 1 g/L to 100 g/L hydrochloric acid aqueous solution is exemplified. Further, nitrate ions such as aluminum nitrate, sodium nitrate, and ammonium nitrate; and hydrochloride ions such as aluminum chloride, sodium chloride, and ammonium chloride may be added to this solution.

The AC power source waveform of the electrochemical roughening treatment may use a sine wave, a square wave, a trapezoidal wave, and a triangular wave. The frequency is preferably in a range of 0.1 Hz to 250 Hz.

FIG. 1 is a graph showing an example of an alternating waveform current waveform diagram used for the electrochemical roughening treatment.

In FIG. 1, ta represents an anode reaction time, tc represents a cathode reaction time, tp represents a time taken for the current to reach the peak from 0, Ia represents the peak current on an anode cycle side, and Ic represents the peak current on a cathode cycle side. In the trapezoidal wave, the time tp taken for the current to reach the peak from 0 is preferably in a range of 1 msec to 10 msec. As the preferable conditions for one cycle of the alternating current used for the electrochemical roughening, a ratio tc/ta of the cathode reaction time tc to the anode reaction time ta of the aluminum plate is in a range of 1 to 20, a ratio Qc/Qa of an electric quantity Qc at the time of the aluminum plate serving as a cathode to an electric quantity Qa at the time of the aluminum plate serving as an anode is in a range of 0.3 to 20, and the anode reaction time ta is in a range of 5 msec to 1000 msec. The current density is preferably in a range of 10 to 200 A/dm$^2$ in both of an anode cycle side Ia and a cathode cycle side Ic of the current in terms of the peak value of the trapezoidal wave. The value of Ic/Ia is preferably in a range of 0.3 to 20. The total amount of the electricity used for the anode reaction of the aluminum plate at the time when the electrochemical roughening is completed is preferably in a range of 25 C/dm$^2$ to 1000 C/dm$^2$.

Figure 2:
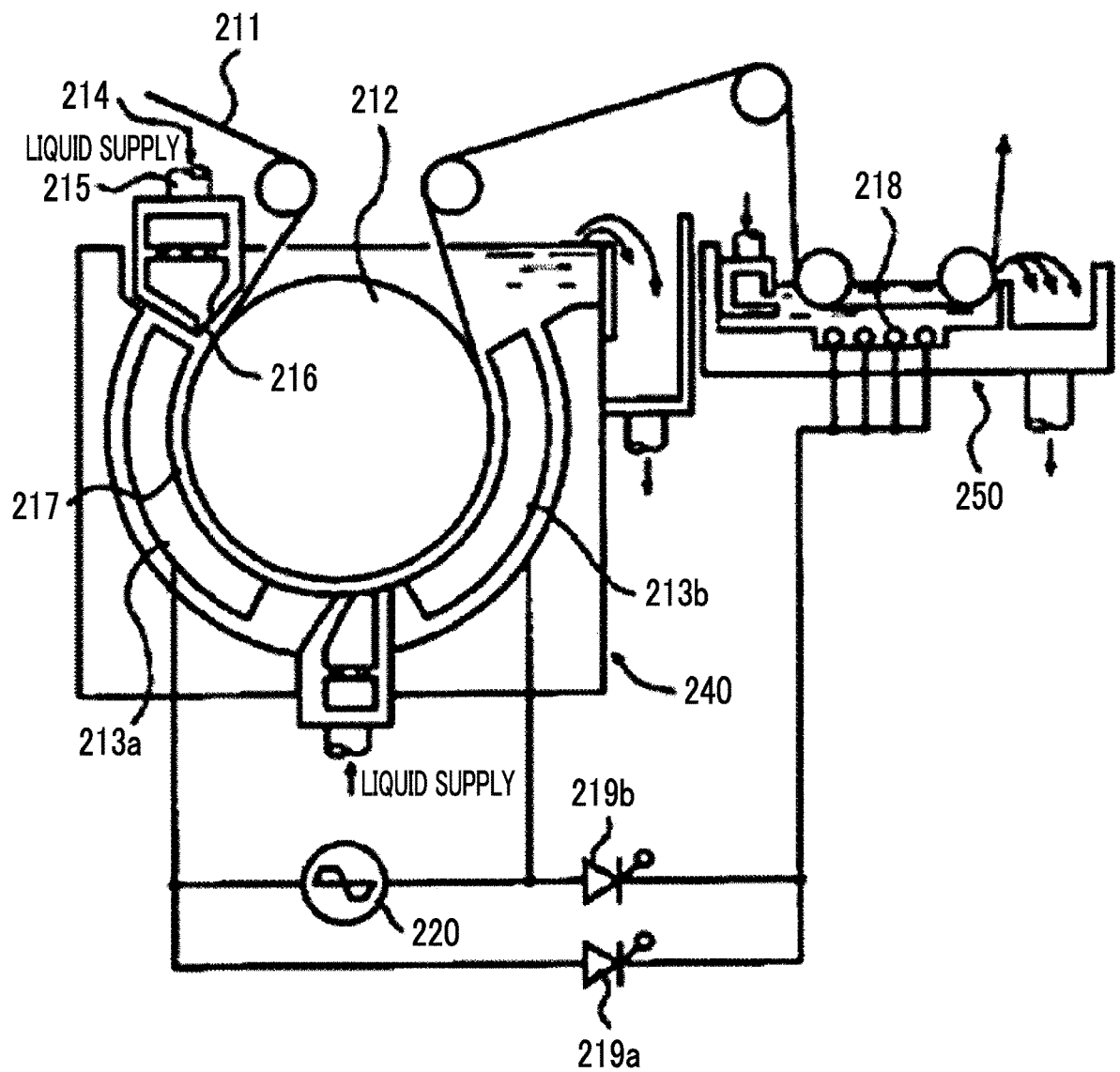
FIG. 2 is a side view illustrating an example of a radial type cell in the electrochemical roughening treatment carried out using the alternating current.

A device illustrated in FIG. 2 can be used for the electrochemical roughening carried out using the alternating current.

FIG. 2 is a side view illustrating an example of a radial type cell in the electrochemical roughening treatment carried out using the alternating current.

In FIG. 2, the reference numeral 50 represents a main electrolytic cell, the reference numeral 51 represents an AC power source, the reference numeral 52 represents a radial drum roller, the reference numerals 53a and 53b represent a main pole, the reference numeral 54 represents an electrolytic solution supply port, the reference numeral 55 represents an electrolytic solution, the reference numeral 56 represents a slit, the reference numeral 57 represents an electrolytic solution passage, the reference numeral 58 represents an auxiliary anode, the reference numeral 60 represents an auxiliary anode cell, and the symbol W represents an aluminum plate. In a case where two or more electrolytic cells are used, the electrolysis conditions may be the same as or different from each other.

The aluminum plate W is wound around the radial drum roller 52 disposed by being immersed in the main electrolytic cell 50 and is electrolyzed by the main poles 53a and 53b connected to the AC power source 51 in the transport process. The electrolytic solution 55 is supplied to the electrolytic solution passage 57 disposed between the radial drum roller 52 and the main pole 53a and between the radial drum roller 52 and the main pole 53b through the slit 56 from the electrolytic solution supply port 54. The aluminum plate W which has been treated in the main electrolytic cell 50 is electrolyzed in the auxiliary anode cell 60. The auxiliary anode 58 is disposed in the auxiliary anode cell 60 so as to face the aluminum plate W and the electrolytic solution 55 is supplied so as to flow through the space between the auxiliary anode 58 and the aluminum plate W.

From the viewpoint of easily producing a predetermined printing plate precursor, the amount of the aluminum plate to be dissolved in the second alkali etching treatment is preferably 1.0 g/m$^2$ or greater and more preferably in a range of 2.0 g/m$^2$ to 10 g/m$^2$.

From the viewpoint of easily producing a predetermined printing plate precursor, the amount of the aluminum plate to be dissolved in the third alkali etching treatment and the fourth alkali etching treatment is preferably 0.01 g/m$^2$ to 0.8 g/m$^2$ and more preferably in a range of 0.05 g/m$^2$ to 0.3 g/m$^2$.

In the chemical etching treatments (first to fifth desmutting treatments) carried out using an acidic aqueous solution, an acidic aqueous solution containing phosphoric acid, nitric acid, sulfuric acid, chromic acid, hydrochloric acid, or mixed acids obtained by mixing two or more of these acids is suitably used.

The concentration of the acidic aqueous solution is preferably in a range of 0.5% by mass to 60% by mass.

—Anodization Treatment Step—

The procedures of the anodization treatment step are not particularly limited as long as the above-described micropores are obtained, and known methods are exemplified.

In the anodization treatment step, an aqueous solution containing sulfuric acid, phosphoric acid, oxalic acid, and the like can be used as an electrolytic cell. For example, the concentration of the sulfuric acid is in a range of 100 g/L to 300 g/L.

The conditions for the anodization treatment are appropriately set depending on the electrolytic solution. As an example of the conditions, the liquid temperature is in a range of 5° C. to 70° C. (preferably in a range of 10° C. to 60° C.), the current density is in a range of 0.5 A/dm$^2$ to 60 A/dm$^2$ (preferably in a range of 5 A/dm$^2$ to 60 A/dm$^2$), the voltage is in a range of 1 V to 100 V (preferably in a range of 5V to 50 V), the electrolysis time is in a range of 1 second to 100 seconds (preferably in a range of 5 seconds to 60 seconds), and the coating amount is in a range of 0.1 g/m$^2$ to 5 g/m$^2$ (preferably in a range of 0.2 g/m$^2$ to 3 g/m$^2$).

—Pore Widening Treatment—

The pore widening treatment is a treatment (pore diameter widening treatment) of widening the diameter (pore diameter) of micropores present in the anodized film formed by the above-described anodization treatment step.

The pore widening treatment can be performed by bringing the aluminum plate obtained in the anodization treatment step into contact with an acid aqueous solution or an alkali aqueous solution. The method of bringing the aluminum plate into contact with the solution is not particularly limited, and examples thereof include an immersion method and a spray method.

A back coat layer that contains an organic polymer compound described in JP1993-045885A (JP-H05-045885A) and an alkoxy compound of silicon described in JP1994-035174A (JP-H6-035174A) on the rear surface of the support as necessary.

<Image Recording Layer>

The lithographic printing plate precursor according to the present disclosure includes a water-soluble or a water-dispersible negative type image recording layer on a support.

In the present disclosure, the term "water-soluble" means that 0.5 g or greater of a substance is dissolved in 100 g of water at 20° C., and the water-soluble layer may be a layer which is dissolved by an amount of 0.5 g or greater in 100 g of water at 20° C. Further, in the present disclosure, the term "water-dispersible" means that a substance is uniformly dispersed in water at 20° C., and the water-dispersible layer indicates a layer which can be uniformly dispersed in water at 20° C.

It is preferable that the image recording layer in the present disclosure is an image recording layer according to any of the following first to fifth aspects.

First aspect: An infrared absorbing agent, a polymerizable compound, and a polymerization initiator are contained.

Second aspect: An infrared absorbing agent and thermoplastic polymer particles are contained.

Third aspect: In the first aspect, polymer particles or a microgel is further contained.

Fourth aspect: In the first aspect, thermoplastic polymer particles are further contained.

Fifth aspect: In the fourth aspect, a microgel is further contained.

According to the first aspect or the second aspect, it is possible to obtain a lithographic printing plate precursor that has excellent printing durability of a lithographic printing plate to be obtained.

According to the third aspect, it is possible to obtain a lithographic printing plate precursor having excellent on-press developability.

According to the fourth aspect, it is possible to obtain a lithographic printing plate precursor having excellent printing durability.

According to the fifth aspect, it is possible to obtain a lithographic printing plate precursor having excellent printing durability.

According to a preferred aspect of the lithographic printing plate precursor of the present disclosure, the image recording layer is an image recording layer (hereinafter, also referred to as an "image recording layer A") containing an infrared absorbing agent, a polymerization initiator, a polymerizable compound, and a binder polymer.

According to another preferred aspect of the lithographic printing plate precursor of the present disclosure, the image recording layer is an image recording layer (hereinafter, also referred to as an "image recording layer B") containing an infrared absorbing agent, a polymerization initiator, a polymerizable compound, and a polymer compound having a particle shape.

According to a still another aspect of the lithographic printing plate precursor of the present disclosure, the image recording layer is an image recording layer (hereinafter, also referred to as an "image recording layer C") containing an infrared absorbing agent and thermoplastic polymer particles.

—Image Recording Layer A—

The image recording layer A contains an infrared absorbing agent, a polymerization initiator, a polymerizable compound, and a binder polymer. Hereinafter, the constituent components of the image recording layer A will be described.

«Infrared Absorbing Agent»

An infrared absorbing agent has a function of converting absorbed infrared rays into heat, a function of electron transfer to a polymerization initiator described below through excitation by infrared rays, and/or a function of energy transfer. As the infrared absorbing agent used in the present disclosure, a coloring agent or a pigment having maximum absorption at a wavelength of 760 nm to 1,200 nm is preferable and a coloring agent having maximum absorption at a wavelength of 760 nm to 1,200 nm is more preferable.

As the coloring agent, coloring agents described in paragraphs 0082 to 0088 of JP2014-104631A can be used.

The average particle diameter of the pigment is preferably in a range of 0.01 µm to 1 µm and more preferably in a range of 0.01 µm to 0.5 µm. A known dispersion technique used to produce inks or toners can be used for dispersion of the pigment. The details are described in "Latest Pigment Application Technology" (CMC Publishing Co., Ltd., 1986) and the like.

The infrared absorbing agent may be used alone or in combination of two or more kinds thereof.

The content of the infrared absorbing agent is preferably in a range of 0.05% by mass to 30% by mass, more preferably in a range of 0.1% by mass to 20% by mass, and particularly preferably in a range of 0.2% by mass to 10% by mass with respect to total mass of the image recording layer.

«Polymerization Initiator»

The polymerization initiator indicates a compound that initiates and promotes polymerization of a polymerizable compound. As the polymerization initiator, a known thermal polymerization initiator, a compound having a bond with small bond dissociation energy, or a photopolymerization initiator can be used. Specifically, radical polymerization initiators described in paragraphs 0092 to 0106 of JP2014-104631A can be used.

Preferred examples of compounds in the polymerization initiators include onium salts. Among these, iodonium salts and sulfonium salts are particularly preferable. Specific preferred examples of the compounds in each of the salts are the compounds described in paragraphs 0104 to 0106 of JP2014-104631A.

The content of the polymerization initiator is preferably in a range of 0.1% by mass to 50% by mass, more preferably in a range of 0.5% by mass to 30% by mass, and particularly preferably in a range of 0.8% by mass to 20% by mass with respect to the total mass of the image recording layer. When the content thereof is in the above-described range, improved sensitivity and improved stain resistance of a non-image area at the time of printing are obtained.

«Polymerizable Compound»

A polymerizable compound is an addition polymerizable compound having at least one ethylenically unsaturated bond and is selected from compounds having preferably at least one and more preferably two or more terminal ethylenically unsaturated bonds. These have chemical forms such as a monomer, a pre-polymer, that is, a dimer, a trimer, an oligomer, and a mixture of these. Specifically, polymerizable compounds described in paragraphs 0109 to 0113 of JP2014-104631A can be used.

Among the examples described above, from the viewpoint that the balance between hydrophilicity associated with on-press developability and polymerization ability associated with printing durability is excellent, isocyanuric acid ethylene oxide-modified acrylates such as tris(acryloyloxyethyl) isocyanurate and bis(acryloyloxyethyl)hydroxyethyl isocyanurate are particularly preferable.

The details of the structures of these polymerizable compounds, whether to be used alone or in combination, and the usage method such as the addition amount can be arbitrarily set according to the final performance design of a lithographic printing plate precursor. The content of the above-described polymerizable compound to be used is preferably in a range of 5% by mass to 75% by mass, more preferably in a range of 10% by mass to 70% by mass, and particularly preferably in a range of 15% by mass to 60% by mass with respect to the total mass of the image recording layer.

<Binder Polymer>

A binder polymer can be mainly used to improve the film hardness of the image recording layer. As the binder polymer, known polymers of the related art can be used and polymers having coated-film properties are preferable. Among examples thereof, an acrylic resin, a polyvinyl acetal resin, and a polyurethane resin are preferable.

Preferred examples of the binder polymers include polymers having a cross-linking functional group in the main or side chain, preferably in the side chain, for improving coated-film strength of an image area as described in JP2008-195018A. Cross-linking occurs between polymer molecules by a cross-linking group so that curing is promoted.

Preferred examples of the cross-linking functional group include an ethylenically unsaturated group such as a (meth) acryl group, a vinyl group, an allyl group, or a styryl group and an epoxy group, and the cross-linking functional groups can be introduced into a polymer by a polymer reaction or copolymerization. For example, a reaction between an acrylic polymer having a carboxy group in the side chain thereof or polyurethane and glycidyl methacrylate or a reaction between a polymer having an epoxy group and ethylenically unsaturated group-containing carboxylic acid such as methacrylic acid can be used. The content of the cross-linking group in the binder polymer is preferably in a range of 0.1 to 10.0 mmol, more preferably in a range of 0.25 to 7.0 mmol, and particularly preferably in a range of 0.5 to 5.5 mmol with respect to 1 g of the binder polymer.

Moreover, it is preferable that the binder polymer includes a hydrophilic group. The hydrophilic group contributes to imparting on-press developability for the image recording layer. Particularly, in the coexistence of a cross-linking group and a hydrophilic group, both of printing durability and on-press developability can be achieved.

Examples of the hydrophilic group include a hydroxy group, a carboxy group, an alkylene oxide structure, an amino group, an ammonium group, an amide group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to provide a hydrophilic group for a binder polymer.

In addition, in order to control the impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The weight-average molecular weight (Mw) of the binder polymer is preferably 2,000 or greater, more preferably 5,000 or greater, and still more preferably in a range of 10,000 to 300,000.

The content of the binder polymer is preferably in a range of 3% to 90% by mass, more preferably in a range of 5% to 80% by mass, and still more preferably in a range of 10% to 70% by mass with respect to the total mass of the image recording layer.

As a preferred example of the binder polymer, a polymer compound having a polyoxyalkylene chain in the side chain is exemplified. When the image recording layer contains a polymer compound having a polyoxyalkylene chain in the side chain (hereinafter, also referred to as a POA chain-containing polymer compound), permeability of dampening water is promoted and on-press developability is improved.

Examples of the resin constituting the main chain of the POA chain-containing polymer compound include an acrylic resin, a polyvinyl acetal resin, a polyurethane resin, a polyurea resin, a polyimide resin, a polyamide resin, an epoxy resin, a methacrylic resin, a polystyrene resin, a novolac type phenolic resin, a polyester resin, synthetic rubber, and natural rubber. Among these, an acrylic resin is particularly preferable.

Further, in the present disclosure, a "main chain" indicates relatively the longest bonding chain in a molecule of a polymer compound constituting a resin and a "side chain" indicates a molecular chain branched from the main chain.

The POA chain-containing polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, alkylene oxide having 2 to 6 carbon atoms is preferable, ethylene oxide (oxyethylene) or propylene oxide (oxypropylene) is more preferable, and ethylene oxide is still more preferable.

The repetition number of the alkylene oxide in a polyoxyalkylene chain, that is, a polyalkyleneoxide moiety is preferably in a range of 2 to 50 and more preferably in a range of 4 to 25.

When the repetition number of the alkylene oxide is 2 or greater, the permeability of dampening water is sufficiently improved. Further, from the viewpoint that printing durability is not degraded due to abrasion, it is preferable that the repetition number thereof is 50 or less.

As the polyalkyleneoxide moiety, structures described in paragraphs 0060 to 0062 of JP2014-104631A are preferable.

The POA chain-containing polymer compound may have cross-linking properties in order to improve coated-film strength of an image area. Examples of the POA chain-containing polymer compounds having cross-linking properties are described in paragraphs 0063 to 0072 of JP2014-104631A.

The proportion of repeating units having a poly(alkyleneoxide) moiety in the total repeating units constituting the POA chain-containing polymer compound is not particularly limited, but is preferably in a range of 0.5% by mole to 80% by mole and more preferably in a range of 0.5% by mole to 50% by mole. Specific examples of the POA chain-containing polymer compounds are described in paragraphs 0075 and 0076 of JP2014-104631A.

As the POA chain-containing polymer compound, hydrophilic macromolecular compounds such as polyacrylic acid and polyvinyl alcohol described in JP2008-195018A can be used in combination as necessary. Further, a lipophilic polymer compound and a hydrophilic polymer compound can be used in combination.

In addition to the presence of the POA chain-containing polymer compound in the image recording layer as a binder that plays a role of connecting image recording layer components with each other, the specific polymer compound may be present in the form of a particle. In a case where the specific polymer compound is present in the form of a particle, the average particle diameter is preferably in a range of 10 nm to 1,000 nm, more preferably in a range of 20 nm to 300 nm, and particularly preferably in a range of 30 nm to 120 nm.

The content of the POA chain-containing polymer compound is preferably in a range of 3% by mass to 90% by mass and more preferably in a range of 5% by mass to 80% by mass with respect to the total mass of the image recording layer. In a case where the content thereof is in the above-described range, both of permeability of dampening water and image formability can be reliably achieved.

Other preferred examples of the binder polymer include a polymer compound (hereinafter, also referred to as a "star type polymer compound") which has a polymer chain bonded to a nucleus through a sulfide bond by means of using a polyfunctional, in a range of hexa- to deca-functional, thiol as the nucleus and in which the polymer chain has a polymerizable group. As the star type polymer compound, for example, compounds described in JP2012-148555A can be preferably used.

Examples of the star type polymer compound include compounds having a polymerizable group such as an ethylenically unsaturated bond in the main chain or in the side chain, preferably in the side chain, for improving coated-film strength of an image area as described in JP2008-195018A. Cross-linking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced into a polymer by a polymer reaction or copolymerization. For example, a reaction between a polymer having a carboxy group in the side chain thereof and glycidyl methacrylate or a reaction between a polymer having an epoxy group and ethylenically unsaturated group-containing carboxylic acid such as methacrylic acid can be used. These groups may be used in combination.

The content of the cross-linking group in the star type polymer compound is preferably in a range of 0.1 mmol to 10.0 mmol, more preferably in a range of 0.25 mmol to 7.0 mmol, and particularly preferably in a range of 0.5 mmol to 5.5 mmol with respect to 1 g of the star type polymer compound.

Moreover, it is preferable that the star type polymer compound further includes a hydrophilic group. The hydrophilic group contributes to providing on-press developability for the image recording layer. Particularly, in the coexistence of a polymerizable group and a hydrophilic group, both of printing durability and developability can be achieved.

Examples of the hydrophilic group include —$SO_3M^1$, —OH, —$CONR^1R^2$ ($M^1$ represents a hydrogen atom, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), —$N^-R^3R^4R^5X^-$ ($R^3$ to $R^5$ each independently represent an alkyl group having 1 to 8 carbon atoms and $X^-$ represents a counter anion), —$(CH_2CH_2O)_nR$, and —$(C_3H_6O)_mR$.

In the above-described formulae, n and m each independently represent an integer of 1 to 100 and R's each independently represent a hydrogen atom or an alkyl group having 1 to 18 carbon atoms.

Here, in a case where the star type polymer compound is a star type polymer compound having a polyoxyalkylene chain (for example, —$(CH_2CH_2O)_nR$, and —$(C_3H_6O)_mR$) in the side chain, such a star type polymer compound is a polymer compound having the above-described polyoxyalkylene chain in the side chain.

Among these hydrophilic groups, —$CONR^1R^2$, —$(CH_2CH_2O)_nR$, or —$(C_3H_6O)_mR$ is preferable, —$CONR^1R^2$ or —$(CH_2CH_2O)_nR$ is more preferable, and —$(CH_2CH_2O)_nR$ is particularly preferable. In —$(CH_2CH_2O)_nR$, n represents an integer of preferably 1 to 10 and particularly preferably 1 to 4. Further, R represents more preferably a hydrogen atom or an alkyl group having 1 to 4 carbon atoms and particularly preferably a hydrogen atom or a methyl group. These hydrophilic groups may be used in combination of two or more kinds thereof.

Further, it is preferable that the star type polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. In a case where the amount of these acid groups is less than 0.1 mmol/g, developability is further improved.

In order to control impressing properties, a lipophilic group such as an alkyl group, an aryl group, an aralkyl group, or an alkenyl group can be introduced to the star type polymer compound. Specifically, a lipophilic group-containing monomer such as methacrylic acid alkyl ester may be copolymerized.

Specific examples of the star type polymer compound include compounds described in paragraphs 0153 to 0157 of JP2014-104631A.

The star type polymer compound can be synthesized, using a known method, by performing radical polymerization on the above-described monomers constituting a polymer chain in the presence of the above-described polyfunctional thiol compound.

The weight-average molecular weight (Mw) of the star type polymer compound is preferably in a range of 5,000 to 500,000, more preferably in a range of 10,000 to 250,000, and particularly preferably in a range of 20,000 to 150,000. In a case where the weight-average molecular weight thereof is in the above-described range, the on-press developability and the printing durability are more improved.

The star type polymer compound may be used alone or in combination of two or more kinds thereof. Further, the star type polymer compound may be used in combination with a typical linear binder polymer.

The content of the star type polymer compound is preferably in a range of 5% by mass to 95% by mass, more preferably in a range of 10% by mass to 90% by mass, and particularly preferably in a range of 15% by mass to 85% by mass with respect to the total mass of the image recording layer.

From the viewpoint of promoting the permeability of dampening water and improving the on-press developability, star type polymer compounds described in JP2012-148555A are particularly preferable.

«Other Components»

The image recording layer A can contain other components described below.

(1) Low-Molecular Weight Hydrophilic Compound

In order to improve the on-press developability without degrading the printing durability, the image recording layer may contain a low-molecular weight hydrophilic compound.

As the low-molecular weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluene-sulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the image recording layer contains at least one selected from the group consisting of polyols, organic sulfates, organic sulfonates, and betaines.

Specific examples of the compounds of the organic sulfonates include compounds described in paragraphs 0026 to 0031 of JP2007-276454A and paragraphs 0020 to 0047 of JP2009-154525A. The salt may be potassium salt or lithium salt.

Examples of the organic sulfate include compounds described in paragraphs 0034 to 0038 of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular weight hydrophilic compound has a small structure of a hydrophobic portion, hydrophobicity or coated-film strength of an image area is not degraded by dampening water permeating into an image recording layer exposed portion (image area) and ink receptivity or printing durability of the image recording layer can be maintained satisfactorily.

The amount of the low-molecular weight hydrophilic compounds to be added to the image recording layer is preferably in a range of 0.5% by mass to 20% by mass, more preferably in a range of 1% by mass to 15% by mass, and still more preferably in a range of 2% by mass to 10% by mass with respect to the total mass of the image recording layer. In a case where the amount thereof is in the above-described range, excellent on-press developability and printing durability can be obtained.

These low-molecular weight hydrophilic compounds may be used alone or in combination of two or more kinds thereof.

(2) Oil Sensitizing Agent

In order to improve the impressing property, an oil sensitizing agent such as a phosphonium compound, a nitrogen-containing low-molecular weight compound, or an ammonium group-containing polymer can be used for the image recording layer. Particularly, in a case where a protective layer contains an inorganic layered compound, the above-described compounds function as a surface coating agent of the inorganic layered compound and prevent a degradation in impressing property due to the inorganic layered compound during the printing.

The phosphonium compound, the nitrogen-containing low-molecular weight compound, and the ammonium group-containing polymer are described in paragraphs 0184 to 0190 of JP2014-104631Ain detail.

The content of the oil sensitizing agent is preferably in a range of 0.01% by mass to 30.0% by mass, more preferably in a range of 0.1% by mass to 15.0% by mass, and still more preferably in a range of 1% by mass to 10% by mass with respect to the total mass of the image recording layer.

(3) Other Components

The image recording layer may further contain other components such as a surfactant, a coloring agent, a printing-out agent, a polymerization inhibitor, a higher fatty acid derivative, a plasticizer, inorganic particles, an inorganic layered compound, a co-sensitizer, and a chain transfer agent. Specifically, the compounds and the addition amounts described in paragraphs 0114 to 0159 of JP2008-284817A, paragraphs 0023 to 0027 of JP2006-091479A, and paragraph 0060 of US2008/0311520A can be preferably used.

«Formation of Image Recording Layer A»

The image recording layer A is formed by dispersing or dissolving each of the above-described required components in a known solvent to prepare a coating solution, coating a support with the coating solution directly or through an undercoat layer using a known method such as a bar coater coating method, and drying the resultant, as described in paragraphs 0142 and 0143 of JP2008-195018A. The coating amount of the image recording layer (solid content) on the support to be obtained after the coating and the drying varies depending on the applications thereof, but is preferably in a range of 0.3 g/m$^2$ to 3.0 g/m$^2$. In a case where the coating amount thereof is in the above-described range, excellent sensitivity and excellent film-coating characteristics of the image recording layer are obtained.

—Image Recording Layer B—

The image recording layer B contains an infrared absorbing agent, a polymerization initiator, a polymerizable compound, and a polymer compound having a particle shape. Hereinafter, the constituent components of the image recording layer B will be described.

Similarly, the infrared absorbing agent, the polymerization initiator, and the polymerizable compound described in the image recording layer A can be used as an infrared absorbing agent, a polymerization initiator, and a polymerizable compound in the image recording layer B.

«Polymer Compound Having Particle Shape»

It is preferable that the polymer compound having a particle shape is selected from the group consisting of thermoplastic polymer particles, thermally reactive polymer particles, polymer particles having a polymerizable group, a microcapsule encapsulating a hydrophobic compound, and a microgel (cross-linked polymer particle). Among these, polymer particles having a polymerizable group and a microgel are preferable. According to a particularly preferred embodiment, the polymer compound having a particle shape includes at least one ethylenically unsaturated polymerizable group. Because of the presence of the polymer compound having a particle shape, effects of improving the printing durability of an exposed portion and the on-press developability of an unexposed portion are obtained.

Further, it is preferable that the polymer compound having a particle shape is a thermoplastic polymer particle.

Preferred examples of the thermoplastic polymer particles include hydrophobic thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting thermoplastic polymer particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, styrene, a copolymer containing acrylonitrile, and polymethylmethacrylate are more preferable. The average particle diameter of the thermoplastic polymer particles is preferably in a range of 0.01 to 3.0 μm.

Examples of the thermally reactive polymer particles include polymer particles having a thermally reactive group. The thermally reactive polymer particles are cross-linked by a thermal reaction and have hydrophobic regions formed by a change in functional groups during the cross-linking.

As the thermally reactive group in polymer particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atoms as the reaction partners of these (such as an amino group, a hydroxy group, or a carboxy group); a carboxy group that performs a condensation reaction and a hydroxy group or an amino group as a reaction partner thereof; and an acid anhydride that performs a ring opening addition reaction and an amino group or a hydroxy group as a reaction partner thereof.

The microcapsule is a microcapsule in which at least a part of constituent components of the image recording layer is encapsulated as described in JP2001-277740A and JP2001-277742A. Further, the constituent components of the image recording layer may be contained in a portion other than the microcapsule. Moreover, a preferred embodiment of the image recording layer containing the microcapsule is an embodiment in which hydrophobic constituent components are encapsulated by a microcapsule and hydrophilic constituent components are contained by a portion other than the microcapsule.

The microgel (cross-linked polymer particles) may contain a part of the constituent components of the image recording layer in at least one of the surface or the inside thereof. From the viewpoints of image forming sensitivity and printing durability, a reactive microgel having a radical polymerizable group on the surface thereof is particularly preferable.

The constituent components of the image recording layer can be made into microcapsules or microgel particles using a known method.

From the viewpoints of the printing durability, stain resistance, and storage stability, it is preferable that the polymer compound having a particle shape is obtained by reacting a polyvalent isocyanate compound which is an adduct of a polyhydric phenol compound containing two or more hydroxy groups in a molecule and isophorone diisocyanate with a compound containing an active hydrogen atom.

As the polyhydric phenol compound, a compound having a plurality of benzene rings containing a phenolic hydroxy group is preferable.

As the compound that contains a compound containing the above-described active hydrogen atom, a polyol compound or a polyamine compound is preferable, a polyol compound is more preferable, and at least one compound selected from the group consisting of propylene glycol, glycerin, and trimethylolpropane is still more preferable.

As the resin particles obtained by reacting the compound containing an active hydrogen atom with the polyvalent isocyanate compound which is an adduct of a polyhydric phenol compound containing two or more hydroxy groups in a molecule and isophorone diisocyanate, polymer particles described in paragraphs 0032 to 0095 of JP2012-206495A are preferably exemplified.

Further, from the viewpoints of the printing durability and the solvent resistance, it is preferable that the polymer compound having a particle shape has a hydrophobic main chain and both of a constitutional unit (i) which contains a pendant-cyano group directly bonded to the hydrophobic main chain and a constitutional unit (ii) which contains a pendant group having a hydrophilic polyalkylene oxide segment.

As the hydrophobic main chain, an acrylic resin chain is preferably exemplified.

Preferred examples of the pendant-cyano group include —[CH$_2$CH(C≡N)—] and —[CH$_2$C(CH$_3$)(C≡N)—].

Further, the constitutional unit having a pendant-cyano group can be easily derived from an ethylene-based unsaturated monomer such as acrylonitrile or methacrylonitrile or a combination of these.

Further, as the alkylene oxide in the hydrophilic polyalkylene oxide segment, ethylene oxide or propylene oxide is preferable and ethylene oxide is more preferable.

The repetition number of alkylene oxide structures in the hydrophilic polyalkylene oxide segment is preferably in a range of 10 to 100, more preferably in a range of 25 to 75, and still more preferably in a range of 40 to 50.

As the resin particles which have a hydrophobic main chain and both of a constitutional unit (i) containing a pendant-cyano group directly bonded to the hydrophobic main chain and a constitutional unit (ii) containing a pendant group having a hydrophilic polyalkylene oxide segment, those described in paragraphs 0039 to 0068 of JP2008-503365A are preferably exemplified.

The average particle diameter of the polymer compound having a particle shape is preferably in a range of 0.01 μm to 3.0 μm, more preferably in a range of 0.03 μm to 2.0 μm, and still more preferably in a range of 0.10 μm to 1.0 μm. In a case where the average particle diameter thereof is in the above-described range, excellent resolution and temporal stability are obtained.

The content of the polymer compound having a particle shape is preferably in a range of 5% by mass to 90% by mass with respect to the mass of the image recording layer.

«Other Components»

The image recording layer B can contain other components described in the above-described image recording layer A as necessary.

<Formation of Image Recording Layer B>

The image recording layer B can be formed in the same manner as the image recording layer A described above.

—Image Recording Layer C—

The image recording layer C contains an infrared absorbing agent and thermoplastic polymer particles. Hereinafter, the constituent components of the image recording layer C will be described.

«Infrared Absorbing Agent»

As the infrared absorbing agent contained in the image recording layer C, a dye or a pigment having maximum absorption at a wavelength of 760 nm to 1,200 nm is preferable. A dye is more preferable.

As the dye, commercially available dyes and known dyes described in the literatures (for example, "Dye Handbook" edited by The Society of Synthetic Organic Chemistry, Japan, published in 1970, "Near Infrared Absorbing Dyes" of "Chemical Industry", p. 45 to 51, published on May, 1986, and "Development and Market Trend of Functional Dyes in 1990's" Section 2.3 of Chapter 2 (CMC Publishing Co., Ltd., 1990)) and the patents can be used. Specific preferred examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable from the viewpoint of addition to the image recording layer C.

Specific examples of the infrared absorbing dyes are described below, but the present disclosure is not limited thereto.

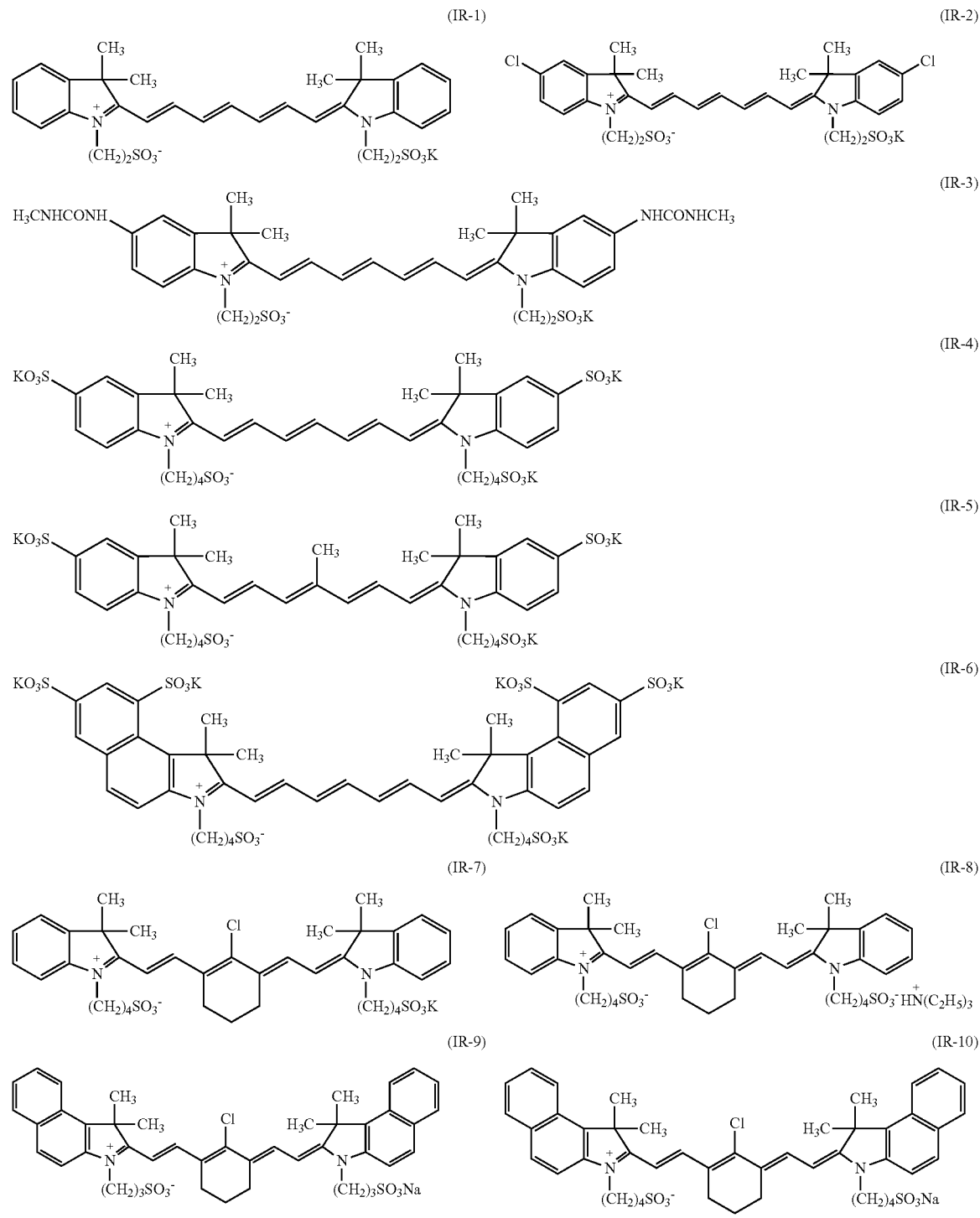

(IR-11)

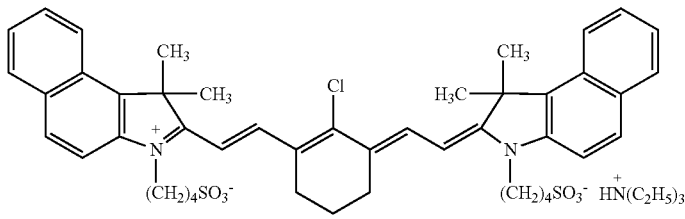

As the pigments, commercially available pigments and pigments described in Color Index (C. I.) Handbook, "Latest Pigment Handbook" (edited by Japan Pigment Technology Association, 1977), "Latest Pigment Application Technology" (CMC Publishing Co., Ltd., 1986), and "Printing Ink Technology" (CMC Publishing Co., Ltd., 1984) can be used.

The particle diameter of the pigment is preferably in a range of 0.01 μm to 1 μm and more preferably in a range of 0.01 μm to 0.5 μm. A known dispersion technique used to produce inks or toners can be used as a method of dispersing the pigment. The details are described in "Latest Pigment Application Technology" (CMC Publishing Co., Ltd., 1986).

The content of the infrared absorbing agent is preferably in a range of 0.1% by mass to 30% by mass, more preferably in a range of 0.25% by mass to 25% by mass, and particularly preferably in a range of 0.5% by mass to 20% by mass with respect to the total mass of the image recording layer. In a case where the content thereof is in the above-described range, excellent sensitivity is obtained without damaging the film hardness of the image recording layer.

«Thermoplastic Polymer Particles»

The glass transition temperature (Tg) of the thermoplastic polymer particles is preferably in a range of 60° C. to 250° C. The Tg of the thermoplastic polymer particles is more preferably in a range of 70° C. to 140° C. and still more preferably in a range of 80° C. to 120° C.

Preferred examples of the thermoplastic polymer particles having a Tg of 60° C. or higher include thermoplastic polymer particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene, styrene, a copolymer containing styrene and acrylonitrile, and polymethylmethacrylate are preferable.

The average particle diameter of the thermoplastic polymer particles is preferably in a range of 0.005 μm to 2.0 μm from the viewpoints of the resolution and the temporal stability. This value is used as the average particle diameter in a case where two or more kinds of thermoplastic polymer particles are mixed with each other. The average particle diameter thereof is more preferably in a range of 0.01 μm to 1.5 μm and particularly preferably in a range of 0.05 μm to 1.0 μm. The polydispersity in a case where two or more kinds of thermoplastic polymer particles are mixed with each other is preferably 0.2 or greater. The average particle diameter and the polydispersity are calculated according to a laser light scattering method.

The thermoplastic polymer particles may be used in combination of two or more kinds thereof. Specifically, at least two kinds of thermoplastic polymer particles with different particle sizes or at least two kinds of thermoplastic polymer particles with different glass transition temperatures (Tg) may be exemplified. In a case where two or more kinds of thermoplastic polymer particles are used in combination, coated-film curing properties of an image area are further improved and printing durability in a case where a lithographic printing plate is obtained is further improved.

For example, in a case where thermoplastic polymer particles having the same particle size are used, voids are present between the thermoplastic polymer particles to some extent, the curing properties of the coated-film are not desirable in some cases even in a case where the thermoplastic polymer particles are melted and solidified by image exposure. Meanwhile, in a case where thermoplastic polymer particles having different particle sizes are used, the void volume between the thermoplastic polymer particles can be decreased and thus the coated-film curing properties of the image area after image exposure can be improved.

Further, in a case where thermoplastic polymer particles having the same Tg are used, the thermoplastic polymer particles are not sufficiently melted and solidified and, accordingly, the coated-film curing properties are not desirable in some cases when an increase in temperature of the image recording layer resulting from image exposure is insufficient. Meanwhile, in a case where thermoplastic polymer particles having different glass transition temperatures (Tg) are used, the coated-film curing properties of the image area can be improved when an increase in temperature of the image recording layer resulting from image exposure is insufficient.

In a case where two or more kinds of thermoplastic polymer particles having different glass transition temperatures (Tg) are used in combination, the Tg of at least one thermoplastic polymer particle is preferably 60° C. or higher. At this time, a difference in Tg is preferably 10° C. or higher and more preferably 20° C. or higher. In addition, the content of the thermoplastic polymer particles having a Tg of 60° C. or higher is preferably 70% by mass or greater with respect to the total amount of all thermoplastic polymer particles.

The thermoplastic polymer particles may include a cross-linking group. In a case where thermoplastic polymer particles having a cross-linking group are used, the cross-linking group is thermally reacted due to heat generated by an image-exposed portion, cross-linking occurs between polymers, coated-film strength of an image area is improved, and printing durability becomes more excellent. As the cross-linking group, a functional group, in which any reaction may occur, is not limited as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having active hydrogen atoms as the reaction partners of these (such as an amino group, a hydroxy group, or a carboxyl group); an epoxy group that performs an addition reaction and an amino group, a carboxyl group or a hydroxy group as reaction partners thereof, a carboxyl group that performs a condensation reaction and a hydroxy group or an amino group; and an acid anhydride that performs a ring opening addition reaction and an amino group or a hydroxy group.

Specific examples of the thermoplastic polymer particles having a cross-linking group include thermoplastic polymer fine particles having cross-linking groups such as an acryloyl group, a methacryloyl group, a vinyl group, an allyl group, an epoxy group, an amino group, a hydroxy group, a carboxyl group, an isocyanate group, an acid anhydride, and a group protecting these. These cross-linking groups may be introduced to polymers at the time of polymerization of particle polymers or may be introduced using a polymer reaction after polymerization of particle polymers.

In a case where a cross-linking group is introduced to a polymer at the time of polymerization of polymer particles, it is preferable that a monomer having a cross-linking group may be subjected to an emulsion polymerization or suspension polymerization. Specific examples of the monomer having a cross-linking group include allyl methacrylate, allyl acrylate, vinyl methacrylate, vinyl acrylate, glycidyl methacrylate, glycidyl acrylate, 2-isocyanate ethyl methacrylate or block isocyanate resulting from alcohol thereof, 2-isocyanate ethyl acrylate or block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate.

Examples of the polymer reaction used in a case where a cross-linking group is introduced after polymerization of polymer particles include polymer reactions described in WO96/034316A.

Polymer particles may react with each other through a cross-linking group or the thermoplastic polymer particles may react with a polymer compound or a low-molecular weight compound added to the image recording layer.

The content of the thermoplastic polymer particles is preferably in a range of 50% by mass to 95% by mass, more preferably in a range of 60% by mass to 90% by mass, and particularly preferably in a range of 70% by mass to 85% by mass with respect to the total mass of the image recording layer.

«Other Components»

The image recording layer C may contain other components as necessary.

As other components, a surfactant having a polyoxyalkylene group or a hydroxy group is preferably exemplified.

As a surfactant having a polyoxyalkylene group (hereinafter, also referred to as a "POA group") or a hydroxy group, a surfactant having a POA group or a hydroxy group can be suitably used, but an anionic surfactant or a non-ionic surfactant is preferable. Among anionic surfactants or non-ionic surfactants having a POA group or a hydroxy group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of an oxyalkylene group is preferably in a range of 2 to 50 and more preferably in a range of 2 to 20.

The number of hydroxy groups is preferably 1 to 10 and more preferably in a range of 2 to 8. Here, the number of terminal hydroxy groups in the oxyalkylene group is not included in the number of hydroxy groups.

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenylether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxy group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxy group is preferably in a range of 0.05% by mass to 15% by mass and more preferably in a range of 0.1% by mass to 10% by mass with respect to the total mass of the image recording layer.

Hereinafter, specific examples of the surfactant having a POA group or a hydroxy group will be described, but the present disclosure is not limited thereto. A surfactant A-12 described below is a trade name of Zonyl FSP and available from Dupont. Further, a surfactant N-11 described below is a trade name of Zonyl FSO 100 and available from Dupont. Further, m and n in A-12 each independently represent an integer of 1 or greater.

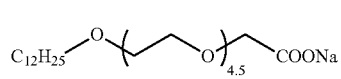

A-1

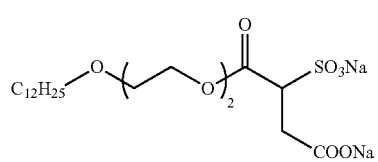

A-2

A-3

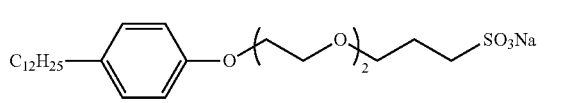

A-4

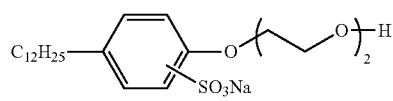

A-5

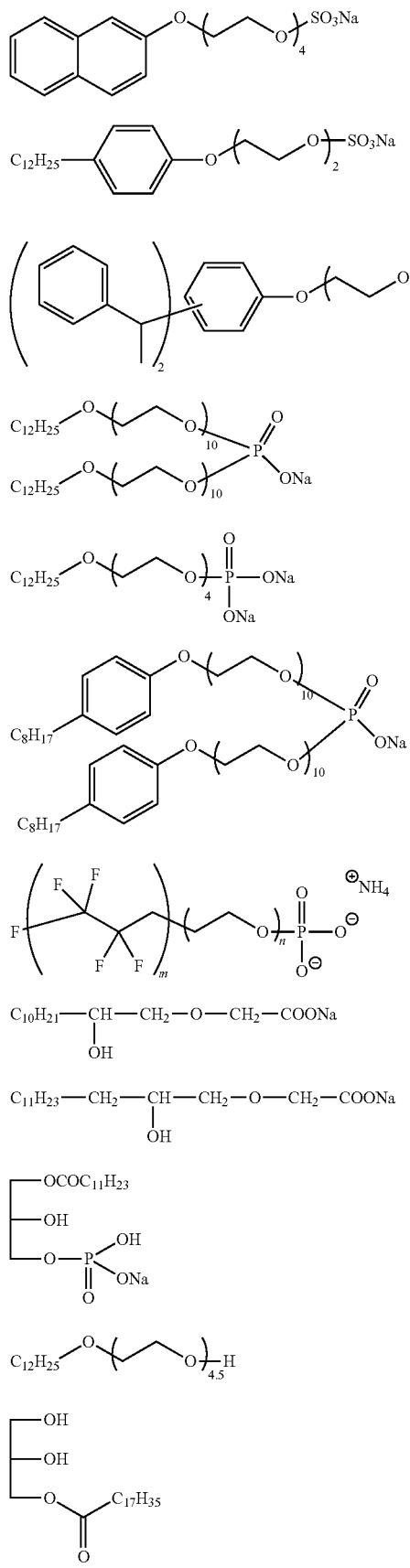
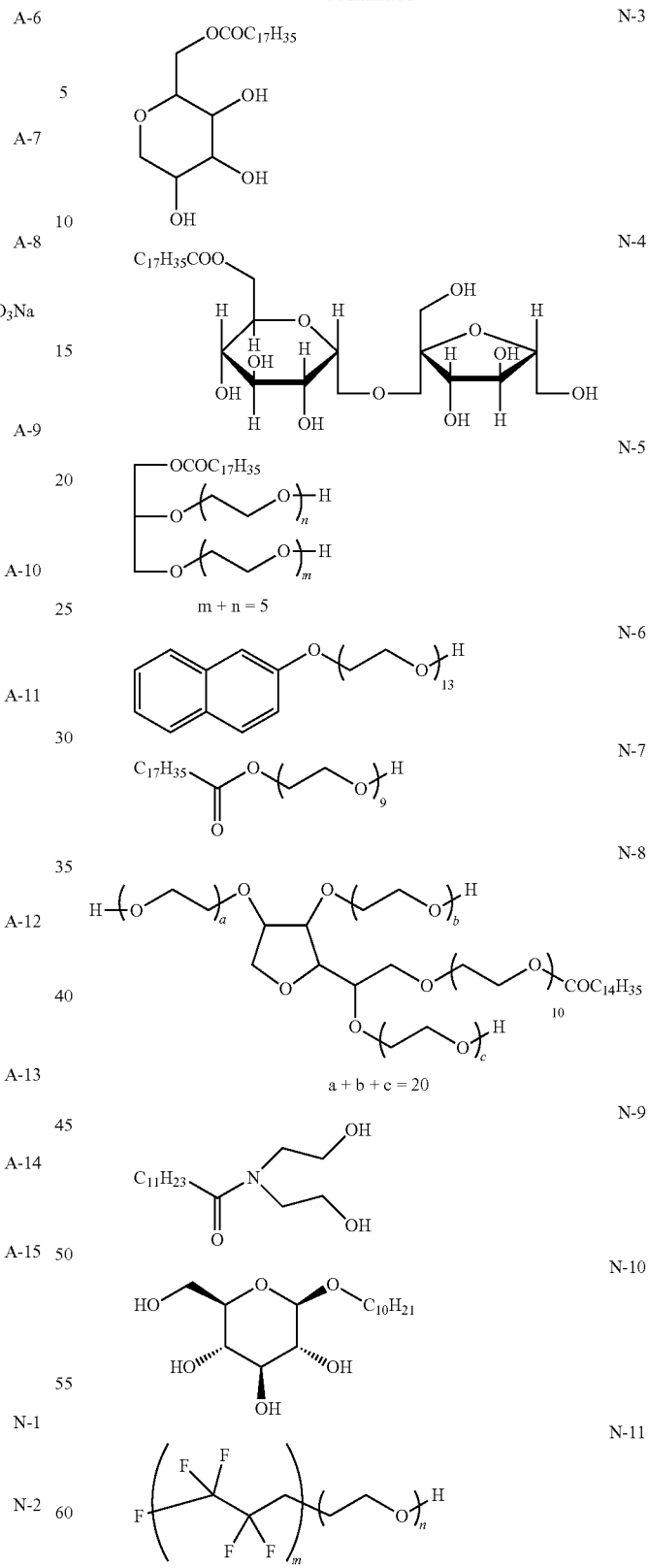
For the purpose of ensuring coating uniformity of the image recording layer, the image recording layer may contain an anionic surfactant that does not have a polyoxyalkylene group or a hydroxy group.

The anionic surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxy group is preferably in a range of 1% by mass to 50% by mass and more preferably in a range of 1% by mass to 30% by mass with respect to the total mass of the surfactant which has a polyoxyalkylene group or a hydroxy group.

Hereinafter, specific examples of the anionic surfactant that does not have a polyoxyalkylene group or a hydroxy group will be described, but the present disclosure is not limited thereto.

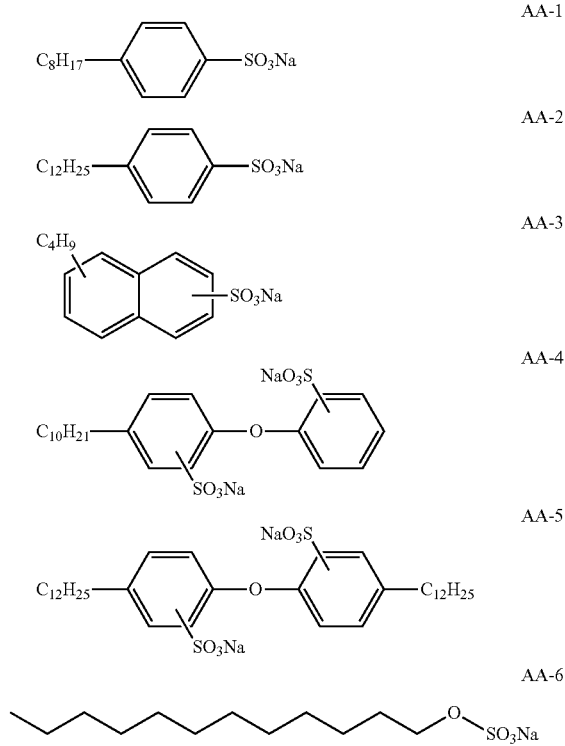

Further, for the purpose of coating uniformity of the image recording layer, a non-ionic surfactant that does not have a polyoxyalkylene group or a hydroxy group or a fluorine surfactant may be used. For example, fluorine surfactants described in JP1987-170950A (JP-S62-170950A) are preferably used.

The image recording layer may contain a hydrophilic resin. Preferred examples of the hydrophilic resin include resins having hydrophilic groups such as a hydroxy group, a hydroxyethyl group, a hydroxypropyl group, an amino group, an aminoethyl group, an aminopropyl group, a carboxy group, a carboxylate group, a sulfo group, a sulfonate group, and a phosphoric acid group.

Specific examples of the hydrophilic resin include gum Arabic, casein, gelatin, a starch derivative, carboxy methyl cellulose and sodium salt thereof, cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxy ethyl methacrylate, a homopolymer and a copolymer of hydroxy ethyl acrylate, a homopolymer and a copolymer of hydroxy propyl methacrylate, a homopolymer and a copolymer of hydroxy propyl acrylate, a homopolymer and a copolymer of hydroxy butyl methacrylate, a homopolymer and a copolymer of hydroxy butyl acrylate, polyethylene glycols, hydroxy propylene polymers, polyvinyl alcohols, hydrolyzed polyvinyl acetate having a degree of hydrolysis of preferably at least 60% and more preferably at least 80%, polyvinyl formal, polyvinyl butyral, polyvinyl pyrrolidone, a homopolymer and a copolymer of acrylamide, a homopolymer and a copolymer of methacrylamide, and a homopolymer and a copolymer of N-methylol acrylamide.

The weight-average molecular weight of the hydrophilic resin is preferably 2,000 or greater from the viewpoints of obtaining sufficient coated-film strength or printing durability.

The content of the hydrophilic resin is preferably in a range of 0.5% by mass to 50% by mass and more preferably in a range of 1% by mass to 30% by mass with respect to the total mass of the image recording layer.

The image recording layer may contain inorganic particles other than those for forming unevenness described above. Preferred examples of the inorganic particles include silica, alumina, magnesium oxide, titanium oxide, magnesium carbonate, calcium alginate, and a mixture of these. The inorganic particles can be used for the purpose of improving coated-film strength.

The average particle diameter of the inorganic particles is preferably in a range of 5 nm to 10 μm and more preferably in a range of 10 nm to 1 μm. In a case where the average particle diameter thereof is in the above described range, the thermoplastic polymer particles are stably dispersed, the film hardness of the image recording layer is sufficiently held, and a non-image area with excellent hydrophilicity in which printing stain is unlikely to occur can be formed.

The inorganic particles are available as commercially available products such as a colloidal silica dispersion and the like.

The content of the inorganic particles is preferably in a range of 1.0% by mass to 70% by mass and more preferably in a range of 5.0% by mass to 50% by mass with respect to the total mass of the image recording layer.

The image recording layer may contain a plasticizer in order to provide flexibility for a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% by mass to 50% by mass and more preferably in a range of 1% by mass to 30% by mass with respect to the total mass of the image recording layer.

In a case where polymer particles having a thermally reactive functional group (cross-linking group) are used for the image recording layer, a compound that starts or promotes a reaction of the thermally reactive functional group (cross-linking group) can be added to the image recording layer as necessary. As the compound that starts or promotes a reaction of the thermally reactive functional group, a compound that generates a radical or a cation by heating may be exemplified. Examples of the compound include a lophine dimer, a trihalomethyl compound, a peroxide, an azo compound, onium salts including diazonium salts and diphenyl iodonium salts, acyl phosphine, and imide sulfonate. The amount of the compound to be added to the image recording layer is preferably in a range of 1% by mass to 20% by mass and more preferably in a range of 1% by mass to 10% by mass with respect to the total mass of the image recording layer. In a case where the amount thereof is in the above-described range, the on-press developability is not degraded and excellent effects for starting or promoting a reaction are obtained.

«Formation of Image Recording Layer C»

The image recording layer C is formed by dissolving or dispersing each of the above-described required components in a suitable solvent to prepare a coating solution, coating a support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% by volume to 50% by volume. Here, it is necessary that the amount of the organic solvent to be used is set such that the thermoplastic polymer particles are not aggregated. The concentration of solid contents of the image recording layer coating solution is preferably in a range of 1% by mass to 50% by mass.

As the organic solvent used as a solvent of the coating solution, a water-soluble organic solvent is preferable. Specific examples thereof include an alcohol solvent such as methanol, ethanol, propanol, isopropanol, or 1-methoxy-2-propanol, a ketone solvent such as acetone or methyl ethyl ketone, a glycol ether solvent such as ethylene glycol dimethyl ether, γ-butyrolactone, N,N-dimethylformamide, N,N-dimethylacetamide, tetrahydrofuran, and dimethylsulfoxide. Particularly, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the image recording layer coating solution, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the support obtained after the coating and the drying varies depending on the purpose thereof, but is preferably in a range of 0.5 g/m$^2$ to 5.0 g/m$^2$ and more preferably in a range of 0.5 g/m$^2$ to 2.0 g/m$^2$.

Hereinafter, other constituent elements of the lithographic printing plate precursor will be described.

<Undercoat Layer>

The lithographic printing plate precursor according to the present disclosure may be provided with an undercoat layer between the image recording layer and the support as necessary. Since bonding of the support to the image recording layer becomes stronger in an exposed portion and the support is easily separated from the image recording layer in an unexposed portion, the undercoat layer contributes to improvement of on-press developability without degrading the printing durability. Further, in a case of infrared laser exposure, the undercoat layer functions as a heat insulating layer so that a degradation in sensitivity due to heat, generated by exposure, being diffused in the support is prevented.

Examples of eth compound used for the undercoat layer include a silane coupling agent having an ethylenic double bond reaction group, which can be added and polymerized, described in JP1998-282679A (JP-H10-282679A); and a phosphorous compound having an ethylenic double bond reaction group described in JP1990-304441A (JP-H02-304441A). Preferred examples thereof include polymer compounds having an adsorptive group which can be adsorbed to the surface of the support, a hydrophilic group, and a cross-linking group, as described in JP2005-125749A and JP2006-188038A. As such a polymer compound, a copolymer of a monomer having an adsorptive group, a monomer having a hydrophilic group, and a monomer having a cross-linking group is preferable. Specific examples thereof include a copolymer of a monomer having an adsorptive group such as a phenolic hydroxy group, a carboxy group, —PO$_3$H$_2$, —OPO$_3$H$_2$, —CONHSO$_2$—, —SO$_2$NHSO$_2$—, or —COCH$_2$COCH$_3$, a monomer having a hydrophilic group such as a sulfo group, and a monomer having a polymerizable cross-linking group such as a methacryl group or an allyl group. The polymer compound may include a cross-linking group introduced by forming salts between a polar substituent of the polymer compound and a compound that includes a substituent having the opposite charge and an ethylenically unsaturated bond. Further, monomers other than the monomers described above, preferably hydrophilic monomers may be further copolymerized.

The content of the ethylenically unsaturated bond in the polymer compound for an undercoat layer is preferably in a range of 0.1 to 10.0 mmol and more preferably in a range of 2.0 to 5.5 mmol with respect to 1 g of the polymer compound.

The weight-average molecular weight of the polymer compound for an undercoat layer is preferably 5,000 or greater and more preferably in a range of 10,000 to 300,000.

For the purpose of preventing stain over time, the undercoat layer may contain a chelating agent, a secondary or tertiary amine, a polymerization inhibitor, an amino group, a compound that includes an amino group or a functional group having polymerization inhibiting ability and a group interacting with the surface of an aluminum support, and the like (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount of the undercoat layer after being dried is preferably in a range of 0.1 mg/m$^2$ to 100 mg/m$^2$ and more preferably in a range of 1 mg/m$^2$ to 30 mg/m$^2$.

<Protective Layer>

In the lithographic printing plate precursor, according to the present disclosure, a protective layer may be provided on the image recording layer as necessary. The protective layer has a function of suppressing a reaction of inhibiting image formation through oxygen blocking, a function of preventing generation of damage to the image recording layer, and a function of preventing ablation at the time of high illuminance laser exposure.

As the protective layer having such functions, a protective layer described in paragraphs 0202 to 0204 of JP2014-104631A can be used.

The protective layer is applied according to a known method. The coating amount of the protective layer after the drying is preferably in a range of 0.01 g/m$^2$ to 10 g/m$^2$, more preferably in a range of 0.02 g/m² to 3 g/m², and particularly preferably in a range of 0.02 g/m² to 1 g/m².

The lithographic printing plate precursor can be produced by applying a coating solution of each configuration layer according to a typical method, performing drying, and forming each configuration layer. The coating solution can be applied according to a die coating method, a dip coating method, an air knife coating method, a curtain coating method, a roller coating method, a wire bar coating method, a gravure coating method, or a slide coating method.

A method of producing the lithographic printing plate precursor according to the present disclosure is not particularly limited, but it is preferable that the method thereof includes a step of forming the image recording layer on the aluminum support after one or more days from an anodization treatment performed thereon.

In a case where the aluminum support after one or more days from an anodization treatment performed thereon is used, the development delay resistance becomes further excellent even though the detailed mechanism is not clear.

In the method of producing the lithographic printing plate precursor according to the present disclosure, from the viewpoints of the development delay resistance, it is more preferable to use an aluminum support after three days to 1.6 years from an anodization treatment performed thereon and still more preferable to use an aluminum support after 7 days to 1 year from an anodization treatment performed thereon.

Further, in a case where an undercoat layer is formed, from the viewpoints of the development delay resistance, it is preferable that the method of producing the lithographic printing plate precursor according to the present disclosure includes a step of forming the undercoat layer on the aluminum support after one or more days from an anodization treatment performed thereon.

(Lithographic Printing Plate Precursor Laminate and Lithographic Printing Plate Laminate)

The lithographic printing plate precursor laminate according to the present disclosure is a laminate obtained by laminating lithographic printing plate precursors according to the present disclosure, and a laminate which is obtained by laminating a plurality of the lithographic printing plate precursors according to the present disclosure, in which the outermost layer on the surface where the image recording layer is provided and the outermost layer on the surface on the opposite side of the surface where the image recording layer is provided are laminated by being directly brought into contact with each other, is preferable.

Further, it is preferable that the lithographic printing plate precursor laminate according to the present disclosure is a laminate obtained by laminating a plurality of sheets of lithographic printing plate precursors according to the present disclosure without interposing interleaving paper therebetween.

The number of sheets of laminated precursors is not particularly limited, but is preferably in a range of 2 sheets to 500 sheets.

The lithographic printing plate precursor laminate according to the present disclosure has excellent performance in any of adhesiveness, scratches, or bruises due to the specific surface roughness of the lithographic printing plate precursor according to the present disclosure, and dislocation in stacking of lithographic printing plate precursors is unlikely to occur.

The lithographic printing plate laminate according to the present disclosure is a laminate obtained by laminating the lithographic printing plates according to the present disclosure described below.

For example, in a case where there is an interval between several hours to several days after the plate-making of the lithographic printing plate precursor according to the present disclosure before the initiation of printing, the lithographic printing plate laminate according to the present disclosure is formed by staking a plurality of obtained lithographic printing plates and allowing the stack to stand at an appropriate location.

The lithographic printing plate laminate according to the present disclosure has excellent performance in any of adhesiveness, scratches, or bruises due to the specific surface roughness of the lithographic printing plate according to the present disclosure, and dislocation in stacking of lithographic printing plates is unlikely to occur.

(Lithographic Printing Plate and Plate-Making Method Thereof and Lithographic Printing Method)

The lithographic printing plate according to the present disclosure is a lithographic printing plate obtained by plate-making the lithographic printing plate precursor according to the present disclosure.

The plate-making method of the lithographic printing plate according to the present disclosure is not particularly limited as long as the method is a method of plate-making the lithographic printing plate precursor according to the present disclosure, and the method is a method of plate-making the lithographic printing plate using the lithographic printing plate precursor according to the present disclosure and performing printing, and it is preferable that the method includes a step of image-exposing the lithographic printing plate precursor according to the present disclosure (also referred to as an "image-exposure step"); and a step of supplying at least any of printing ink or dampening water and removing an unexposed portion of an image recording layer on a printing press to prepare a lithographic printing plate (also referred to as a "development treatment step").

The above-described plate-making method is also referred to as an "on-press development system" below.

The lithographic printing method according to the present disclosure is a method of plate-making the lithographic printing plate using the lithographic printing plate precursor according to the present disclosure and performing printing, and it is preferable that the method includes a step of image-exposing the lithographic printing plate precursor according to the present disclosure (also referred to as an "image-exposure step"); a step of supplying at least any of printing ink or dampening water and removing an unexposed portion of an image recording layer on a printing press to prepare a lithographic printing plate (also referred to as a "development treatment step"); and a step of performing printing using the obtained lithographic printing plate (also referred to as a "printing step").

Further, in the lithographic printing plate precursor according to the present disclosure, the development treatment step is performed without performing the image exposure step in a case of the key plate precursor.

<Image Exposure Step>

The image exposure of the lithographic printing plate precursor can be performed in conformity with an image exposure operation for a typical lithographic printing plate precursor.

The image exposure is performed by laser exposure through a transparent original picture having a line image, a halftone image, and the like or by laser beam scanning using digital data. The wavelength of a light source is preferably in a range of 700 nm to 1,400 nm. As the light source having a wavelength of 700 nm to 1,400 nm, a solid-state laser or a semiconductor laser that radiates infrared rays is preferable. The output of the infrared laser is preferably 100 mW or greater, the exposure time per one pixel is preferably less than 20 microseconds, and the irradiation energy quantity is preferably in a range of 10 mJ/cm$^2$ to 300 mJ/cm$^2$. For the purpose of reducing the exposure time, it is preferable to use a multi-beam laser device. The exposure mechanism may be any of an internal drum system, an external drum system, and a flat bed system. The image exposure can be performed using a plate setter according to a usual method.

<Development Treatment Step>

The development step can be performed using a typical method. In a case of on-press development, a printing ink receiving portion having a lipophilic surface is formed by the image recording layer cured by light exposure in the exposed portion of the image recording layer in a case where at least any of dampening water or printing ink is supplied to the image-exposed lithographic printing plate precursor on a printing press. Meanwhile, in an unexposed portion, a non-cured image recording layer is dissolved or dispersed by supplied at least any of dampening water or printing ink and then removed, a hydrophilic surface is exposed to the portion. As the result, dampening water is exposed and adheres to the hydrophilic surface, the printing ink is impressed on the image recording layer of the exposed region, and then the printing is started.

Here, either of dampening water or printing ink may be initially supplied to the surface of the lithographic printing plate precursor, but it is preferable that dampening water is initially supplied thereto by infiltrating dampening water so that the on-press developability is promoted.

<Printing Step>

The printing using the obtained lithographic printing plate can be performed according to a typical method. The printing can be performed by supplying desired printing ink and dampening water, as necessary, to the lithographic printing plate.

The amount of the printing ink and dampening water to be supplied is not particularly limited and may be appropriately set according to the desired printing.

The method of supplying the printing ink and dampening water to the lithographic printing plate is not particularly limited and a known method can be used.

Further, in the lithographic printing plate precursor according to the present disclosure, a lithographic printing plate can be prepared by performing a development treatment using a developer by appropriately selecting a binder polymer or the like serving as a constituent component of the image recording layer.

According to another aspect, it is preferable that the method of plate-making a lithographic printing plate according to the present disclosure includes a step of image-exposing the lithographic printing plate precursor according to the present disclosure (also referred to as an "image exposure step") and a development step of supplying a developer having a pH of 2 to 14 and removing the unexposed portion (also referred to as a "developer development step").

The plate-making method is also referred to as a "developer treatment system".

According to another aspect, it is preferable that the lithographic printing method according to the present disclosure includes a step of image-exposing the lithographic printing plate precursor according to the present disclosure (also referred to as an "image exposure step"); a development step of supplying a developer having a pH of 2 to 14 and removing the unexposed portion (also referred to as a "developer development step"); and a step of performing printing using the obtained lithographic printing plate (hereinafter, also referred to as a "printing step").

[Image Exposure Step]

The image exposure step in the developer treatment system is the same as the image exposure step in the on-press development system described above.

[Developer Treatment System]

In the lithographic printing plate precursor according to the present disclosure, a lithographic printing plate can be prepared by performing a development treatment using a developer by appropriately selecting a binder polymer or the like serving as a constituent component of the image recording layer. The development treatment carried out using a developer includes an aspect (also referred to as a simple development treatment) of using a developer having a pH of 2 to 11 which contains at least one compound selected from the group consisting of a surfactant and a water-soluble polymer compound.

The development treatment and a gum liquid treatment step can be simultaneously performed using a method of allowing a developer to contain a water-soluble polymer compound as necessary.

Accordingly, a post-water washing step is not particularly required, and a drying step can be performed after the development treatment and the gum liquid treatment are performed using one liquid and one step. Therefore, it is preferable that the development treatment using a developer is performed according to the method of preparing a lithographic printing plate, including a step of performing a development treatment on the image-exposed lithographic printing plate precursor using a developer having a pH of 2 to 11. After the development treatment, it is preferable that the drying is performed after the excessive developer is removed using a squeeze roller.

In other words, in the development step of the method of preparing a lithographic printing plate according to the present disclosure, it is preferable that the development treatment and the gum liquid treatment are performed using one liquid and one step.

The expression "the development treatment and the gum liquid treatment are performed using one liquid and one step" means that the development treatment and the gum liquid treatment are performed in one step using one liquid without separately performing the development treatment and the gum liquid treatment as individual steps.

The development treatment can be suitably performed using an automatic development treatment device provided with developer supply means and a rubbing member. As the rubbing member, an automatic development treatment device provided with a rotary brush roll is particularly preferable.

It is preferable that two or more rotary brush rolls are used. Further, it is preferable that an automatic development treatment device includes means for removing the excessive developer, such as a squeeze roller, and drying means such as a hot air device on the rear side of the development treatment device. Further, the automatic development treatment device may include pre-heating means for performing a heating treatment on the image-exposed lithographic printing plate precursor on the front side of the development treatment means.

The treatment carried out using such an automatic development treatment device has an advantage that it is no longer necessary to deal with development scum derived from an image recording layer (a protective layer in a case where the lithographic printing plate precursor has a protective layer) which is generated in a case of a so-called on-press development treatment.

In a case where the development is carried out by performing a treatment manually, a method of allowing sponge or absorbent cotton to contain an aqueous solution, performing treatment while rubbing the entire plate surface, and drying the aqueous solution after the treatment is completed is suitably exemplified as the development treatment method. In a case of an immersion treatment, for example, a method of immersing the lithographic printing plate precursor in a tray, a deep tank, or the like containing an aqueous solution therein for approximately 60 seconds, stirring the solution, and drying the aqueous solution while rubbing the plate surface with absorbent cotton or sponge is suitably exemplified.

It is preferable that a device capable of simplifying the structure and the steps is used in the development treatment.

For example, in the alkali development treatment, a protective layer is removed by the pre-water washing step, development is performed using an alkali developer having a high pH, an alkali is removed by the post-water washing step, the gum treatment is performed by a gum coating step, and drying is performed by a drying step. In the simple development treatment, development and gum coating can be simultaneously performed using one liquid. Therefore, the post-water washing step and the gum treatment step can be omitted, and it is preferable that the drying step is performed as necessary after development and gum coating (gum liquid treatment) are performed using one liquid.

Further, it is preferable that removal of the protective layer, development, and gum coating are simultaneously performed using one liquid without performing the pre-water washing step. Further, it is preferable that the excessive developer is removed using a squeeze roller after the development and the gum coating and then drying is performed.

The development treatment may be performed according to a method of performing immersion in a developer once or a method of performing immersion twice or more times. Among these, a method of performing immersion in the developer once or twice is preferable.

The immersion may be carried out by passing the exposed lithographic printing plate precursor through a developer tank in which the developer is stored or spraying the developer onto the plate surface of the exposed lithographic printing plate precursor using a spray or the like.

Further, the development treatment is performed using one liquid (one liquid treatment) even in a case where the lithographic printing plate precursor is immersed in the developer twice or more times or in a case where the lithographic printing plate precursor is immersed, twice or more times, in the same developer as described above or a developer (fatigue liquid) obtained by dissolving or dispersing components of the image recording layer using the developer and the development treatment.

The development treatment can be performed by immersing the lithographic printing plate precursor which has been subjected to the exposure treatment and rubbing the plate surface with brushes or pumping up the treatment liquid added to an external tank using a pump, spraying the developer from a spray nozzle, and rubbing the plate surface with brushes at a temperature of preferably 0° C. to 60° C. and more preferably 15° C. to 40° C., according to a conventional method. These development treatments can be continuously performed plural times. For example, the development treatment can be performed by pumping up the developer added to an external tank using a pump, spraying the developer from a spray nozzle, rubbing the plate surface with brushes, spraying the developer from the spray nozzle again, and rubbing the plate surface with the brushes. In a case where the development treatment is performed using an automatic development treatment device, since the developer becomes fatigued as the treatment amount increases, it is preferable that the treatment capability is recovered using a replenisher or a fresh developer.

The development treatment can also be performed using a gum coater or an automatic development treatment device which has been known to be used for a presensitized (PS) plate and computer-to-plate (CTP) in the related art. In a case where an automatic development treatment device is used, for example, any system from among a system of performing the treatment by pumping the developer added to a developer tank or the developer added to an external tank using a pump and spraying the developer from a spray nozzle, a system of performing the treatment by immersing a printing plate in a tank filled with the developer and transporting the printing plate using a guide roller in the developer, and a so-called disposable treatment system, which is a system of performing the treatment by supplying the substantially unused developer by an amount required for each plate can be employed. In all systems, it is preferable that a rubbing mechanism using brushes or a molleton is provided. For example, commercially available automatic development treatment devices (Clean Out Unit C85/C125, Clean-Out Unit+C85/120, FCF 85V, FCF 125V, FCF News (manufactured by Glunz & Jensen); and Azura CX85, Azura CX125, and Azura CX150 (manufactured by AGFA GRAPHICS) can be used. In addition, a device in which a laser exposure portion and an automatic development treatment device portion are integrally incorporated can also be used.

The components and the like of the developer used for the development step will be described in detail.

—pH—

The pH of the developer is preferably in a range of 2 to 11, more preferably in a range of 5 to 9, and still more preferably in a range of 7 to 9. From the viewpoints of the developability and the dispersibility of the image recording layer, it is advantageous that the value of the pH is set to be higher. However, from the viewpoints of the printability and suppression of stain, it is effective that the value of the pH is set to be low.

Here, the pH is a value obtained by performing measurement at 25° C. using a pH meter (model number: HM-31, manufactured by DKK-TOA Corporation).

—Surfactant—

The developer may contain a surfactant such as an anionic surfactant, a non-ionic surfactant, a cationic surfactant, or an amphoteric surfactant.

From the viewpoint of blanket stain properties, it is preferable that the developer contains at least one selected from the group consisting of an anionic surfactant and an amphoteric surfactant.

Further, it is preferable that the developer contains a non-ionic surfactant and more preferable that the developer contains at least one selected from the group consisting of a non-ionic surfactant, an anionic surfactant, and an amphoteric surfactant.

Preferred examples of the anionic surfactant include compounds represented by Formula (I).

$$R^1—Y^1—X^1 \qquad (I)$$

In Formula (I), $R^1$ represents an alkyl group, a cycloalkyl group, an alkenyl group, an aralkyl group, or an aryl group which may have a substituent.

As the alkyl group, an alkyl group having 1 to 20 carbon atoms is preferable, and preferred specific examples thereof include a methyl group, an ethyl group, a propyl group, an n-butyl group, a sec-butyl group, a hexyl group, a 2-ethylhexyl group, an octyl group, a decyl group, a dodecyl group, a hexadecyl group, and a stearyl group.

The cycloalkyl group may be monocyclic or polycyclic. As the monocyclic cycloalkyl group, a monocyclic cycloalkyl group having 3 to 8 carbon atoms is preferable, and a cyclopropyl group, a cyclopentyl group, a cyclohexyl group, or a cyclooctyl group is more preferable. Preferred examples of the polycyclic cycloalkyl group include an adamantyl group, a norbornyl group, an isobornyl group, a camphanyl group, a dicyclopentyl group, an ca-pinel group, and a tricyclodecanyl group.

As the alkenyl group, for example, an alkenyl group having 2 to 20 carbon atoms is preferable, and preferred specific examples thereof include a vinyl group, an allyl group, a butenyl group, and a cyclohexenyl group.

As the aralkyl group, for example, an aralkyl group having 7 to 12 carbon atoms is preferable, and preferred specific examples thereof include a benzyl group, a phenethyl group, and a naphthylmethyl group.

As the aryl group, for example, an aryl group having 6 to 15 carbon atoms is preferable, and preferred specific examples thereof include a phenyl group, a tolyl group, a dimethylphenyl group, a 2,4,6-trimethylphenyl group, a naphthyl group, an anthryl group, and a 9,10-dimethoxyanthryl group.

As the substituent, a monovalent nonmetallic atom group excluding a hydrogen atom is used, and preferred examples thereof include a halogen atom (F, Cl, Br, or I), a hydroxy group, an alkoxy group, an aryloxy group, an acyl group, an amide group, an ester group, an acyloxy group, a carboxy group, a carboxylic acid anion group, and a sulfonic acid anion group.

As specific examples of the alkoxy group in the substituent, a methoxy group, an ethoxy group, a propyloxy group, an isopropyloxy group, a butyloxy group, a pentyloxy group, a hexyloxy group, a dodecyloxy group, a stearyloxy group, a methoxyethoxy group, a poly(ethyleneoxy) group, and a poly(propyleneoxy) group, respectively having 1 to 40 carbon atoms, are preferable; and these groups respectively having 1 to 20 carbon atoms are more preferable. Examples of the aryloxy group include a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, and a naphthyloxy group, respectively having 6 to 18 carbon atoms. Examples of the acyl group include an acetyl group, a propanoyl group, a butanoyl group, a benzoyl group, and a naphthoyl group, respectively having 2 to 24 carbon atoms. Examples of the amide group include an acetamide group, a propionic acid amide group, a dodecanoic acid amide group, a palmitic acid amide group, a stearic acid amide group, a benzoic acid amide group, and a naphthoic acid amide group, respectively having 2 to 24 carbon atoms. Examples of the acyloxy group include an acetoxy group, a propanoyloxy group, a benzoyloxy group, and a naphthoyloxy group, respectively having 2 to 20 carbon atoms. Examples of the ester group include a methyl ester group, an ethyl ester group, a propyl ester group, a hexyl ester group, an octyl ester group, a dodecyl ester group, and a stearyl ester group, respectively having 1 to 24 carbon atoms. The substituent may be formed by combining two or more substituents described above.

$X^1$ represents a sulfonate group, a sulfate monoester group, a carboxylate group, or a phosphate group.

$Y^1$ represents a single bond, $-C_nH_{2n}-$, $-C_{n-m}H_{2(n-m)}OC_mH_{2m}-$, $-O-(CH_2CH_2O)_n-$, $-O-(CH_2CH_2CH_2O)_n-$, $-CO-NH-$, or a divalent linking group formed by combining two or more of these and satisfies the expressions of "$n \geq 1$" and "$n \geq m \geq 0$".

Among examples of the compound represented by Formula (I), from the viewpoint of scratch and stain resistance, a compound represented by Formula (I-A) or Formula (I-B) is preferable.

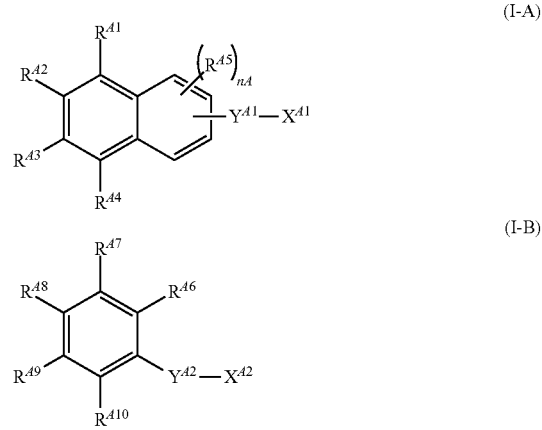

In Formulae (I-A) and (I-B), $R^{41}$ to $R^{410}$ each independently represent a hydrogen atom or an alkyl group, nA represents an integer of 1 to 3, $X^{41}$ and $X^{42}$ each independently represent a sulfonate group, a sulfate monoester group, a carboxylate group, or a phosphate group, and $Y^{41}$ and $Y^{42}$ each independently represent a single bond, $-C_nH_{2n}-$, $-C_{n-m}H_{2(n-m)}OC_mH_{2m}-$, $-O-(CH_2CH_2O)_n-$, $-O-(CH_2CH_2CH_2O)_n-$, $-CO-NH-$, or a divalent linking group formed by combining two or more of these and satisfy the inequations of "$n \geq 1$" and "$n \geq m \geq 0$". The total number of carbon atoms in $R^{41}$ to $R^{45}$ or $R^{46}$ to $R^{410}$ and $Y^{41}$ and $Y^{42}$ is 3 or greater.

The total number of carbon atoms in $R^{41}$ to $R^{45}$ and $Y^{14}$ or $R^{46}$ to $R^{410}$ and $Y^{42}$ in the compound represented by Formula (I-A) or (I-B) is preferably 25 or less and more preferably in a range of 4 to 20. The structure of the above-described alkyl group may be linear or branched.

It is preferable that $X^{41}$ and $X^{42}$ in the compound represented by Formula (I-A) or (I-B) represent a sulfonate group or a carboxylate group. Further, the salt structure in $X^{41}$ and $X^{42}$ is preferable from the viewpoint that the solubility of the alkali metal salt in a water-based solvent is particularly excellent. Among the salt structures, a sodium salt or a potassium salt is particularly preferable.

As the compound represented by Formula (I-A) or (I-B), the description in paragraphs 0019 to 0037 of JP2007-206348A can be referred to.

As the anionic surfactant, the compounds described in paragraphs 0023 to 0028 of JP2006-065321A can be suitably used.

The amphoteric surfactant used for the developer is not particularly limited, and examples thereof include an amine oxide-based surfactant such as alkyl dimethylamine oxide; a betaine-based surfactant such as alkyl betaine, fatty acid amide propyl betaine, or alkyl imidazole; and an amino acid-based surfactant such as sodium alkylamino fatty acid.

Particularly, alkyl dimethylamine oxide which may have a substituent, alkyl carboxy betaine which may have a substituent, or alkyl sulfobetaine which may have a substituent is preferably used. Specific examples of these include compounds represented by Formula (2) in paragraph 0256 of JP2008-203359A, compounds represented by Formulae (I), (II), and (VI) in paragraph 0028 of JP2008-276166A, and compounds described in paragraphs 0022 to 0029 of JP2009-047927A.

As the amphoteric ion-based surfactant used for the developer, a compound represented by formula (1) or a compound represented by Formula (2) is preferable.

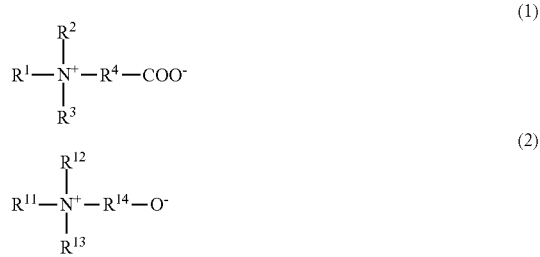

In Formulae (1) and (2), $R^1$ and $R^{11}$ each independently represent an alkyl group having 8 to 20 carbon atoms or an alkyl group that contains a linking group having 8 to 20 carbon atoms.

$R^2$, $R^3$, $R^{12}$, and $R^{13}$ each independently represent a hydrogen atom, an alkyl group, or a group containing an ethylene oxide structure.

$R^4$ and $R^{14}$ each independently represent a single bond or an alkylene group.

Further, two groups from among $R^1$, $R^2$, $R^3$, and $R^4$ may be bonded to each other to form a ring structure, and two groups from among $R^{11}$, $R^{12}$, $R^{13}$, and $R^{14}$ may be bonded to each other to form a ring structure.

In the compound represented by Formula (1) or the compound represented by Formula (2), the hydrophobic portion becomes bigger as the total number of carbon atoms increases, and the solubility in a water-based developer is decreased. In this case, the solubility is improved by mixing an organic solvent such as alcohol that assists dissolution with water as a dissolution assistant, but the surfactant cannot be dissolved within a proper mixing range in a case where the total number of carbon atoms becomes extremely large. Accordingly, the total number of carbon atoms of $R^1$ to $R^4$ or $R^{11}$ to $R^{14}$ is preferably in a range of 10 to 40 and more preferably in a range of 12 to 30.

The alkyl group containing a linking group represented by $R^1$ or $R^{11}$ has a structure in which a linking group is present between alkyl groups. In other words, in a case where one linking group is present, the structure can be represented by "-alkylene group-linking group-alkyl group". Examples of the linking group include an ester bond, a carbonyl bond, and an amide bond. The structure may have two or more linking groups, but it is preferable that the structure has one linking group, and an amide bond is particularly preferable as the linking group. The total number of carbon atoms of the alkylene group bonded to the linking group is preferably in a range of 1 to 5. The alkylene group may be linear or branched, but a linear alkylene group is preferable. The number of carbon atoms of the alkyl group bonded to the linking group is preferably in a range of 3 to 19, and the alkyl group may be linear or branched, but a linear alkyl group is preferable.

In a case where $R^2$ or $R^{12}$ represents an alkyl group, the number of carbon atoms thereof is preferably in a range of 1 to 5 and particularly preferably in a range of 1 to 3. The alkyl group may be linear or branched, but a linear alkyl group is preferable.

In a case where $R^3$ or $R^{13}$ represents an alkyl group, the number of carbon atoms thereof is preferably in a range of 1 to 5 and particularly preferably in a range of 1 to 3. The alkyl group may be linear or branched, but a linear alkyl group is preferable.

As the group containing an ethylene oxide structure represented by $R^3$ or $R^{13}$, a group represented by $-R^a(CH_2CH_2O)_nR^b$ is exemplified. Here, $R^a$ represents a single bond, an oxygen atom, or a divalent organic group (preferably having 10 or less carbon atoms), $R^b$ represents a hydrogen atom or an organic group (preferably having 10 or less carbon atoms), and n represents an integer of 1 to 10.

In a case where $R^4$ and $R^{14}$ represents an alkylene group, the number of carbon atoms thereof is preferably in a range of 1 to 5 and particularly preferably in a range of 1 to 3. The alkylene group may be linear or branched, but a linear alkylene group is preferable.

The compound represented by Formula (1) or the compound represented by Formula (2) has preferably an amide bond and more preferably an amide bond as a linking group represented by $R^1$ or $R^{11}$.

Representative examples of the compound represented by Formula (1) or the compound represented by Formula (2) are as follows, but the present disclosure is not limited thereto.

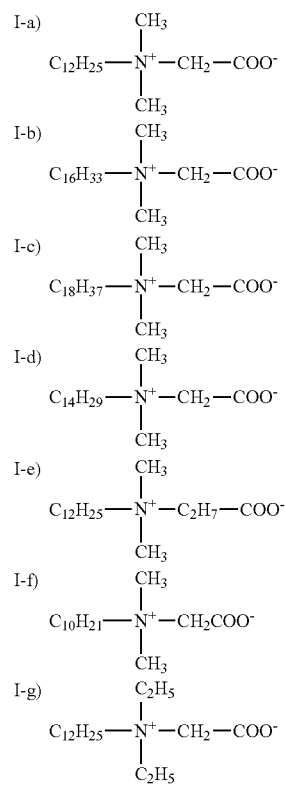

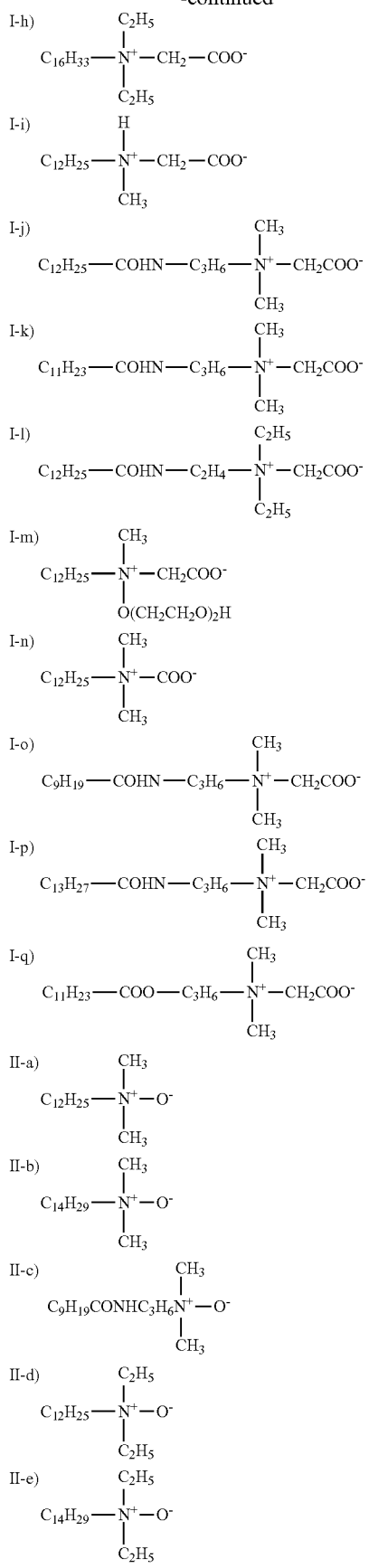

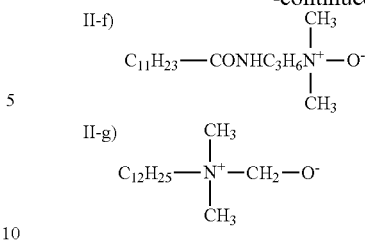

The compound represented by Formula (1) or (2) can be synthesized according to a known method. Further, commercially available products may be used. Examples of the commercially available products of the compound represented by Formula (1) include SOFRAZOLINE LPB, SOFTAZOLINE LPB-R, and VISTA MAP (manufactured by Kawaken Fine Chemicals Co., Ltd.), and TAKESAAF C-157L (manufactured by TAKEMOTO OIL & FAT Co., Ltd.). Examples of the commercially available products of the compound represented by Formula (2) include SOFTA-ZOLINE LAO (manufactured by Kawaken Fine Chemicals Co., Ltd.) and AMOGEN AOL (manufactured by DKS Co., Ltd.).

The amphoteric ion-based surfactant may be used alone or in combination of two or more kinds thereof in a developer.

Examples of non-ionic surfactant include polyoxyethylene alkyl ethers, polyoxyethylene alkyl phenyl ethers, polyoxyethylene polystyryl phenyl ether, glycerin fatty acid partial esters, sorbitan fatty acid partial esters, pentaerythritol fatty acid partial esters, propylene glycol monofatty acid ester, sucrose fatty acid partial ester, polyoxyethylene sorbitan fatty acid partial esters, polyoxyethylene sorbitol fatty acid partial esters, polyethylene glycol fatty acid esters, polyglycerin fatty acid partial esters, polyoxyethylene glycerin fatty acid partial esters, polyoxyethylene diglycerins, fatty acid diethanolamides, N,N-bis-2-hydroxyalkylamines, polyoxyethylene alkylamine, triethanolamine fatty acid ester, trialkylamine oxide, polyoxyethylene alkyl phenyl ethers, and polyoxyethylene-polyoxypropylene block copolymers.

Further, acetylene glycol-based and acetylene alcohol-based oxyethylene adducts, and fluorine-based surfactants can also be used. These surfactants can be used in combination of two or more kinds thereof.

Particularly preferred examples of the non-ionic surfactant include a non-ionic aromatic ether-based surfactant represented by Formula (N1).

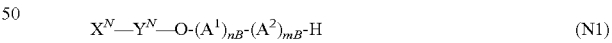

$$X^N-Y^N-O-(A^1)_{nB}-(A^2)_{mB}-H \qquad (N1)$$

In the formula, $X^N$ represents an aromatic group which may have a substituent, $Y^N$ represents a single bond or an alkylene group having 1 to 10 carbon atoms, $A^1$ and $A^2$ are different groups and represent any of —CH$_2$CH$_2$O— or —CH$_2$CH(CH$_3$)O—, nB and mB each independently represent an integer of 0 to 100, where both of nB and mB do not represent 0 at the same time. Further, both of nB and mB do not represent 1 at the same time in a case where any of nB or mB represents 0.

In the formula, examples of the aromatic group as $X^N$ include a phenyl group, a naphthyl group, and an anthranyl group. These aromatic groups may have a substituent. As the substituent, an organic group having 1 to 100 carbon atoms is exemplified. Further, in the formula, this may represent a random or block copolymer in a case where both of A and B are present.

Specific examples of the organic group having 1 to 100 carbon atoms include fatty acid hydrocarbon groups and aromatic hydrocarbon groups, which may be saturated or unsaturated and linear or branched, such as an alkyl group, an alkenyl group, an alkynyl group, an aryl group, an aralkyl group, an alkoxy group, an aryloxy group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an acylamino group, a N-alkylacylamino group, a N-arylacylamino group, an acyl group, an alkoxycarbonylamino group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, a polyoxyalkylene chain, and the above-described organic group to which a polyoxyalkylene chain is bonded. The alkyl group may be linear or branched.

Further, as the non-ionic surfactants, compounds described in paragraphs 0030 to 0040 of JP2006-065321A can also be suitably used.

The cationic surfactant is not particularly limited, and known surfactants of the related art can be used. Examples thereof include alkylamine salts, quaternary ammonium salts, alkylimidazolinium salts, polyoxyethylene alkylamine salts, and a polyethylene polyamine derivative.

The surfactant may be used alone or in combination of two or more kinds thereof.

The content of the surfactant is preferably in a range of 1% by mass to 25% by mass, more preferably in a range of 2% by mass to 20% by mass, still more preferably in a range of 3% by mass to 15% by mass, and particularly preferably in a range of 5% by mass to 10% by mass with respect to the total mass of the developer. In a case where the content thereof is in the above-described range, the scratch and stain resistance is excellent, the dispersibility of the development scum is excellent, and the ink impressing property of the lithographic printing plate to be obtained is excellent.

—Water-Soluble Polymer Compound—

From the viewpoints of adjusting the viscosity of the developer and protecting the plate surface of the lithographic printing plate to be obtained, the developer may contain a water-soluble polymer compound.

Examples of the water-soluble polymer compound which can be contained in the developer include soybean polysaccharides, modified starch, arabic gum, dextrin, a fiber derivative (such as carboxymethyl cellulose, carboxyethyl cellulose, or methyl cellulose) and a modified product thereof, pullulan, polyvinyl alcohol and a derivative thereof, polyvinylpyrrolidone, polyacrylamide and an acrylamide copolymer, a vinyl methyl ether/maleic anhydride copolymer, a vinyl acetate/maleic anhydride copolymer, and a styrene/maleic anhydride copolymer.

As the soybean polysaccharides, those which have been known in the related art can be used. For example, SOYA-FIBE (trade name, manufactured by FUJI OIL, CO., LTD.) can be used as a commercially available product, and various grades of products can be used. Preferred examples thereof include products in which the viscosity of a 10 mass % aqueous solution is in a range of 10 mPa·s to 100 mPa·s.

As the modified starch, starch represented by Formula (III) is preferable. Any of starch such as corn, potato, tapioca, rice, or wheat can be used as the starch represented by Formula (III). The modification of the starch can be performed according to a method of decomposing 5 to 30 glucose residues per one molecule with an acid or an enzyme and adding oxypropylene to an alkali.

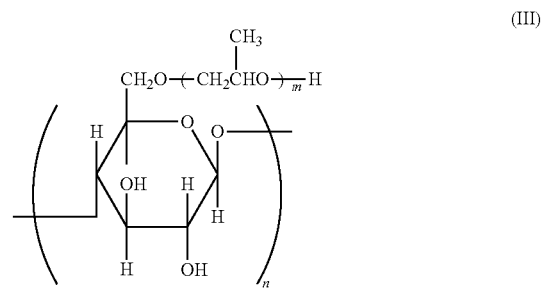

In the formula, the etherification degree (degree of substitution) is in a range of 0.05 to 1.2 per glucose unit, n represents an integer of 3 to 30, and m represents an integer of 1 to 3.

Among the examples of the water-soluble polymer compound, soybean polysaccharides, modified starch, arabic gum, dextrin, carboxymethyl cellulose, and polyvinyl alcohol are particularly preferable.

The water-soluble polymer compound can be used in combination of two or more kinds thereof.

In a case where the developer contains a water-soluble polymer compound, the content of the water-soluble polymer compound is preferably 3% by mass or less and more preferably 1% by mass or less with respect to the total mass of the developer. In a case where the content thereof is in the above-described range, the viscosity of the developer is moderate, and deposition of development scum and the like on a roller member of an automatic development treatment device can be suppressed.

—Other Additives—

The developer used in the present disclosure may contain a wetting agent, a preservative, a chelate compound, an antifoaming agent, an organic acid, an organic solvent, an inorganic acid, and an inorganic salt in addition to those described above.

Suitable examples of the wetting agent include ethylene glycol, propylene glycol, triethylene glycol, butylene glycol, hexylene glycol, diethylene glycol, dipropylene glycol, glycerin, trimethylolpropane, and diglycerin. The wetting agent may be used alone or in combination of two or more kinds thereof. The content of the wetting agent is preferably in a range of 0.1% by mass to 5% by mass with respect to the total mass of the developer.

Preferred examples of the preservative include phenol and a derivative thereof, formalin, an imidazole derivative, a sodium dehydroacetate, 4-isothiazoline-3-one derivative, benzoisothiazolin-3-one, 2-methyl-4-isothiazolin-3-one, a guanidine derivative, derivatives of quaternary ammonium salts, pyridine, quinoline, and guanidine, diazine, a triazole derivative, oxazole, an oxazole derivative, nitrobromo alcohol-based 2-bromo-2-nitropropane-1,3-diol, 1,1-dibromo-1-nitro-2-ethanol, and 1,1-dibromo-1-nitro-2-propane.

The amount of the preservative to be added is an amount of stably exhibiting the efficacy for bacterial, molds, yeasts, or the like, and is preferably in a range of 0.01% by mass to 4% by mass with respect to the total mass of the developer even though the amount thereof varies depending on the type of bacteria, molds, and the yeasts. Further, it is preferable that the preservative is used in combination of two or more kinds thereof so as to be effective for sterilizing various molds.

Examples of the chelate compound include ethylenediamine tetraacetic acid, a potassium salt thereof, and a sodium salt thereof; diethylenetriamine pentaacetic acid, a potassium salt thereof, and a sodium salt thereof; triethylenetetraminehexaacetic acid, a potassium salt thereof, and a sodium salt thereof; hydroxyethylethylenediamine triacetic acid, a potassium salt thereof, and a sodium salt thereof; nitrilotriacetic acid and a sodium salt thereof; and organic phosphonic acids such as 1-hydroxyethane-1,1-diphosphonic acid, a potassium salt thereof, and a sodium salt thereof; and aminotri(methylenephosphonic acid), a potassium salt, and a sodium salt thereof. A salt of an organic amine is effectively used in place of a sodium salt or a potassium salt of a chelating agent.

A chelating agent which is stably present in the composition of the treatment liquid and does not disturb the printability is preferable as the chelating agent. The content of the chelating agent is preferably in a range of 0.001% by mass to 1.0 by mass with respect to the total mass of the developer.

As the antifoaming agent, a typical silicone-based self-emulsifying type compound, an emulsifying type compound, a non-ionic compound having a hydrophilic-lipophilic balance (HLB) of 5 or less can be used. A silicone antifoaming agent is preferable.

Further, a silicone-based surfactant is regarded as an antifoaming agent.

The content of the antifoaming agent is suitably in a range of 0.001% by mass to 1.0% by mass with respect to the total mass of the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and organic phosphonic acid. The organic acid can be used in the form of an alkali metal salt or ammonium salt thereof. The content of the organic acid is preferably in a range of 0.01% by mass to 0.5% by mass with respect to the total mass of the developer.

Examples of the organic solvent include aliphatic hydrocarbons (hexane, heptane, "ISOPAR E, H, G" (manufactured by Exxon Chemical Japan Ltd.), and the like), aromatic hydrocarbons (toluene, xylene, and the like), halogenated hydrocarbon (methylene dichloride, ethylene dichloride, trichlene, monochlorobenzene, or the like), and a polar solvent.

Examples of the polar solvent include alcohols (such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, and methyl amyl alcohol), ketones (such as acetone, methyl ethyl ketone, ethyl butyl ketone, methyl isobutyl ketone, and cyclohexanone), esters (such as ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, and butyl levulinate), and others (such as triethyl phosphate, tricresyl phosphate, N-phenylethanolamine, and N-phenyldiethanolamine).

In a case where the organic solvent is insoluble in water, the organic solvent can be used by being solubilized in water using a surfactant or the like. In a case where the developer contains an organic solvent, from the viewpoints of safety and inflammability the concentration of the solvent in the developer is preferably less than 40% by mass.

Examples the inorganic acid and inorganic salt include phosphoric acid, methacrylic acid, primary ammonium phosphate, secondary ammonium phosphate, primary sodium phosphate, secondary sodium phosphate, primary potassium phosphate, secondary potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogensulfate, and nickel sulfate. The content of the inorganic salt is preferably in a range of 0.01% by mass to 0.5% by mass with respect to the total mass of the developer.

The developer is prepared by dissolving or dispersing each of the above-described components in water as necessary. The concentration of solid contents in the developer is preferably in a range of 2% by mass to 25% by mass. The developer can be used by preparing a concentrate and diluting the concentrate with water at the time of use.

It is preferable that the developer is an aqueous developer.

From the viewpoint of the dispersibility of the development scum, it is preferable that the developer contains an alcohol compound.

Examples of the alcohol compound include methanol, ethanol, propanol, isopropanol, and benzyl alcohol. Among these, benzyl alcohol is preferable.

From the viewpoint of the dispersibility of the development scum, the content of the alcohol compound is preferably in a range of 0.01% by mass to 5% by mass, more preferably in a range of 0.1% by mass to 2% by mass, and particularly preferably in a range of 0.2% by mass to 1% by mass with respect to the total mass of the developer.

[Printing Step]

The printing method of using the lithographic printing plate obtained according to the developer treatment system is not particularly limited, and the printing may be performed using a known method.

Examples thereof include a method of performing printing by supplying ink and dampening water as necessary to the lithographic printing plate.

The lithographic printing method according to the present disclosure may include known steps other than the above-described steps. Examples of other steps include a plate inspection step of confirming the orientation or position of the lithographic printing plate precursor before each step and a confirmation step of confirming the printed image after the development treatment step.

EXAMPLES

Hereinafter, the present disclosure will be described in detail with reference to examples, but the present disclosure is not limited thereto. In the present examples, "%" and "part" respectively indicate "% by mass" and "part by mass" unless otherwise specified. Further, in a polymer compound, the molecular weight indicates the weight-average molecular mass (Mw) and the proportion of repeating constitutional units indicates mole percentage unless otherwise specified. Further, the weight-average molecular weight (Mw) is a value in terms of polystyrene obtained by performing measurement using gel permeation chromatography (GPC).

<Preparation of Supports 1 and 4 to 6>

As roughening treatments, the following (a) to (e) treatments were performed. Further, a washing treatment was performed between all treatment steps.

(a) Alkali Etching Treatment

An aluminum plate (material JIS 1052) having a thickness of 0.3 mm was subjected to an etching treatment by spraying an aqueous solution at a temperature of 60° C. in which the concentration of caustic soda was 25% by mass and the concentration of aluminum ions was 100 g/L using a spray tube. The etching amount of the surface of the aluminum plate to be subjected to an electrochemical roughening treatment was 3 g/m$^2$.

(b) Desmutting Treatment

Next, a desmutting treatment was performed by spraying a sulfuric acid aqueous solution (concentration of 300 g/L) at a temperature of 35° C. for 5 seconds from the spray tube.

(c) Electrolytic Roughening Treatment

Thereafter, an electrochemical roughening treatment was continuously performed using an electrolytic solution (liquid temperature of 35° C.) obtained by dissolving aluminum chloride in a 1 mass % hydrochloric acid aqueous solution and adjusting the aluminum ion concentration to 4.5 g/L, a 60 Hz AC power source, and a flat cell type electrolytic cell. A sine wave was used as the waveform of the AC power source. In the electrochemical roughening treatment, the current density of the aluminum plate during the anodic reaction at the peak of the alternating current was 30 A/dm$^2$. The ratio between the total electric quantity during the anodic reaction and the total electric quantity during the cathodic reaction of the aluminum plate was 0.95. The electric quantity was set to 480 C/dm$^2$ in terms of the total electric quantity during the anodic reaction of the aluminum plate. The electrolytic solution was circulated using a pump so that the stirring inside the electrolytic cell was performed.

(d) Alkali Etching Treatment

The aluminum plate was subjected to an etching treatment by spraying an aqueous solution at a temperature of 35° C. in which the concentration of caustic soda was 5% by mass and the concentration of aluminum ions was 5 g/L using a spray tube. The etching amount of the surface of the aluminum plate on which the electrolytic roughening treatment had been performed was 0.05 g/m$^2$.

(e) Desmutting Treatment

Next, a desmutting treatment was performed by spraying an aqueous solution at a liquid temperature of 35° C. with a sulfuric acid concentration of 300 g/L and an aluminum ion concentration of 5 g/L from the spray tube for 5 seconds.

The aluminum plate on which the roughening treatment had been performed was subjected to an anodization treatment at a treatment temperature of 38° C. and a current density of 15 A/dm$^2$ using a 22 mass % phosphoric acid aqueous solution as an electrolytic solution.

Thereafter, the aluminum plate was washed with water using a spray. The final amount of the oxide film was 1.5 g/m$^2$. The surface of the substrate was imaged at a magnification of 150000 using an electronic microscope and the average pore diameter in a case of n=90 was actually measured, and the value was 30 nm.

A support 1 is a support used after 10 days from the anodization treatment performed on the obtained support.

A support 4 is a support used after 1 day from the anodization treatment performed on the obtained support.

A support 5 is a support used after 3 days from the anodization treatment performed on the obtained support.

A support 6 is a support used after 1 hour from the anodization treatment performed on the obtained support.

<Preparation of Support 2>

An aluminum alloy plate having a thickness of 0.3 mm and having a composition listed in Table 1 was subjected to the following treatments (a) to (m), whereby a support 2 was prepared. Moreover, during all treatment steps, a washing treatment was performed, and liquid cutting was performed using a nip roller after the washing treatment.

A support 2 is a support used after 10 days from the anodization treatment performed on the obtained support.

TABLE 1

| Composition (% by mass) | | | | | | | |
|---|---|---|---|---|---|---|---|
| Si | Fe | Cu | Mn | Mg | Zn | Ti | Al |
| 0.085 | 0.303 | 0.037 | 0 | 0 | 0 | 0.018 | Remainder |

(a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The mechanical roughening treatment was performed under conditions in which the median diameter of a polishing material pumice was 30 μm, the number of the bundle bristle brushes was four, and the rotation speed of the bundle bristle brushes was set to 250 rpm. The material of the bundle bristle brushes was nylon 6.10, the diameter of the brush bristles was 0.3 mm, and the bristle length was 50 mm. The bundle bristle brushes were produced by implanting bristles densely into the holes in a stainless steel cylinder having a diameter of 300 mm. The distance between two support rollers (with a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the bundle bristle brushes was the same as the moving direction of the aluminum plate.

(b) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(c) Desmutting Treatment in Acidic Aqueous Solution

Next, a desmutting treatment was performed in a nitric acid aqueous solution. As the nitric acid aqueous solution used in the desmutting treatment, a nitric acid electrolytic solution used in electrochemical roughening of the subsequent step was used. The liquid temperature was 35° C. The desmutting treatment was performed for 3 seconds by spraying the desmutting liquid using a spray.

(d) Electrochemical Roughening Treatment

An electrochemical roughening treatment was continuously performed using an AC voltage of 60 Hz. An electrolytic solution which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. The current density was 30 A/dm$^2$ in terms of the peak current value, and 5% of the current from the power source was separately flowed to the auxiliary anode. The electric quantity was 185 C/dm$^2$ as the total electric quantity at the time of anodization of the aluminum plate. Thereafter, washing with water by spraying was performed.

(e) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 60° C. The desmutting treatment was performed for 3 seconds by spraying the desmutting liquid using a spray.

(g) Electrochemical Roughening Treatment

An electrochemical roughening treatment was continuously performed using an AC voltage of 60 Hz. An electrolytic solution which had been adjusted to have a concentration of aluminum ions of 4.5 g/L by adding aluminum chloride to an aqueous solution having a concentration hydrochloric acid of 6.2 g/L at a liquid temperature of 35° C. was used. Using a trapezoidal rectangular waveform AC having a time tp, until the current value reached a peak from zero, of 0.8 msec and the duty ratio of 1:1, the electrochemical roughening treatment was performed using a carbon electrode as a counter electrode. As an auxiliary anode, ferrite was used. The current density was 25 A/dm$^2$ in terms of the peak current value, and the electric quantity in the hydrochloric acid electrolysis was 63 C/dm$^2$ as the total electric quantity at the time of anodization of the aluminum plate. Thereafter, washing with water by spraying was performed.

(h) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(i) Desmutting Treatment in Acidic Aqueous Solution

Next, a desmutting treatment was performed in a sulfuric acid aqueous solution. The desmutting treatment was performed at a liquid temperature of 35° C. for 4 seconds using the sulfuric acid aqueous solution (aluminum ions having a concentration of 5 g/L were contained in a sulfuric acid aqueous solution having a concentration of 170 g/L) used for the anodization treatment step. The desmutting treatment was performed for 3 seconds by spraying the desmutting liquid using a spray.

(j) First Anodization Treatment

A first step of an anodization treatment was performed with an anodizing device using DC electrolysis. An anodized film having a predetermined film thickness was formed by performing an anodization treatment under conditions listed in Table 2. An aqueous solution containing components listed in Table 2 was used as the electrolytic solution. In Tables 2 to 4, the "component concentration" indicates the concentration (g/L) of each component described in the section of "liquid component".

TABLE 2

| | | First anodization treatment | | | | |
|---|---|---|---|---|---|---|
| Liquid type | Liquid component | Component concentration (g/L) | Temperature (° C.) | Current density (A/dm$^2$) | Time (s) | Film thickness (nm) |
| Sulfuric acid | H$_2$SO$_4$/Al | 170/5 | 55 | 90 | 0.40 | 110 |

(k) Second Anodization Treatment

A second step of an anodization treatment was performed with an anodizing device using DC electrolysis. An anodized film having a predetermined film thickness was formed by performing an anodization treatment under conditions listed in Table 3. An aqueous solution containing components listed in Table 3 was used as the electrolytic solution.

TABLE 3

| | | Second anodization treatment | | | | |
|---|---|---|---|---|---|---|
| Liquid type | Liquid component | Component concentration (g/L) | Temperature (° C.) | Current density (A/dm$^2$) | Time (s) | Film thickness (nm) |
| Sulfuric acid | H$_2$SO$_4$/Al | 170/5 | 54 | 15 | 13 | 900 |

(l) Third Anodization Treatment

A third step of an anodization treatment was performed with an anodizing device using DC electrolysis. An anodized film having a predetermined film thickness was formed by performing an anodization treatment under conditions listed in Table 4. An aqueous solution containing components listed in Table 4 was used as the electrolytic solution.

TABLE 4

| | | Third anodization treatment | | | | |
|---|---|---|---|---|---|---|
| Liquid type | Liquid component | Component concentration (g/L) | Temperature (° C.) | Current density (A/dm$^2$) | Time (s) | Film thickness (nm) |
| Sulfuric acid | H$_2$SO$_4$/Al | 170/5 | 54 | 50 | 0.4 | 100 |

(m) Hydrophilization Treatment

In order to ensure hydrophilicity of a non-image area, the non-image area was subjected to a silicate treatment by being dipped using 2.5% by mass of a No. 3 sodium silicate aqueous solution at 50° C. for 7 seconds. The adhesion amount of Si was 8.5 mg/m$^2$. Thereafter, the resultant was washed with water using a spray.

The average diameter (average diameter of surface layer) of large-diameter pores on the surface of the anodized film having micropores obtained in the above-described manner, the average diameter (average diameter of bottom portion) of the large-diameter pores in a communication position, the average diameter (diameter of small-diameter pores) of small-diameter pores in the communication position, the average depth of the large-diameter pores and the small-diameter pores, the thickness (thickness of barrier layer) of the anodized film from the bottom portion of the small-diameter pores to the surface of the aluminum plate, and the density of the small-diameter pores are listed in Tables 5 and 6. The small-diameter pores include first small-diameter pores and second small-diameter pores with depths different from each other and small-diameter pores which are deeper than the other are referred to as the

TABLE 5

| Micropores Large-diameter pores | | | | | |
|---|---|---|---|---|---|
| Average diameter of surface layer (nm) | Average diameter of bottom portion (nm) | Average depth (nm) | Average depth/ Average diameter of surface layer | Average depth/ Average diameter of bottom portion | Shape |
| 12 | 25 | 98 | 8.2 | 3.9 | Inverted taper |

TABLE 6

| Micropores | | | | | | | |
|---|---|---|---|---|---|---|---|
| Small-diameter pores | | | | | | | |
| Average diameter (nm) | Average depth (nm) | Density of communication portion (portions/μm²) | Average thickness of barrier layer (nm) | Minimum thickness of barrier layer (nm) | Density of micropores (pores/μm²) | Increase magnification of surface area | Ratio (average diameter of surface layer/diameter of small-diameter pores) |
| 9.8 | 888, 968 | 800 (650) | 17 | 16 | 500 | 4.0 | 1.22 |

In Table 6, the average value and the minimum value are shown as the barrier layer thickness. The average value is obtained by measuring 50 thicknesses of the anodized film from the bottom portion of the first small-diameter pores to the surface of the aluminum plate and arithmetically averaging the values.

The average diameter of micropores (average diameter of the large-diameter pores and the small-diameter pores) is a value obtained by observing four sheets (N=4) of the surfaces of the large-diameter pores and the surfaces of the small-diameter pores using a field emission scanning electron microscope (FE-SEM) at a magnification of 150,000, measuring the diameters of micropores (the large-diameter pores and the small-diameter pores) present in a range of 400×600 nm² in the obtained four sheets of images, and averaging the values. Further, in a case where the depth of the large-diameter pores is deep and the diameter of the small-diameter pores is unlikely to be measured, the upper portion of the anodized film is cut and then various kinds of diameters are acquired.

The average depth of the large-diameter pores is a value obtained by observing the cross section of the support (anodized film) using FE-TEM at a magnification of 500,000, measuring 60 cases (N=60) of distances from the surface of an arbitrary micropore to the communication position in the obtained image, and averaging the values. Further, the average depth of the small-diameter pores is a value obtained by observing the cross section of the support (anodized film) using FE-SEM (at a magnification of 50,000), measuring 25 cases of depths of arbitrary micropores in the obtained image, and averaging the values.

The "density of the communication portion" indicates the density of the small-diameter pores of the cross section of the anodized film in the communication position. The "increase magnification of the surface area" indicates the value calculated based on the following Equation (A).

$$\text{Increase magnification of surface area} = 1 + \text{pore density} \times (\pi \times (\text{average diameter of surface layer}/2 + \text{average diameter of bottom portion}/2) \times ((\text{average diameter of bottom portion}/2 - \text{average diameter of surface layer}/2)^2 + \text{depth } A^2)^{1/2} + \pi \times (\text{average diameter of bottom portion}/2)^2 - \pi \times (\text{average diameter of surface layer}/2)^2)) \quad \text{Equation (A)}$$

In the column of the "average depth (nm)" of the small-diameter pores, the average depth of the second small-diameter pores is shown on the left side and the average depth of the first small-diameter pores is shown on the right side. In the column of the "density of communication portion" of the small-diameter pores in Table E, the density of the first small-diameter pores is shown in the parentheses together with the density of the communication portion of the small-diameter pores.

In addition, the average diameter of the first small-diameter pores positioning from the bottom portion of the second small-diameter pores to the bottom portion of the first small-diameter pores was approximately 12 nm.

<Preparation of Support 3>

An aluminum plate having a thickness of 0.19 mm was immersed in a 40 g/L sodium hydroxide aqueous solution at 60° C. for 8 seconds so as to be degreased and then washed with demineralized water for 2 seconds. Next, the aluminum plate was subjected to an electrochemical roughening treatment in an aqueous solution containing 12 g/L of hydrochloric acid and 38 g/L of aluminum sulfate (18 hydrate) at a temperature of 33° C. and at a current density of 130 A/dm² using an AC for 15 seconds. Next, the aluminum plate was washed with demineralized water for 2 seconds, subjected to a desmutting treatment by being etched using 155 g/L of a sulfuric acid aqueous solution at 70° C. for 4 seconds, and washed with demineralized water at 25° C. for 2 seconds. The aluminum plate was subjected to an anodization treatment in 155 g/L of a sulfuric acid aqueous solution for 13 seconds at a temperature of 45° C. and at a current density of 22 A/dm² and washed with demineralized water for 2 seconds. Further, the aluminum plate was treated at 40° C. for 10 seconds using 4 g/L of a polyvinyl phosphonic acid aqueous solution, washed with demineralized water at 20° C. for 2 seconds, and then dried, thereby preparing a support 3. The surface roughness Ra of the support 3 was 0.21 µm and the amount of the anodized film was 4 g/m².

The support 3 is a support used after 10 days from the anodization treatment performed on the obtained support.

<Preparation of Supports 7 to 13>

An aluminum plate (aluminum alloy plate, material 1S) having a thickness of 0.3 mm was subjected to any of the following treatments, thereby producing an aluminum support. Moreover, during all treatment steps, a washing treatment was performed, and liquid cutting was performed using a nip roller after the washing treatment.

<Treatment A: Preparation of Support 7>

(A-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m².

(A-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 150 g/L was used. The liquid temperature was 30° C.

(A-c) Electrochemical Roughening Treatment Using Hydrochloric Acid Aqueous Solution Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm² in terms of the peak current value of the AC current waveform. Further, the total electric quantity of the aluminum plate used for the anodic reaction was 450 C/dm², and the electrolytic treatment was performed four times at energization intervals of 4 seconds for each of the electric quantity of 112.5 C/dm². A carbon electrode was used as a counter electrode of the aluminum plate. Thereafter, a washing treatment was performed.

(A-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. Thereafter, washing with water by spraying was performed. The amount of aluminum to be dissolved in the surface after being subjected to an electrochemical roughening treatment was 0.2 g/m².

(A-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, a waste liquid generated in the anodization treatment step (an aqueous solution having a sulfuric acid concentration of 170 g/L and an aluminum ion concentration of 5 g/L) was used. The liquid temperature was 30° C.

(A-f) Anodization Treatment

Figure 3:
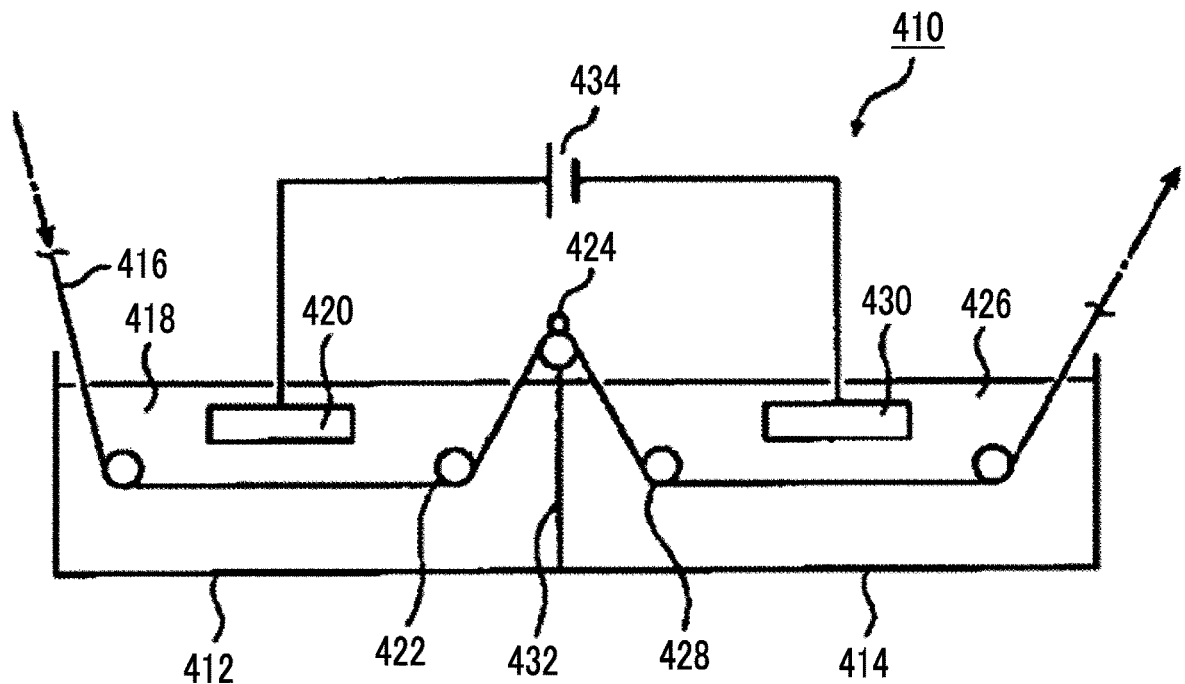
FIG. 3 is a schematic view illustrating an anodization treatment device used for an anodization treatment.

An anodization treatment was performed with an anodizing device using DC electrolysis illustrated in FIG. 3. An anodized film having a predetermined coating amount was formed by performing an anodization treatment under conditions in the columns of "first anodization treatment" listed in Table 2.

An aluminum plate 416 in an anodization treatment device 410 illustrated in FIG. 3 is transported as indicated by the arrow in FIG. 3. The aluminum plate 416 is positively (+) charged by a power supply electrode 420 in a power supply tank 412 in which an electrolytic solution 418 is stored. Further, the aluminum plate 416 is transported upward by a roller 422 in the power supply tank 412, redirected downward by a nip roller 424, transported toward an electrolytic treatment tank 414 in which an electrolytic solution 426 was stored, and redirected to the horizontal direction by a roller 428. Next, the aluminum plate 416 is negatively (−) charged by an electrolytic electrode 430 so that an anodized film is formed on the surface thereof, and the aluminum plate 416 coming out of the electrolytic treatment tank 414 is transported to the next step. In the anodization treatment device 410, direction changing means is formed of the roller 422, the nip roller 424, and the roller 428. The aluminum plate 416 is transported in a mountain shape and an inverted U shape by the roller 422, the nip roller 424, and the roller 428 in an inter-tank portion between the power supply tank 412 and the electrolytic treatment tank 414. The power supply electrode 420 and the electrolytic electrode 430 are connected to a DC power source 434.

(A-g) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature listed in Table 7 under a time condition listed in Table 7. Thereafter, washing with water by spraying was performed.

<Treatment (B): Preparation of Support 8>

(B-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m².

(B-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 150 g/L was used. The liquid temperature was 30° C.

(B-c) Electrochemical Roughening Treatment Using Hydrochloric Acid Aqueous Solution.

Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate. Thereafter, a washing treatment with water was performed.

(B-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. Thereafter, washing with water by spraying was performed. The amount of aluminum to be dissolved in the surface after being subjected to an electrochemical roughening treatment was 0.2 g/m$^2$.

(B-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, a waste liquid generated in the anodization treatment step (an aqueous solution having a sulfuric acid concentration of 170 g/L and an aluminum ion concentration of 5 g/L) was used. The liquid temperature was 30° C.

(B-f) First Stage Anodization Treatment

A first stage anodization treatment was performed with an anodizing device using DC electrolysis and having a structure illustrated in FIG. 3. An anodized film having a predetermined coating amount was formed by performing an anodization treatment under conditions in the columns of "first anodization treatment" listed in Table 2.

(B-g) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature of 40° C. under a time condition listed in Table 7. Thereafter, washing with water by spraying was performed.

(B-h) Second Stage Anodization Treatment

A second stage anodization treatment was performed with an anodizing device using DC electrolysis and having a structure illustrated in FIG. 3. An anodized film having a predetermined coating amount was formed by performing an anodization treatment under conditions in the columns of "second anodization treatment" listed in Table 3.

<Treatment D: Preparation of Support 9>

(D-a) Mechanical Roughening Treatment (Brush Grain Method)

Figure 5:
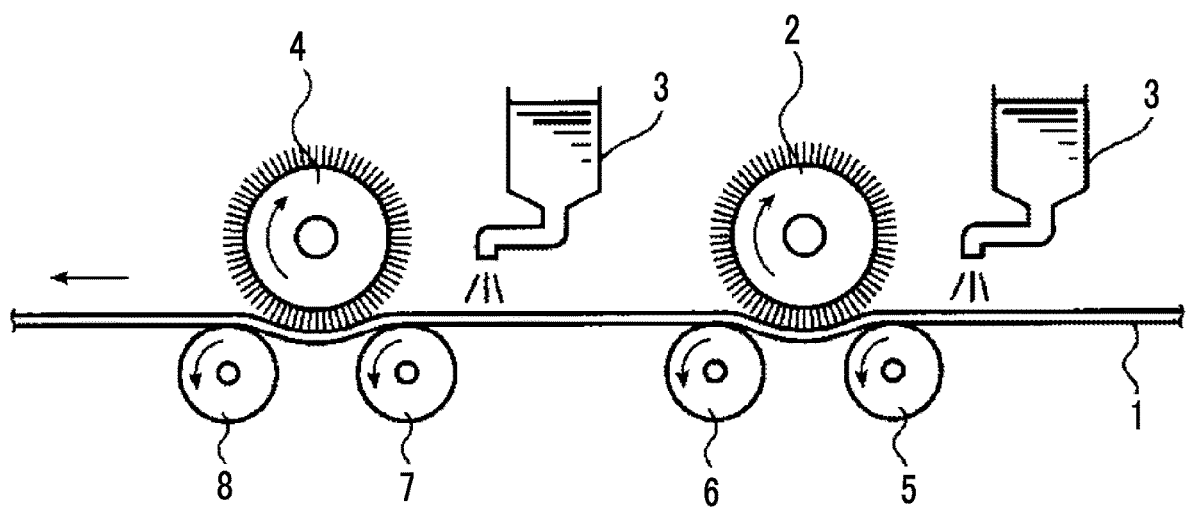
FIG. 5 is a side view illustrating the concept of a brush graining step used for a mechanical roughening treatment in the preparation of an aluminum support.

While supplying a suspension of pumice (specific gravity of 1.1 g/cm$^3$) to the surface of an aluminum plate as a polishing slurry liquid using a device illustrated in FIG. 5, a mechanical roughening treatment was performed using rotating bundle bristle brushes. In FIG. 5, the reference numeral 1 represents an aluminum plate, the reference numerals 2 and 4 represent roller-like brushes (in the present examples, bundle bristle brushes), the reference numeral 3 represents a polishing slurry liquid, and the reference numerals 5, 6, 7, and 8 represent a support roller.

The mechanical roughening treatment is performed under conditions in which the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having a diameter of 300 mm. The distance between two support rollers (a diameter of 200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(D-b) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 10 g/m$^2$.

(D-c) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, a waste liquid of nitric acid used for the subsequent electrochemical roughening treatment step was used. The liquid temperature was 35° C.

(D-d) Electrochemical Roughening Treatment Using Nitric Acid Aqueous Solution

An electrochemical roughening treatment was continuously performed using an AC voltage of 60 Hz in nitric acid electrolysis. As an electrolytic solution at this time, an electrolytic solution which had been adjusted to have a concentration of aluminum ions of 4.5 g/L by adding aluminum nitrate to a nitric acid aqueous solution having a concentration of 10.4 g/L at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 30 A/dm$^2$ in terms of the peak current value, and 5% of the current from the power source was separately flowed to the auxiliary anode. The electric quantity (C/dm$^2$) was 185 C/dm$^2$ as the total electric quantity at the time of anodization of the aluminum plate.

(D-e) Alkali Etching Treatment

The aluminum plate obtained in the above-described manner was subjected to an etching treatment by spraying a caustic soda aqueous solution in which the concentration of caustic soda was 27% by mass and the concentration of aluminum ions was 2.5% by mass using a spray tube at a temperature of 50° C. Thereafter, washing with water by spraying was performed. The amount of aluminum dissolved was 3.5 g/m$^2$.

(D-f) Desmutting Treatment in Acidic Aqueous Solution

Next, a desmutting treatment was performed in a sulfuric acid aqueous solution. Specifically, the desmutting treatment was performed by spraying the sulfuric acid aqueous solution to the aluminum plate for 3 seconds using a spray. As the sulfuric acid aqueous solution used for the desmutting treatment, an aqueous solution having a sulfuric acid concentration of 170 g/L and an aluminum ion concentration of 5 g/L was used. The liquid temperature was 30° C.

(D-g) Electrochemical Roughening Treatment Using Hydrochloric Acid Aqueous Solution An electrochemical roughening treatment was continuously performed using an AC voltage of 60 Hz in hydrochloric acid electrolysis. As an electrolytic solution, an electrolytic solution which had been adjusted to have a concentration of aluminum ions of 4.5 g/L by adding aluminum chloride to an aqueous solution having 6.2 g/L of hydrochloric acid at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 25 A/dm$^2$ in terms of the peak current value, and the electric quantity (C/dm$^2$) in the hydrochloric acid electrolysis was 63 C/dm$^2$ as the total electric quantity at the time of anodization of the aluminum plate. Thereafter, washing with water was performed using a spray.

(D-h) Alkali Etching Treatment

The aluminum plate obtained in the above-described manner was subjected to an etching treatment by spraying a caustic soda aqueous solution in which the concentration of caustic soda was 5% by mass and the concentration of aluminum ions was 0.5% by mass using a spray at a temperature of 60° C. Thereafter, washing with water by spraying was performed. The amount of aluminum to be dissolved was 0.2 g/m$^2$.

(D-i) Desmutting Treatment Using Acidic Aqueous Solution

Next, a desmutting treatment was performed using a sulfuric acid aqueous solution. Specifically, the desmutting treatment was performed by spraying the sulfuric acid aqueous solution to the aluminum plate for 4 seconds using a spray. As the sulfuric acid aqueous solution used for the desmutting treatment, a waste liquid generated in the anodization treatment step (an aqueous solution having a sulfuric acid concentration of 170 g/L and an aluminum ion concentration of 5 g/L) was used. The liquid temperature was 35° C.

(D-j) Anodization Treatment

An anodization treatment was performed with an anodizing device using DC electrolysis and having a structure illustrated in FIG. 3. An anodized film having a predetermined coating amount was formed by performing an anodization treatment under conditions in the columns of "first anodization treatment" listed in Table 2.

(D-k) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature of 40° C. for 3 seconds. Thereafter, washing with water by spraying was performed.

(D-l) Hydrophilization Treatment

In order to ensure hydrophilicity of a non-image area, a silicate treatment was performed by dipping the aluminum plate obtained using 2.5% by mass of a No. 3 sodium silicate aqueous solution at 50° C. for 7 seconds. The adhesion amount of Si was 8.5 mg/m$^2$. Thereafter, the resultant was washed with water using a spray.

<Treatment (F): Preparation of Support 10>

(F-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m$^2$.

(F-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having 150 g/L of sulfuric acid was used. The liquid temperature was 30° C.

(F-c) Electrochemical Roughening Treatment

Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate. Thereafter, a washing treatment was performed.

(F-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. The amount of aluminum to be dissolved in the surface after being subjected to an electrochemical roughening treatment was 0.2 g/m². Thereafter, a washing treatment was performed.

(F-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 170 g/L and an aluminum ion concentration of 5 g/L was used. The liquid temperature was 35° C.

(F-f) First Stage Anodization Treatment

A first stage anodization treatment was performed with an anodizing device using DC electrolysis and having a structure illustrated in FIG. 3. An anodized film having a predetermined coating amount was formed by performing an anodization treatment under conditions in the columns of "first anodization treatment" listed in Table 2.

(F-g) Second Stage Anodization Treatment

A second stage anodization treatment was performed with an anodizing device using DC electrolysis and having a structure illustrated in FIG. 3. An anodized film having a predetermined coating amount was formed by performing an anodization treatment under conditions in the columns of "second anodization treatment" listed in Table 3.

<Treatment (G): Preparation of Support 11>

(G-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m².

(G-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having 150 g/L of sulfuric acid was used. The liquid temperature was 30° C.

(G-c) Electrochemical Roughening Treatment

Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm² in terms of the peak current value of the AC current waveform. Further, the total electric quantity of the aluminum plate used for the anodic reaction was 450 C/dm², and the electrolytic treatment was performed four times at energization intervals of 4 seconds for each of the electric quantity of 112.5 C/dm². A carbon electrode was used as a counter electrode of the aluminum plate. Thereafter, a washing treatment was performed.

(G-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. The amount of aluminum to be dissolved in the surface after being subjected to an electrochemical roughening treatment was 0.2 g/m². Thereafter, a washing treatment was performed.

(G-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 170 g/L and an aluminum ion concentration of 5 g/L was used. The liquid temperature was 35° C.

(G-f) First Stage Anodization Treatment

A first stage anodization treatment was performed with an anodizing device using DC electrolysis and having a structure illustrated in FIG. 3. An anodized film having a predetermined coating amount was formed by performing an anodization treatment under conditions in the columns of "first anodization treatment" listed in Table 2.

(G-g) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature of 40° C. under a time condition listed in Table 7. Thereafter, washing with water by spraying was performed.

(G-h) Second Stage Anodization Treatment

A second stage anodization treatment was performed with an anodizing device using DC electrolysis and having a structure illustrated in FIG. 3. An anodized film having a predetermined coating amount was formed by performing an anodization treatment under conditions in the columns of "second anodization treatment" listed in Table 3.

<Treatment (H): Preparation of Support 12>

(H-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m².

(H-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having 150 g/L of sulfuric acid was used. The liquid temperature was 30° C.

(H-c) Electrochemical Roughening Treatment

Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate. Thereafter, a washing treatment was performed.

(H-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. The amount of aluminum to be dissolved in the surface after being subjected to an electrochemical roughening treatment was 0.2 g/m$^2$. Thereafter, a washing treatment was performed.

(H-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 170 g/L and an aluminum ion concentration of 5 g/L was used. The liquid temperature was 35° C.

(H-f) First Stage Anodization Treatment

A first stage anodization treatment was performed with an anodizing device using DC electrolysis and having a structure illustrated in FIG. 3. An anodized film having a predetermined coating amount was formed by performing an anodization treatment under conditions in the columns of "first anodization treatment" listed in Table 2.

(H-g) Second Stage Anodization Treatment

A second stage anodization treatment was performed with an anodizing device using DC electrolysis and having a structure illustrated in FIG. 3. An anodized film having a predetermined coating amount was formed by performing an anodization treatment under conditions in the columns of "second anodization treatment" listed in Table 3.

<Treatment (I): Preparation of Support 13>

(I-a) Alkali Etching Treatment

An aluminum plate was subjected to an etching treatment by spraying a caustic soda aqueous solution in which the concentration of caustic soda was 26% by mass and the concentration of aluminum ions was 6.5% by mass using a spray at a temperature of 70° C. Thereafter, washing with water by spraying was performed. The amount of aluminum to be dissolved in the surface to be subsequently subjected to an electrochemical roughening treatment was 5 g/m$^2$.

(I-b) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having 150 g/L of sulfuric acid was used. The liquid temperature was 30° C.

(I-c) Electrochemical Roughening Treatment

Next, an electrochemical roughening treatment was performed using the AC current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the AC current was a sine wave in which the positive and negative waveforms were symmetrical, the frequency was 50 Hz, the ratio between the anodic reaction time and the cathodic reaction time in one cycle of the AC current was 1:1, and the current density was 75 A/dm$^2$ in terms of the peak current value of the AC current waveform. Further, the total electric quantity of the aluminum plate used for the anodic reaction was 450 C/dm$^2$, and the electrolytic treatment was performed four times at energization intervals of 4 seconds for each of the electric quantity of 112.5 C/dm$^2$. A carbon electrode was used as a counter electrode of the aluminum plate. Thereafter, a washing treatment was performed.

(I-d) Alkali Etching Treatment

The aluminum plate after being subjected to an electrochemical roughening treatment was subjected to an etching treatment by spraying a caustic soda aqueous solution in which the concentration of caustic soda was 5% by mass and the concentration of aluminum ions was 0.5% by mass using a spray at a temperature of 45° C. The amount of aluminum to be dissolved in the surface after being subjected to an electrochemical roughening treatment was 0.2 g/m$^2$. Thereafter, a washing treatment was performed.

(I-e) Desmutting Treatment Using Acidic Aqueous Solution

Next, a desmutting treatment was performed using an acidic aqueous solution. Specifically, the desmutting treatment was performed by spraying the acidic aqueous solution to the aluminum plate for 3 seconds using a spray. As the acidic aqueous solution used for the desmutting treatment, an aqueous solution having a sulfuric acid concentration of 170 g/L and an aluminum ion concentration of 5 g/L was used. The liquid temperature was 35° C.

(I-f) First Stage Anodization Treatment

A first stage anodization treatment was performed with an anodizing device using DC electrolysis and having a structure illustrated in FIG. 3. An anodized film having a predetermined coating amount was formed by performing an anodization treatment under conditions in the columns of "first anodization treatment" listed in Table 2.

(I-g) Pore Widening Treatment

The aluminum plate after being subjected to the anodization treatment was subjected to a pore widening treatment by being immersed in a caustic soda aqueous solution in which the concentration of caustic soda was 5% by mass and the concentration of aluminum ions was 0.5% by mass at a temperature of 40° C. under a time condition listed in Table 1. Thereafter, washing with water by spraying was performed.

(I-h) Second Stage Anodization Treatment

A second stage anodization treatment was performed with an anodizing device using DC electrolysis and having a structure illustrated in FIG. 3. An anodized film having a predetermined coating amount was formed by performing an anodization treatment under conditions in the columns of "second anodization treatment" listed in Table 3.

The average diameters in the surface of the anodized film obtained in the above-described manner on a side opposite to a side of the aluminum plate are collectively listed in Table 7.

The average diameter of micropores is calculated by observing four sheets (N=4) of the surfaces of the anodized film using FE-SEM at a magnification of 150000, measuring the diameters of micropores present in a range of 400 nm×600 nm² in the obtained four sheets of images, and averaging the values.

Further, in a case where the shape of the micropores is not circular, an equivalent circle diameter is used. The "equivalent circle diameter" is a diameter of a circle obtained by assuming the shape of an opening portion of a micropore as a circle having the same projected area as the projected area of the opening portion.

<Formation of Undercoat Layer>

The other surface of the support was coated with an undercoat layer coating solution (1) having the following composition such that the drying coating amount was set to 20 mg/m², thereby forming an undercoat layer.

(Undercoat Layer Coating Solution (1))

Compound (UC-1) for undercoat layer (the following structure): 0.18 parts

Hydroxyethyl imino diacetic acid: 0.05 parts

Surfactant (EMALEX 710, manufactured by Nihon Emulsion Co., Ltd.): 0.03 parts

Water: 28.0 parts

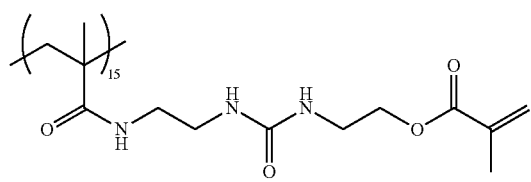

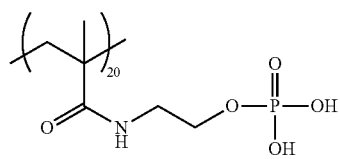

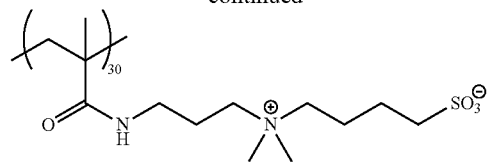

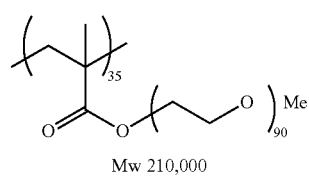

Mw 210,000

Compound (UC-1) for Undercoat Layer

<Formation of Image Recording Layer 1>

The support on which the undercoat layer was not formed was bar-coated with an image recording layer coating solution (2) having the following composition and dried in an oven at 700 for 60 seconds, thereby forming an image recording layer having a drying coating amount of 0.6 g/m².

(Image Recording Layer Coating Solution (2))

Thermoplastic polymer fine particle aqueous dispersion liquid (shown below): 20.0 parts Infrared absorbing agent (2) (the following structure): 0.2 parts Polymerization initiator (IRGACURE 250, manufactured by BASF SE): 0.4 parts Polymerization initiator (2) (the following structure): 0.15 parts Polymerizable compound SR-399 (manufactured by Sartomer Japan Inc.): 1.50 parts Mercapto-3-triazole: 0.2 parts Byk336 (manufactured by BYK Chemie GmbH): 0.4 parts Klucel M (manufactured by Hercules, Inc.): 4.8 parts ELVACITE 4026 (manufactured by Ineos Acrylics Ltd.): 2.5 parts Anionic surfactant 1 (the following structure): 0.15 parts n-Propanol: 55.0 parts 2-Butanone: 17.0 parts The compounds described with the trade names in the composition above as follows.

IRGACURE 250: (4-methylphenyl)[4-(2-methylpropyl)phenyl]iodonium=hexafluorophosphate (75 mass % propylene carbonate solution)

SR-399: dipentaerythritolpentaacrylate

Byk336: modified dimethyl polysiloxane copolymer (25 mass % xylene/methoxy propyl acetate solution)

Klucel M: hydroxypropyl cellulose (2 mass % aqueous solution)

ELVACITE 4026: highly branched polymethyl methacrylate (10 mass % 2-butanone solution)

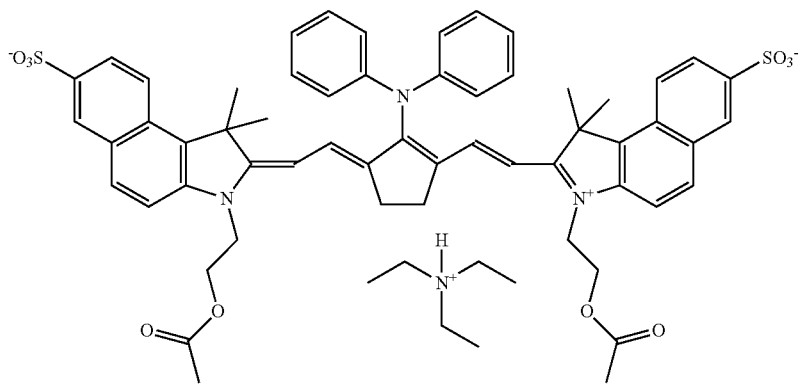

Infrared absorbing agent (2)

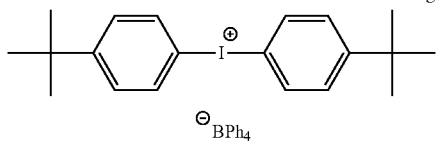

Polymerization initiator (2)

Further, Ph represents a phenyl group.

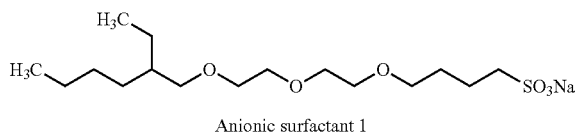

Anionic surfactant 1

(Preparation of Thermoplastic Polymer Particle Aqueous Dispersion Liquid)

Nitrogen gas was introduced into a four-necked flask equipped with a stirrer, a thermometer, a dropping funnel, a nitrogen introduction pipe, and a reflux condenser, deoxygenation was performed, 10 parts of polyethylene glycol methyl ether methacrylate (PEGMA, average number of repeating units of ethylene glycol: 20), 200 parts of distilled water, and 200 parts of n-propanol were added thereto, and then the mixture was heated until the internal temperature thereof was set to 70° C. Next, a mixture of 10 parts of styrene (St), 80 parts of acrylonitrile (AN), and 0.8 parts of 2,2'-azobisisobutyronitrile prepared in advance was added dropwise for 1 hour. After dropwise addition was finished, the reaction was allowed to be continued for 5 hours, 0.4 parts of 2,2'-azobisisobutyronitrile was added thereto, and the mixture was heated until the internal temperature was set to 80° C. Subsequently, 0.5 g of 2,2'-azobisisobutyronitrile was added for 6 hours. The total degree of polymerization at the stage of the continued reaction for 20 hours was 98% or greater, and a thermoplastic polymer particle aqueous dispersion liquid having PEGMA, St, and AN at a mass ratio of 10/10/80 was obtained. The particle size distribution of the thermoplastic polymer particle has a maximum value at 150 nm of the volume average particle diameter.

Here, the particle size distribution was acquired by imaging an electron micrograph of polymer particles, measuring the total number of 5,000 particle diameters of particles on the photograph, dividing the interval from the maximum value of the obtained measured value of the particle diameter to 0 into the logarithmic scale of 50, and plotting the appearance frequency of each particle diameter. Further, the particle diameter of a spherical particle having the same particle area as the particle area on the photograph was set to the particle diameter, as non-spherical particles.

<Formation of Image Recording Layer 2>

An undercoat layer on the support provided with the undercoat layer was bar-coated with an image recording layer coating solution (1) with the following composition and dried in an oven at 1000 for 60 seconds, thereby forming an image recording layer having a drying coating amount of 1.0 g/m$^2$.

The image recording layer coating solution (1) was obtained by mixing a photosensitive solution (1) and a microgel solution (1) described below immediately before the coating and then stirring the solution.

(Image Recording Layer Coating Solution (1))

(Photosensitive Solution (1))

Binder polymer (1) (the following structure, Mw: 55,000 and n (number of ethylene oxide (EO) repeating units): 2): 0.240 parts Infrared absorbing agent (1) (the following structure): 0.020 parts Borate compound (1) (Sodium tetraphenyl borate): 0.010 parts Polymerization initiator (1) (the following structure): 0.162 parts Polymerizable compound (tris(acryloyloxyethyl) isocyanurate, NK ESTER A-9300, manufactured by Shin-Nakamura Chemical Co., Ltd.): 0.192 parts Anionic surfactant 1 (the following structure): 0.050 g Fluorine-based surfactant (1) (the following structure): 0.008 parts 2-Butanone: 1.091 parts 1-Methoxy-2-propanol: 8.609 g (Microgel solution (1))

Microgel (1): 2.640 parts

Distilled water: 2.425 parts

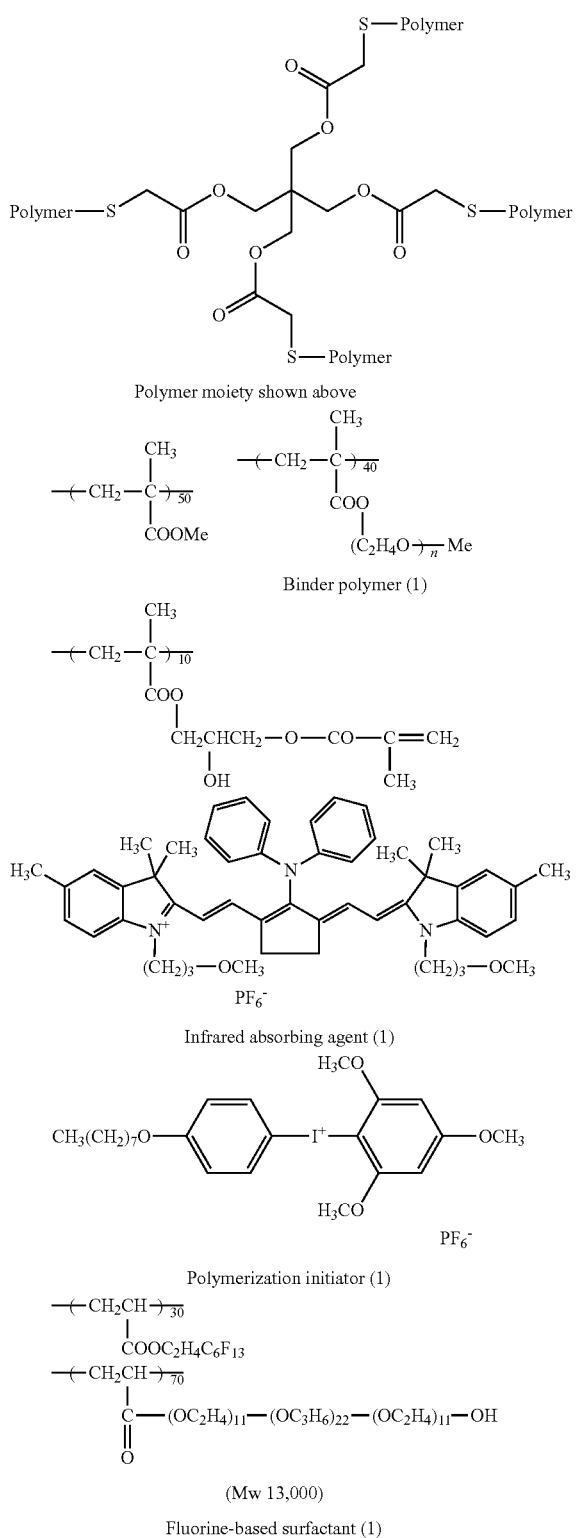

Polymer moiety shown above

Binder polymer (1)

Infrared absorbing agent (1)

Polymerization initiator (1)

(Mw 13,000)

Fluorine-based surfactant (1)

(Preparation of Microgel (1))

A method of preparing a microgel (1) used for the microgel solution will be described below.

<Preparation of Polyvalent Isocyanate Compound (1)>

0.043 parts of bismuth tris(2-ethylhexanoate) (NEO-STANN U-600 (manufactured by NITTO KASEI CO., LTD.) was added to an ethyl acetate (25.31 parts) suspension solution of 17.78 parts (80 molar equivalent) and 7.35 parts (20 molar equivalent) of the following polyhydric phenol compound (1) and the solution was stirred. The reaction temperature was set to 500 at the time of heat generation being subsided, and the solution was stirred for 3 hours, thereby obtaining an ethyl acetate (50% by mass) solution of a polyvalent isocyanate compound (1).

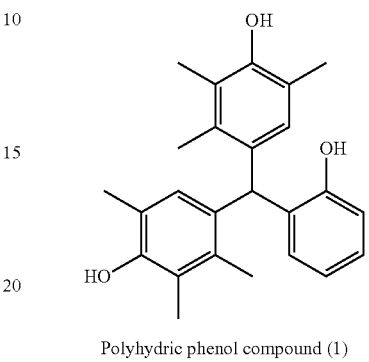

Polyhydric phenol compound (1)

<Preparation of Microgel (1)>

The following oil phase components and the water phase components were mixed with each other and emulsified at 12,000 rpm for 10 minutes using a homogenizer. The obtained emulsion was stirred at 45° C. for 4 hours, 5.20 parts of a 10 mass % aqueous solution of 1,8-diazabicyclo [5.4.0]undeca-7-ene-octylate (U-CAT SA102, manufactured by San-Apro Ltd.) was added thereto, and the solution was stirred at room temperature for 30 minutes and allowed to stand at 45° C. for 24 hours. The concentration of solid contents was adjusted to 20% by mass using distilled water, thereby obtaining an aqueous dispersion liquid of the microgel (1). The volume average particle diameter was measured using a dynamic light scattering type particle size distribution measuring device LB-500 (manufactured by Horiba Ltd.) according to a light scattering method, and the value was 0.28 μm.

(Oil Phase Components)

(Component 1) ethyl acetate: 12.0 parts (Component 2) adduct (50 mass % ethyl acetate solution, manufactured by Mitsui Chemicals, Inc.) obtained by adding trimethylolpropane (6 mol) and xylene diisocyanate (18 mol) and adding methyl one-terminal polyoxyethylene (1 mol, repetition number of oxyethylene units: 90) thereto: 3.76 parts (Component 3) polyvalent isocyanate compound (1) (as 50 mass % ethyl acetate solution): 15.0 parts (Component 4) 65 mass % solution of dipentaerythritol pentaacrylate (SR-399, manufactured by Sartomer Japan Inc.) in ethyl acetate: 11.54 parts (Component 5) 10% solution of sulfonate type surfactant (PIONINE A-41-C, manufactured by TAKEMOTO OIL & FAT Co., Ltd.) in ethyl acetate: 4.42 parts (Water Phase Components)

Distilled water: 46.87 parts

<Formation of Image Recording Layer 3>

A water-based coating solution for an image recording layer containing components such as the thermoplastic resin particles and the infrared absorbing agent shown below was prepared, and the pH thereof was adjusted to 3.6, the support was coated with the coating solution, and dried at 50° C. for 1 minute, thereby forming an image recording layer 3.

A thermoplastic particle polymer SAN, an infrared absorbing agent IR-01, other components PAA, and the surfactant used in the coating solution for an image recording layer are as follows.

Thermoplastic resin particle SAN: styrene/acrylonitrile copolymer (molar ratio of 50/50), average particle diameter: 61 nm, coating amount: 0.6927 (g/m$^2$)

Other components PAA: polyacrylic acid, weight-average molecular weight: 250000, coating amount: 0.09 (g/m$^2$)

Surfactant: Zonyl FSO100 (manufactured by Du Pont), coating amount: 0.0075 (g/m$^2$)

Infrared absorbing agent IR-01: infrared absorbing agent with the following structure (Et represents an ethyl group), coating amount: $1.03 \times 10^4$ (mol/m$^2$)

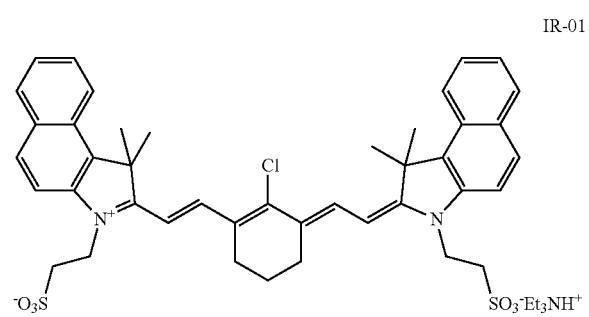

IR-01

<Formation of Protective Layer>

The image recording layer was bar-coated with a protective layer coating solution (1) with the following composition and dried in an oven at 120° C. for 60 seconds to form a protective layer having a drying coating amount of 0.15 g/m$^2$.

(Protective Layer Coating Solution (1))

Inorganic layered compound dispersion liquid (1) (shown below): 1.5 parts

Hydrophilic polymer (1) (the following structure, Mw: 30000) (solid content): 0.03 parts 6 mass % aqueous solution of polyvinyl alcohol (CKS50, sulfonic acid-modified, saponification degree of 99% by mole or greater, degree of polymerization of 300, manufactured by Nippon Synthetic Chemical Industry Co., Ltd.): 0.10 parts 6 mass % aqueous solution of polyvinyl alcohol (PVA-405, saponification degree of 81.5% by mole, degree of polymerization of 500, manufactured by KURARAY CO., LTD.): 0.03 parts 1 mass % aqueous solution of surfactant (EMALEX 710, the following structure, manufactured by Nihon Emulsion Co., Ltd.): 0.86 parts Ion exchange water: 6.0 parts

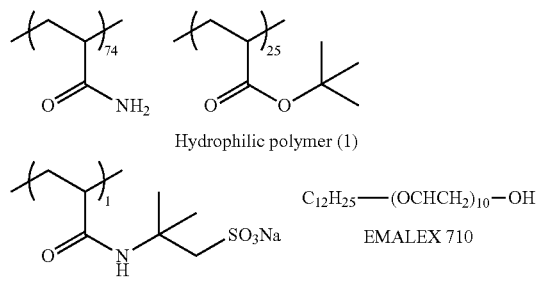

Hydrophilic polymer (1)

EMALEX 710

(Preparation of Inorganic Layered Compound Dispersion Liquid (1))

6.4 parts of synthetic mica SOMASIF ME-100 (manufactured by CO-OP CHEMICAL CO., LTD.) was added to 193.6 g of ion exchange water and dispersed such that the volume average particle diameter (laser scattering method) was set to 3 μm using a homogenizer. The aspect ratio of the obtained dispersed particles was 100 or greater.

<Means for Forming Unevenness>

As listed in Tables 8 to 10, unevenness was formed in the surface of the outermost layer on a side of the support where the image recording layer was provided and, as necessary, the surface of the outermost layer on a side of the support opposite to a side where the image recording layer was provided using the following particle coating method or protrusion forming method.

(Particle Coating Method (Particles))

The particles listed in Tables 8 to 10 were added to the coating solution for forming the outermost layer on the unevenness formation positions listed in Tables 8 to 10, and the positions were coated with the solution. At this time, the amount of particles to be added was adjusted so as to obtain the in-plane density listed in Tables 8 to 10.

Further, in Tables 8 to 10, "Art Pearl" series are acrylic resin particles (manufactured by Negami Chemical Industrial Co., Ltd.) and "CHEMISNOW" series are acrylic resin particles or styrene resin-based particles (manufactured by Soken Chemical & Engineering Co., Ltd.).

(Formation of Protrusion on Outermost Layer (Protrusions))

A PVA 405 (polyvinyl alcohol, Poval PVA405, manufactured by Kuraray Co., Ltd.) aqueous solution or a sodium polyacrylate (manufactured by Wako Pure Industrial Co., Ltd.) aqueous solution were prepared such that the concentration of solid contents was set to 5.0% by mass, the surface of the protective layer or the image recording layer serving as an outermost layer listed in Tables 8 to 10 was coated with the aqueous solution using a rotary atomizing electrostatic coater and the aqueous solution was dried at 100° C. for 30 seconds.

Examples 1 to 39 and Comparative Examples 1 to 5

<Preparation of Lithographic Printing Plate Precursor>

The above-described undercoat layer was formed on the support listed in Tables 8 to 10 and the image recording layer listed in Tables 8 to 10 was formed thereon in a case where the image recording layer 2 was provided, and the protective layer listed in Tables 8 to 10 was formed and unevenness was formed on the outermost layer using the means for forming unevenness listed in Tables 8 to 10 in the case where the image recording layer 2 was provided, thereby obtaining a lithographic printing plate precursor.

In Examples 25 to 27, a side of the support opposite to a side where the image forming layer was provided was coated with a back coat coating solution with the following composition, the solution was dried at 100° C. for 30 seconds, thereby forming a back coat layer.

—Composition for Back Coat Coating Solution—

Poly(methyl methacrylate) (manufactured by Sigma-Aldrich Co., LLC, Mw: 120000): 10.0 parts by mass Fluorine-based surfactant (1) (the structure described above): 0.05 parts by mass Methyl ethyl ketone: 90.0 parts by mass ART PEARL J-6P (the structure described above): 0.13 parts by mass In Example 28, the surface of the support on a side opposite to a side where the image recording layer was provided was coated with the PVA 405 aqueous solution using a rotary atomizing electrostatic coater, and the solution was dried at 100° C. for 30 seconds.

The following evaluations were performed on the obtained lithographic printing plate precursors. The evaluation results are collectively listed in Tables 8 to 10.

<On-Press Development Delay Resistance>

The surface of the lithographic printing plate precursor where the image recording layer was provided was directly brought into contact with the opposite surface and this process was repeated until 50 sheets were laminated, and the laminate was pressure-bonded by a pressure of 25 kgf/cm² for 8 days. The lithographic printing plates on which the above-described operation was performed were set by Trendsetter 3244 (manufactured by Creo Co., Ltd.) and then image-exposed under conditions of resolution of 2400 dpi, an output of 7 W, an external surface drum rotation speed of 150 rpm, and a plate surface energy of 110 mJ/cm². The lithographic printing plate precursors after image exposure were mounted on an offset rotary printing press (manufactured by TOKYO KIKAI SEISAKUSHO, LTD.), and printing was performed on newsprint paper at a speed of 100,000 sheets/hour using SOIBI KKST-S (red) (manufactured by InkTec Corporation) as printing ink for newspaper and ECO SEVEN N-1 (manufactured by SAKATA INX CORPORATION) as dampening water. The on-press development performed on the unexposed portion of the image recording layer on the printing press was completed, and the number of sheets of printing paper required until the ink was not transferred to the non-image area was counted as the number of on-press development sheets, and the scoring was made based on the following standard.

5: the number of on-press development sheets of lithographic printing plate precursors on which pressure bonding operation was not performed+number of 3 or less on-press development sheets 4: the number of on-press development sheets of lithographic printing plate precursors on which pressure bonding operation was not performed+number of 5 or less of on-press development sheets 3: the number of on-press development sheets of lithographic printing plate precursors on which pressure bonding operation was not performed+number of 10 or less on-press development sheets 2: the number of on-press development sheets of lithographic printing plate precursors on which pressure bonding operation was not performed+number of 15 or less of on-press development sheets 1: the number of on-press development sheets of lithographic printing plate precursors on which pressure bonding operation was not performed+number of 30 or less of on-press development sheets <Setter Plate Feeding Property (Plate Feeding Property)>

A laminate obtained by stacking 100 sheets of lithographic printing plate precursors directed to the same direction without using interleaving paper was set in a CTP plate setter "AMZI setter" (manufactured by NEC Engineering, Ltd.), and an operation of taking out one plate at a time from the uppermost portion of the laminate was continuously performed 100 times. The imparting of the plate-separating property at this time was evaluated based on the following standard. The evaluation was made by performing sensory evaluation with a score of 1 to 5, and a value of 3 or greater is in a practical level and a value of 2 or less is in a practically unacceptable level.

5: The occurrence frequency of a phenomenon in which the next plate was not raised at the time of lifting up a plate was 100%.

4: The occurrence frequency of a phenomenon in which the next plate was raised at the time of lifting up a plate and did not fall quickly was 1% or less with respect to the whole operations.

3: The occurrence frequency of a phenomenon in which the next plate was raised at the time of lifting up a plate and was not peeled off by the first operation of separating the plate was 1% or less with respect to the whole operation.

2: The occurrence frequency of a phenomenon in which the next plate was raised at the time of lifting up a plate and was not peeled off by the first operation of separating the plate was greater than 1% and 5% or less.

1: The occurrence frequency of a phenomenon in which the next plate was raised at the time of lifting up a plate and was not peeled off by the first operation of separating the plate was greater than 5%.

<Rubbing and Peeling Resistance (Falling Resistance of Projections)>

After the humidity of the lithographic printing plate precursors was adjusted in an environment of 25° at a relative humidity (RH) of 60% for 2 hours, each precursor was punched into a size of 2.5 cm×2.5 cm and attached to a continuous load type scratch resistance strength tester TYPE-18 (manufactured by SHINTO Scientific Co., Ltd.), the rear surface of the punched lithographic printing plate precursor was set to be brought into contact with the surface of the lithographic printing plate precursor which had not been punched, and several sites of the lithographic printing plate precursor were scratched by applying a load of 0 gf to 1500 gf. The scratched rear surface was observed visually and using a scanning electron microscope (SEM), and the level of falling of the projections on the surface of the outermost layer on a side of the image recording layer was evaluated based on the following standard. The evaluation was made by performing sensory evaluation with a score of 1 to 5, and a value of 3 or greater is in a practical level and a value of 2 or less is in a practically unacceptable level.

5: The protrusions did not fall at all.

4: One or more and less than five protrusions out of 100 protrusions fell.

3: Five or more and less than ten protrusions out of 100 protrusions fell.

2: Ten or more and less than fifty protrusions out of 100 protrusions fell.

1: Fifty or more protrusions out of 100 protrusions fell.

<Scratch Resistance>

After the humidity of the lithographic printing plates was adjusted in an environment of 25° at a relative humidity (RH) of 60% for 2 hours, a precursor was punched into a size of 2.5 cm×2.5 cm and attached to a continuous load type scratch resistance strength tester TYPE-18 (manufactured by SHINTO Scientific Co., Ltd.), the rear surface of the lithographic printing plate precursor which had been punched was set to be brought into contact with the surface of the lithographic printing plate precursor which has not been punched, and several sites of the lithographic printing plate precursor were scratched by applying a load of 0 gf to 1500 gf. The scratched lithographic printing plate was set by Trendsetter 3244 (manufactured by Creo Co., Ltd.) and then image-exposed under conditions of resolution of 2400 dpi, an output of 7 W, an external surface drum rotation speed of 150 rpm, and a plate surface energy of 110 mJ/cm². The lithographic printing plate precursor after image exposure was mounted on an offset rotary printing press (manufactured by TOKYO KIKAI SEISAKUSHO, LTD.), and printing was performed on newsprint paper at a speed of 100,000 sheets/hour using SOIBI KKST-S (red) (manufactured by InkTec Corporation) as printing ink for newspaper and ECO SEVEN N-1 (manufactured by SAKATA INX CORPORATION) as dampening water. In the above-described printing process, 1,000-th printed matter was sampled, the degree of scratches and stain caused by scratches was visually observed.

The evaluation of scratch resistance was made by performing sensory evaluation with a score of 1 to 5, and a value of 3 or greater is in a practical level and a value of 2 or less is in a practically unacceptable level.

5: Scratches and stain were not found.

4: Although scratches and stain were not confirmed by visual recognition, scratches and stain which were able to be confirmed using a 6 magnification loupe were found at one site.

3: Although scratches and stain were not confirmed by visual recognition, scratches and stain which were able to be confirmed using a 6 magnification loupe were found at several sites.

2: Scratches and stain which were able to be confirmed by visual recognition were found at several sites.

1: Scratches and stain were found from the entire surface.

<Adhesiveness (Ease of Peeling at Time of Lamination without Using Interleaving Paper)>

The humidity of 3 sheets of lithographic printing plate precursors (10 cm×10 cm) was adjusted in an environment of 25° C. at a relative humidity (RH) of 75% for 2 hours, and the lithographic printing plate precursors were sequentially stacked in the same direction in a state in which interleaving paper was not interposed between precursors, thereby obtaining a laminate. This laminate was tightly wrapped with kraft paper having an aluminum laminate layer and then allowed to stand still in an environment of 30° C. for 5 days in a state in which a 4 kg load was applied thereto. Thereafter, the lithographic printing plate precursors were peeled off, and the state of adhesion between the surface of the outermost layer of the lithographic printing plate precursor on the image forming layer side and the surface of the outermost layer of the lithographic printing plate precursor, vertically adjacent to each other at the time of lamination, on a side opposite to a side where the image forming layer was provided was visually observed. The evaluation was made by performing sensory evaluation with a score of 1 to 5, and a value of 3 or greater is in a practical level and a value of 2 or less is in a practically unacceptable level.

5: The precursors were not bonded to each other.

4: The precursors were slightly bonded to each other.

3: The precursors were partially bonded to each other.

2: The precursors were strongly bonded to each other to the extent that the precursors were peeled off from each other by hand in a case where strength was applied thereto.

1: The precursors were extremely and strongly bonded to each other so that the precursors were unlikely to be peeled off from each other by hand.

<Measurement of Arithmetic Average Height Sa>

The arithmetic average height Sa was measured in conformity with the method described in ISO 25178. In other words, three or more sites were selected from the same sample and measured using a micromap MM3200-M100 (manufactured by Mitsubishi Chemical Systems, Inc.), and the average value of the obtained values was set as the arithmetic average height Sa. A measurement range with a size of 1 cm×1 cm was randomly selected from the surface of the sample and the measurement was performed.

<Measurement of Bekk Smoothness (Bekk Second)>

The Bekk smoothness was measured in conformity with JIS P8119 (1998). The measurement was performed at one tenth the amount of standard air, in other words, an air amount of 1 mL using a Bekk smoothness tester (manufactured by KUMAGAI RIKI KOGYO Co., Ltd.). In a case where the Bekk smoothness was short, this indicates that the air release property of the contact surfaces of the lithographic printing plate precursors vertically adjacent to each other was excellent at the time of forming a laminate by laminating the lithographic printing plate precursors and the lithographic printing plate precursors were unlikely to be bonded to one another.

TABLE 7

| | | Roughening treatment | | | | | | | First anodization treatment | | | | | | Pore widening treatment | |
|---|---|---|---|---|---|---|---|---|---|---|---|---|---|---|---|---|
| | | | Nitric acid | Alkali | Hydrochloric acid | Alkali | Sulfuric acid concentration of electrolytic | Phosphoric acid concentration of electrolytic | | | | | | | |
| | Support | Brush grain | Alkali etching (g/m²) | electrolysis (C/dm²) | etching (g/m²) | electrolysis (C/dm²) | etching (g/m²) | solution (g/L) | solution (g/L) | Temperature (° C.) | Current density (A/dm³) | Coating amount (g/m²) | Temperature (° C.) | Time (second) |
| Example 1 | Support 1 | — | 3 | — | — | 480 | 0.05 | — | 220 | 38 | 15 | 1.5 | — | — |
| Example 2 | Support 1 | — | 3 | — | — | 480 | 0.05 | — | 220 | 38 | 15 | 1.5 | — | — |
| Example 3 | Support 1 | — | 3 | — | — | 480 | 0.05 | — | 220 | 38 | 15 | 1.5 | — | — |
| Example 4 | Support 1 | — | 3 | — | — | 480 | 0.05 | — | 220 | 38 | 15 | 1.5 | — | — |
| Example 5 | Support 1 | — | 3 | — | — | 480 | 0.05 | — | 220 | 38 | 15 | 1.5 | — | — |
| Example 6 | Support 1 | — | 3 | — | — | 480 | 0.05 | — | 220 | 38 | 15 | 1.5 | — | — |
| Example 7 | Support 1 | — | 3 | — | — | 480 | 0.05 | — | 220 | 38 | 15 | 1.5 | — | — |
| Example 8 | Support 1 | — | 3 | — | — | 480 | 0.05 | — | 220 | 38 | 15 | 1.5 | — | — |
| Example 9 | Support 1 | — | 3 | — | — | 480 | 0.05 | — | 220 | 38 | 15 | 1.5 | — | — |
| Example 10 | Support 1 | — | 3 | — | — | 480 | 0.05 | — | 220 | 38 | 15 | 1.5 | — | — |
| Example 11 | Support 1 | — | 3 | — | — | 480 | 0.05 | — | 220 | 38 | 15 | 1.5 | — | — |
| Example 12 | Support 1 | — | 3 | — | — | 480 | 0.05 | — | 220 | 38 | 15 | 1.5 | — | — |
| Example 13 | Support 2 | Present | 10 | 185 | 0.5 | 63 | 0.1 | 170 | — | 55 | 90 | 0.3 | — | — |
| Example 14 | Support 2 | Present | 10 | 185 | 0.5 | 63 | 0.1 | 170 | — | 55 | 90 | 0.3 | — | — |
| Example 15 | Support 2 | Present | 10 | 185 | 0.5 | 63 | 0.1 | 170 | — | 55 | 90 | 0.3 | — | — |
| Example 16 | Support 2 | Present | 10 | 185 | 0.5 | 63 | 0.1 | 170 | — | 55 | 90 | 0.3 | — | — |
| Example 17 | Support 2 | Present | 10 | 185 | 0.5 | 63 | 0.1 | 170 | — | 55 | 90 | 0.3 | — | — |
| Example 18 | Support 3 | — | — | — | — | 130 | — | 155 | — | 45 | 22 | 4 | — | — |
| Example 19 | Support 1 | — | 3 | — | — | 480 | 0.05 | — | 220 | 38 | 15 | 1.5 | — | — |
| Example 20 | Support 1 | — | 3 | — | — | 480 | 0.05 | — | 220 | 38 | 15 | 1.5 | — | — |
| Example 21 | Support 1 | — | 3 | — | — | 480 | 0.05 | — | 220 | 38 | 15 | 1.5 | — | — |
| Example 22 | Support 1 | — | 3 | — | — | 480 | 0.05 | — | 220 | 38 | 15 | 1.5 | — | — |
| Example 23 | Support 2 | Present | 10 | 185 | 0.5 | 63 | 0.1 | 170 | — | 55 | 90 | 0.3 | — | — |
| Example 24 | Support 3 | — | — | — | — | 130 | — | 155 | — | 45 | 22 | 4 | — | — |
| Example 25 | Support 1 | — | 3 | — | — | 480 | 0.05 | — | 220 | 38 | 15 | 1.5 | — | — |
| Example 26 | Support 2 | Present | 10 | 185 | 0.5 | 63 | 0.1 | 170 | — | 55 | 90 | 0.3 | — | — |
| Example 27 | Support 2 | Present | 10 | 185 | 0.5 | 63 | 0.1 | 170 | — | 55 | 90 | 0.3 | — | — |
| Example 28 | Support 1 | — | 3 | — | — | 480 | 0.05 | — | 220 | 38 | 15 | 1.5 | — | — |
| Example 29 | Support 4 | — | 3 | — | — | 480 | 0.05 | — | 220 | 38 | 15 | 1.5 | — | — |
| Example 30 | Support 5 | — | 3 | — | — | 480 | 0.05 | — | 220 | 38 | 15 | 1.5 | — | — |
| Example 31 | Support 7 | — | 5 | — | — | 450 | 0.2 | 170 | — | 50 | 30 | 2.4 | 28 | 3 |
| Example 32 | Support 7 | — | 5 | — | — | 450 | 0.2 | 170 | — | 50 | 30 | 2.4 | 40 | 3 |
| Example 33 | Support 7 | — | 5 | — | — | 450 | 0.2 | 170 | — | 15 | 60 | 2.4 | 40 | 15 |
| Example 34 | Support 8 | — | 5 | — | — | 450 | 0.2 | 170 | — | 50 | 30 | 0.3 | 40 | 3 |
| Example 35 | Support 9 | Present | 10 | 185 | 3.5 | 63 | 0.2 | 170 | — | 50 | 30 | 2.4 | 40 | 3 |
| Example 36 | Support 10 | — | 5 | — | — | 450 | 0.2 | — | 150 | 35 | 4.5 | 1 | — | — |
| Example 37 | Support 11 | — | 5 | — | — | 450 | 0.2 | — | 150 | 35 | 4.5 | 1 | 40 | 4 |
| Example 38 | Support 12 | — | 5 | — | — | 450 | 0.2 | — | 150 | 35 | 4.5 | 1 | — | — |
| Example 39 | Support 13 | — | 5 | — | — | 450 | 0.1 | — | 150 | 35 | 4.5 | 1 | 40 | 8 |
| Example 40 | Support 14 | — | 6 | 220 | 0.25 | 50 | 0.1 | 170 | — | 38 | 30 | 2.7 | — | — |
| Comparative Example 1 | Support 1 | — | 3 | — | — | 480 | 0.05 | — | 220 | 38 | 15 | 1.5 | — | — |

TABLE 7-continued

| | Support | Second anodization treatment | | | | | Third anodization treatment | | | | | Average pore diameter (nm) |
|---|---|---|---|---|---|---|---|---|---|---|---|---|
| | | Sulfuric acid concentration of electrolytic solution (g/L) | Phosphoric acid concentration of electrolytic solution (g/L) | Temperature (°C) | Current density (A/dm³) | Coating amount (g/m²) | Sulfuric acid concentration of electrolytic solution (g/L) | Phosphoric acid concentration of electrolytic solution (g/L) | Temperature (°C) | Current density (A/dm³) | Coating amount (g/m²) | |
| Comparative Example 2 | Support 1 | — | 480 | — | 0.05 | — | 220 | 38 | 15 | 1.5 | — | — |
| Comparative Example 3 | Support 1 | — | 480 | — | 0.05 | — | 220 | 38 | 15 | 1.5 | — | — |
| Comparative Example 4 | Support 1 | — | 480 | — | 0.05 | — | 220 | 38 | 15 | 1.5 | — | — |
| Comparative Example 5 | Support 1 | — | 480 | — | 0.05 | — | 220 | 38 | 15 | 1.5 | — | — |
| Comparative Example 6 | Support 6 | 220 | 0.25 | 50 | 0.1 | 170 | — | 38 | 30 | 2.7 | — | — |
| Comparative Example 7 | Support 14 | 220 | 0.25 | 50 | 0.1 | 170 | — | 38 | 30 | 2.7 | — | — |
| Comparative Example 8 | Support 14 | 220 | 0.25 | 50 | 0.1 | 170 | — | 38 | 30 | 2.7 | — | — |
| Example 1 | | — | — | — | — | — | — | — | — | — | — | 30 |
| Example 2 | | — | — | — | — | — | — | — | — | — | — | 30 |
| Example 3 | | — | — | — | — | — | — | — | — | — | — | 30 |
| Example 4 | | — | — | — | — | — | — | — | — | — | — | 30 |
| Example 5 | | — | — | — | — | — | — | — | — | — | — | 30 |
| Example 6 | | — | — | — | — | — | — | — | — | — | — | 30 |
| Example 7 | | — | — | — | — | — | — | — | — | — | — | 30 |
| Example 8 | | — | — | — | — | — | — | — | — | — | — | 30 |
| Example 9 | | — | — | — | — | — | — | — | — | — | — | 30 |
| Example 10 | | — | — | — | — | — | — | — | — | — | — | 30 |
| Example 11 | | — | — | — | — | — | — | — | — | — | — | 30 |
| Example 12 | | — | — | — | — | — | — | — | — | — | — | 30 |
| Example 13 | | 170 | — | 54 | 15 | 2.4 | 170 | — | 54 | 50 | 0.3 | 12 |
| Example 14 | | 170 | — | 54 | 15 | 2.4 | 170 | — | 54 | 50 | 0.3 | 12 |
| Example 15 | | 170 | — | 54 | 15 | 2.4 | 170 | — | 54 | 50 | 0.3 | 12 |
| Example 16 | | 170 | — | 54 | 15 | 2.4 | 170 | — | 54 | 50 | 0.3 | 12 |
| Example 17 | | 170 | — | 54 | 15 | 2.4 | 170 | — | 54 | 50 | 0.3 | 7 |
| Example 18 | | — | — | — | — | — | — | — | — | — | — | 30 |
| Example 19 | | — | — | — | — | — | — | — | — | — | — | 30 |
| Example 20 | | — | — | — | — | — | — | — | — | — | — | 30 |
| Example 21 | | — | — | — | — | — | — | — | — | — | — | 30 |
| Example 22 | | 170 | — | 54 | 15 | 2.4 | 170 | — | 54 | 50 | 0.3 | 12 |
| Example 23 | | — | — | — | — | — | — | — | — | — | — | 7 |
| Example 24 | | — | — | — | — | — | — | — | — | — | — | 30 |
| Example 25 | | — | — | — | — | — | — | — | — | — | — | 30 |
| Example 26 | | 170 | — | 54 | 15 | 2.4 | 170 | — | 54 | 50 | 0.3 | 12 |
| Example 27 | | 170 | — | 54 | 15 | 2.4 | 170 | — | 54 | 50 | 0.3 | 12 |
| Example 28 | | — | — | — | — | — | — | — | — | — | — | 30 |
| Example 29 | | — | — | — | — | — | — | — | — | — | — | 30 |
| Example 30 | | — | — | — | — | — | — | — | — | — | — | 30 |
| Example 31 | | — | — | — | — | — | — | — | — | — | — | 30 |
| Example 32 | | — | — | — | — | — | — | — | — | — | — | 13 |
| Example 33 | | — | — | — | — | — | — | — | — | — | — | 30 |
| Example 34 | | — | — | 50 | 13 | 2.1 | — | — | — | — | — | 100 |
| Example 35 | | — | — | — | — | — | — | — | — | — | — | 30 |
| Example 36 | | 170 | — | 50 | 13 | 2.1 | — | — | — | — | — | 40 |
| Example 37 | | 170 | — | 50 | 13 | 2.1 | — | — | — | — | — | 100 |

TABLE 7-continued

| | | | | | | | | |
|---|---|---|---|---|---|---|---|---|
| Example 38 | — | 150 | 35 | 4.5 | — | — | — | 40 |
| Example 39 | — | 150 | 35 | 4.5 | 1.2 | — | — | 148 |
| Example 40 | — | — | — | — | 2.1 | — | — | 30 |
| Comparative Example 1 | — | — | — | — | — | — | — | 30 |
| Comparative Example 2 | — | — | — | — | — | — | — | 30 |
| Comparative Example 3 | — | — | — | — | — | — | — | 30 |
| Comparative Example 4 | — | — | — | — | — | — | — | 30 |
| Comparative Example 5 | — | — | — | — | — | — | — | 30 |
| Comparative Example 6 | — | — | — | — | — | — | — | 7 |
| Comparative Example 7 | — | — | — | — | — | — | — | 7 |
| Comparative Example 8 | — | — | — | — | — | — | — | 7 |

TABLE 8

| | | Support | | Side where image recording layer is provided | | | |
|---|---|---|---|---|---|---|---|
| | | Type | Elapsed time (days) of support after anodization treatment | Image recording layer | Protective layer | Means for forming unevenness | Unevenness formation position |
| Example | 1 | Support 1 | 10 | Image recording layer 1 | None | Particles | Particles having diameter of 0.5 µm (CHEMISNOW MX-40T) | Image recording layer |
| | 2 | Support 1 | 10 | Image recording layer 1 | None | Particles | Particles having diameter of 0.8 µm (CHEMISNOW MX-30H3wT) | Image recording layer |
| | 3 | Support 1 | 10 | Image recording layer 1 | None | Particles | Particles having diameter of 3.2 µm (ARTPEARL J-5P) | Image recording layer |
| | 4 | Support 1 | 10 | Image recording layer 1 | None | Particles | Particles having diameter of 5.3 µm (ARTPEARL J-6P) | Image recording layer |
| | 5 | Support 1 | 10 | Image recording layer 1 | None | Particles | Particles having diameter of 6.5 µm (ARTPEARL J-7PS) | Image recording layer |
| | 6 | Support 1 | 10 | Image recording layer 1 | None | Particles | Particles having diameter of 10 µm (ARTPEARL GR-600 transparent) | Image recording layer |
| | 7 | Support 1 | 10 | Image recording layer 1 | None | Particles | Particles having diameter of 22 µm (ARTPEARL GR-300 transparent) | Image recording layer |
| | 8 | Support 1 | 10 | Image recording layer 1 | None | Particles | Particles having diameter of 3.2 µm (ARTPEARL J-5P) | Image recording layer |
| | 9 | Support 1 | 10 | Image recording layer 1 | None | Particles | Particles having diameter of 3.2 µm (ARTPEARL J-5P) | Image recording layer |
| | 10 | Support 1 | 10 | Image recording layer 1 | None | Particles | Particles having diameter of 5.3 µm (ARTPEARL J-6P) | Image recording layer |
| | 11 | Support 1 | 10 | Image recording layer 1 | None | Particles | Particles having diameter of 5.3 µm (ARTPEARL J-6P) | Image recording layer |
| | 12 | Support 1 | 10 | Image recording layer 1 | None | Particles | Particles having diameter of 5.3 µm (ARTPEARL J-6P) | Image recording layer |
| | 13 | Support 2 | 10 | Image recording layer 2 | Protective layer 1 | Particles | Particles having diameter of 5.3 µm (ARTPEARL J-6P) | Image recording layer |
| | 14 | Support 2 | 10 | Image recording layer 2 | Protective layer 1 | Particles | Particles having diameter of 0.8 µm (CHEMISNOW MX-30H3wT) | Protective layer |
| | 15 | Support 2 | 10 | Image recording layer 2 | Protective layer 1 | Particles | Particles having diameter of 3.2 µm (ARTPEARL J-5P) | Protective layer |
| | 16 | Support 2 | 10 | Image recording layer 2 | Protective layer 1 | Particles | Particles having diameter of 5.3 µm (ARTPEARL J-6P) | Protective layer |
| | 17 | Support 2 | 10 | Image recording layer 2 | Protective layer 1 | Particles | Particles having diameter of 6.5 µm (ARTPEARL J-7PS) | Protective layer |
| | 18 | Support 3 | 10 | Image recording layer 3 | None | Particles | Particles having diameter of 5.3 µm (ARTPEARL J-6P) | Image recording layer |
| | 19 | Support 1 | 10 | Image recording layer 1 | None | Protrusions | Coating with liquid droplets using spray (PVA aqueous solution) | On image recording layer |
| | 20 | Support 1 | 10 | Image recording layer 1 | None | Protrusions | Coating with liquid droplets using spray (PVA aqueous solution) | On image recording layer |

| | | Side where image recording layer is provided | | | Side opposite to side where image recording layer is provided | | |
|---|---|---|---|---|---|---|---|
| | | In-plane density of particles (pcs/mm²) | Sa (µm) | Bekk smoothness (s) | Means for forming unevenness | Sa (µm) | Bekk smoothness (s) |
| Example | 1 | 1,000 | 0.4 | 200 | None | 0.1 | 1,200 |
| | 2 | 1,000 | 0.6 | 120 | None | 0.1 | 1,200 |
| | 3 | 1,000 | 2.1 | 80 | None | 0.1 | 1,200 |
| | 4 | 1,000 | 3.1 | 32 | None | 0.1 | 1,200 |
| | 5 | 1,000 | 5.2 | 20 | None | 0.1 | 1,200 |
| | 6 | 1,000 | 8.4 | 8 | None | 0.1 | 1,200 |

TABLE 8-continued

| | | | | | | | | |
|---|---|---|---|---|---|---|---|---|
| 7 | 1,000 | 14.6 | 5 | None | None | 0.1 | 1,200 |
| 8 | 100 | 1.8 | 92 | None | None | 0.1 | 1,200 |
| 9 | 5,000 | 2.7 | 60 | None | None | 0.1 | 1,200 |
| 10 | 100 | 2.7 | 46 | None | None | 0.1 | 1,200 |
| 11 | 500 | 2.9 | 40 | None | None | 0.1 | 1,200 |
| 12 | 5,000 | 4.3 | 25 | None | None | 0.1 | 1,200 |
| 13 | 1,000 | 3.6 | 40 | None | None | 0.1 | 1,200 |
| 14 | 1,000 | 0.5 | 120 | None | None | 0.1 | 1,200 |
| 15 | 1,000 | 2.1 | 80 | None | None | 0.1 | 1,200 |
| 16 | 1,000 | 3.4 | 23 | None | None | 0.1 | 1,200 |
| 17 | 1,000 | 2.1 | 80 | None | None | 0.1 | 1,200 |
| 18 | 1,000 | 3.1 | 45 | None | None | 0.1 | 1,200 |
| 19 | Particles were not available | 2.4 | 75 | None | None | 0.1 | 1,200 |
| 20 | Particles were not available | 10.2 | 5 | None | None | 0.1 | 1,200 |

| | | Total value Sa (μm) | Total reciprocal value of Bekk smoothness (1/s) | On-press development delay resistance | Setter plate feeding property | Rubbing and peeling resistance | Scratch resistance | Ease of peeling |
|---|---|---|---|---|---|---|---|---|
| Example | 1 | 0.5 | 0.00583 | 5 | 3 | 5 | 3 | 3 |
| | 2 | 0.7 | 0.00917 | 5 | 4 | 5 | 4 | 4 |
| | 3 | 2.2 | 0.01333 | 5 | 5 | 5 | 5 | 5 |
| | 4 | 3.2 | 0.03208 | 4 | 5 | 5 | 5 | 5 |
| | 5 | 5.3 | 0.05083 | 3 | 5 | 4 | 5 | 5 |
| | 6 | 8.5 | 0.12583 | 2 | 5 | 4 | 5 | 5 |
| | 7 | 14.7 | 0.20083 | 2 | 5 | 3 | 5 | 5 |
| | 8 | 1.9 | 0.0117 | 5 | 3 | 5 | 4 | 5 |
| | 9 | 2.8 | 0.0175 | 3 | 4 | 4 | 5 | 5 |
| | 10 | 2.8 | 0.02257 | 5 | 3 | 5 | 4 | 4 |
| | 11 | 3 | 0.02583 | 5 | 4 | 5 | 4 | 5 |
| | 12 | 4.4 | 0.04083 | 4 | 6 | 3 | 5 | 5 |
| | 13 | 3.7 | 0.02583 | 5 | 5 | 5 | 5 | 5 |
| | 14 | 0.6 | 0.00917 | 5 | 3 | 5 | 4 | 4 |
| | 15 | 2.2 | 0.01333 | 5 | 4 | 4 | 5 | 5 |
| | 16 | 3.5 | 0.04431 | 5 | 5 | 5 | 5 | 5 |
| | 17 | 2.2 | 0.01333 | 4 | 5 | 3 | 5 | 5 |
| | 18 | 3.2 | 0.02306 | 4 | 5 | 5 | 5 | 5 |
| | 19 | 2.5 | 0.01417 | 5 | 4 | 5 | 5 | 5 |
| | 20 | 10.3 | 0.20083 | 4 | 5 | 4 | 5 | 5 |

TABLE 9

| | | Support | | Side where image recording layer is provided | | | | |
|---|---|---|---|---|---|---|---|---|
| | | Type | Elapsed time (days) of support after anodization treatment | Image recording layer | Protective layer | Means for forming unevenness | | Unevenness formation position |
| Example | 21 | Support 1 | 10 | Image recording layer 1 | None | Protrusions | Coating with liquid droplets using spray (sodium polyacrylate aqueous solution) | On image recording layer |
| | 22 | Support 1 | 10 | Image recording layer 1 | None | Dots | Screen coating (PVA aqueous solution) | Image recording layer |
| | 23 | Support 2 | 10 | Image recording layer 2 | Protective layer 1 | Protrusions | Coating with liquid droplets using spray (PVA aqueous solution) | On protective layer |
| | 24 | Support 3 | 10 | Image recording layer 3 | None | Protrusions | Coating with liquid droplets using spray (PVA aqueous solution) | On protective layer |
| | 25 | Support 1 | 10 | Image recording layer 1 | None | Particles | Particles having diameter of 0.8 μm (CHEMISNOW MX-30H3wT) | Image recording layer |
| | 26 | Support 2 | 10 | Image recording layer 1 | None | Particles | Particles having diameter of 3.2 μm (ARTPEARL J-5P) | Image recording layer |
| | 27 | Support 2 | 10 | Image recording layer 1 | None | Particles | Particles having diameter of 5.3 μm (ARTPEARL J-6P) | Image recording layer |

TABLE 9-continued

| | | | | | | | | |
|---|---|---|---|---|---|---|---|---|
| | 28 | Support 1 | 10 | Image recording layer 1 | None | Particles | Particles having diameter of 0.8 μm (CHEMISNOW MX-30H3wT) | Image recording layer |
| | 29 | Support 4 | 1 | Image recording layer 1 | None | Particles | Particles having diameter of 5.3 μm (ARTPEARL J-6P) | Image recording layer |
| | 50 | Support 5 | 3 | Image recording layer 1 | None | Particles | Particles having diameter of 5.3 μm (ARTPEARL J-6P) | Image recording layer |
| Comparative Example | 1 | Support 1 | 10 | Image recording layer 1 | None | — | — | — |
| | 2 | Support 1 | 10 | Image recording layer 1 | None | Particles | Particles having diameter of 120 μm (ARTPEARL GR-500W) | Image recording layer |
| | 3 | Support 1 | 10 | Image recording layer 2 | Protective layer 1 | — | — | — |
| | 4 | Support 1 | 10 | Image recording layer 1 | None | Protrusions | Coating with liquid droplets using spray (PVA aqueous solution) | — |
| | 5 | Support 6 | 1 hour | Image recording layer 1 | None | Particles | Particles having diameter of 32 μm (ARTPEARL GR-200) | Image recording layer |

| | | Side where image recording layer is provided | | | Side opposite to side where image recording layer is provided | | |
|---|---|---|---|---|---|---|---|
| | | In-plane density of particles (pcs/mm$^2$) | Sa (μm) | Bekk smoothness (s) | Means for forming unevenness | | Sa (μm) | Bekk smoothness (s) |
| Example | 21 | Particles were not available | 9.4 | 7 | None | None | 0.1 | 1,200 |
| | 22 | Particles were not available | 12.4 | 4 | None | None | 0.1 | 1,200 |
| | 23 | Particles were not available | 8.4 | 8 | None | None | 0.1 | 1,200 |
| | 24 | Particles were not available | 9.2 | 6 | None | None | 0.1 | 1,200 |
| | 25 | 1,000 | 0.5 | 120 | Particles | Particles having diameter of 3.2 μm (ARTPEARL J-5P) | 2.1 | 80 |
| | 26 | 1,000 | 2.1 | 80 | Particles | Particles having diameter of 3.2 μm (ARTPEARL J-5P) | 2.1 | 80 |
| | 27 | 1,000 | 3.1 | 45 | Particles | Particles having diameter of 3.2 μm (ARTPEARL J-6P) | 2.1 | 80 |
| | 28 | 1,000 | 0.5 | 120 | Protrusions | Coating with liquid droplets using spray (PVA aqueous solution) | 15 | 5 |
| | 29 | 1,000 | 3.1 | 45 | None | None | 0.1 | 1,200 |
| | 50 | 1,000 | 3.1 | 45 | None | None | 0.1 | 1,200 |
| Comparative Example | 1 | Particles were not available | 0.1 | 12,000 | None | None | 0.1 | 1,200 |
| | 2 | 1,000 | 62 | 0.5 | None | None | 0.1 | 1,200 |
| | 3 | Particles were not available | 0.2 | 500 | None | None | 0.1 | 1,200 |
| | 4 | Particles were not available | 30 | 1 | None | None | 0.1 | 1,200 |
| | 5 | 1,000 | 25 | 3 | None | None | 0.1 | 1,200 |

| | | | | Evaluation results | | | | |
|---|---|---|---|---|---|---|---|---|
| | | Total value Sa (μm) | Total reciprocal value of Bekk smoothness (1/s) | On-press development delay resistance | Setter plate feeding property | Rubbing and peeling resistance | Scratch resistance | Ease of peeling |
| Example | 21 | 9.5 | 0.14369 | 4 | 5 | 4 | 5 | 5 |
| | 22 | 12.5 | 0.25083 | 3 | 5 | 4 | 5 | 5 |
| | 23 | 8.5 | 0.12583 | 4 | 5 | 5 | 5 | 5 |
| | 24 | 9.3 | 0.1675 | 3 | 5 | 5 | 5 | 5 |
| | 25 | 2.6 | 0.02083 | 5 | 4 | 5 | 3 | 4 |
| | 26 | 4.2 | 0.025 | 5 | 5 | 5 | 3 | 5 |
| | 27 | 4.2 | 0.03472 | 5 | 5 | 5 | 5 | 5 |
| | 28 | 15.5 | 0.20833 | 5 | 5 | 5 | 3 | 5 |
| | 29 | 3.2 | 0.02306 | 3 | 3 | 5 | 5 | 5 |
| | 50 | 3.2 | 0.02306 | 4 | 3 | 5 | 5 | 5 |

TABLE 9-continued

|  |  |  |  |  |  |  |  |  |  |
|---|---|---|---|---|---|---|---|---|---|
| Comparative Example | 1 | 0.2 | 0.00092 | 5 | 1 | 5 | 1 | 1 |  |
|  | 2 | 62.1 | 2.00083 | 1 | 5 | 1 | 5 | 5 |  |
|  | 3 | 0.3 | 0.00283 | 5 | 1 | 5 | 2 | 1 |  |
|  | 4 | 30.1 | 1.00083 | 1 | 5 | 2 | 5 | 5 |  |
|  | 5 | 25.1 | 0.33417 | 1 | 5 | 1 | 5 | 5 |  |

TABLE 10

|  |  | Support | | Side where image recording layer is provided | | | | | | |
|---|---|---|---|---|---|---|---|---|---|---|
|  |  | Type | Elapsed time (days) of support after anodization treatment | Image recording layer | Protective layer | Means for forming unevenness | Unevenness formation position | In-plane density of particles (pcs/mm²) | Sa (μm) | Bekk smoothness (s) |
| Example | 31 | Support 7 | 10 | Image recording layer 1 | None | Particles | Particles having diameter of 3.2 μm (ARTPEARL J-5P) | Image recording layer | 1000 | 2.1 | 80 |
|  | 32 | Support 7 | 10 | Image recording layer 1 | None | Particles | Particles having diameter of 3.2 μm (ARTPEARL J-5P) | Image recording layer | 1000 | 2.1 | 80 |
|  | 33 | Support 7 | 10 | Image recording layer 1 | None | Particles | Particles having diameter of 3.2 μm (ARTPEARL J-5P) | Image recording layer | 1000 | 2.1 | 80 |
|  | 34 | Support 8 | 10 | Image recording layer 1 | None | Particles | Particles having diameter of 3.2 μm (ARTPEARL J-5P) | Image recording layer | 1000 | 2.1 | 80 |
|  | 35 | Support 9 | 10 | Image recording layer 1 | None | Particles | Particles having diameter of 3.2 μm (ARTPEARL J-5P) | Image recording layer | 1000 | 2.1 | 80 |
|  | 36 | Support 10 | 10 | Image recording layer 1 | None | Particles | Particles having diameter of 3.2 μm (ARTPEARL J-5P) | Image recording layer | 1000 | 2.1 | 80 |
|  | 37 | Support 11 | 10 | Image recording layer 1 | None | Particles | Particles having diameter of 3.2 μm (ARTPEARL J-5P) | Image recording layer | 1000 | 2.1 | 80 |
|  | 38 | Support 12 | 10 | Image recording layer 1 | None | Particles | Particles having diameter of 3.2 μm (ARTPEARL J-5P) | Image recording layer | 1000 | 2.1 | 80 |
|  | 39 | Support 13 | 10 | Image recording layer 1 | None | Particles | Particles having diameter of 3.2 μm (ARTPEARL J-5P) | Image recording layer | 1000 | 2.1 | 80 |

TABLE 10-continued

|  |  | Side opposite to side where image recording layer is provided | | | Total reciprocal | Evaluation results | | | | |
|---|---|---|---|---|---|---|---|---|---|---|
|  |  | Means for forming unevenness | Sa (μm) | Bekk smoothness (s) | Total value Sa (μm) | value of Bekk smoothness (1/s) | On-press development delay resistance | Setter plate feeding property | Rubbing and peeling resistance | Scratch resistance | Ease of peeling |
| Example | 31 | None None | 0 | 1200 | 2.2 | 0.01333 | 5 | 5 | 5 | 5 | 5 |
|  | 32 | None None | 0 | 1200 | 2.2 | 0.01333 | 5 | 5 | 5 | 5 | 5 |
|  | 33 | None None | 0 | 1200 | 2.2 | 0.01333 | 5 | 5 | 5 | 5 | 5 |
|  | 34 | None None | 0 | 1200 | 2.2 | 0.01333 | 5 | 5 | 5 | 5 | 5 |
|  | 35 | None None | 0 | 1200 | 2.2 | 0.01333 | 5 | 5 | 5 | 5 | 5 |
|  | 36 | None None | 0 | 1200 | 2.2 | 0.01333 | 5 | 5 | 5 | 5 | 5 |
|  | 37 | None None | 0 | 1200 | 2.2 | 0.01333 | 5 | 5 | 5 | 5 | 5 |
|  | 38 | None None | 0 | 1200 | 2.2 | 0.01333 | 5 | 5 | 5 | 5 | 5 |
|  | 39 | None None | 0 | 1200 | 2.2 | 0.01333 | 5 | 5 | 5 | 5 | 5 |

Based on the results listed in Tables 8 to 10, it was understood that the lithographic printing plate precursor according to the present disclosure has an excellent development delay resistance and an excellent plate feeding property of taking out a precursor from a laminate compared to the lithographic printing plate precursors of the comparative examples. Further, it was understood that the lithographic printing plate precursor according to the present disclosure has excellent rubbing and peeling resistance, scratch resistance, and ease of peeling at the time of lamination without using interleaving paper.

Further, the average particle diameter of the particles in the image recording layer of each lithographic printing plate precursor of Examples 1 to 39 was measured using the above-described measuring device. As the result, two peaks were observed.

Example 40

<Preparation of Support 14>

—Aluminum Plate—

A molten metal was prepared using an aluminum alloy containing 0.06% by mass of Si, 0.30% by mass of Fe, 0.005% by mass of Cu, 0.001% by mass of Mn, 0.001% by mass of Mg, 0.001% by mass of Zn, and 0.03% by mass of Ti and, as the remainder, aluminum and unavoidable impurities, a molten metal treatment and filtration were performed, and an ingot having a thickness of 500 mm and a width of 1200 mm was prepared according to a DC casting method. The surface was scraped off using a surface grinder having an average thickness of 10 mm and heated at 550° C. and maintained the state for approximately 5 hours. After the temperature was decreased to 400° C., a rolled sheet having a thickness of 2.7 mm was obtained using a hot rolling mill. Further, a heat treatment was performed thereon at 500° C. using a continuous annealing machine, and a cold rolling was performed so that the thickness of the rolled sheet was finished to 0.24 mm, thereby obtaining an aluminum plate formed of JIS 1050 material. The following surface treatment was performed after the width of this aluminum plate was adjusted to 1030 mm.

—Surface Treatment—

The surface treatment was performed by continuously performing the following treatments of (b) to (j).

Further, liquid cutting was performed using a nip roller after each treatment and washing with water.

(b) Alkali Etching Treatment

The aluminum plate obtained in the above-described manner was subjected to an etching treatment by spraying an aqueous solution in which the concentration of caustic soda was 2.6% by mass and the concentration of aluminum ions was 6.5% by mass at a temperature of 70° C. so that 6 g/m$^2$ of the aluminum plate was dissolved. Thereafter, washing with water by spraying was performed.

(c) Desmutting Treatment

A desmutting treatment was performed by spraying an acidic aqueous solution (containing 0.5% by mass of aluminum ions) having a nitric acid concentration of 1% by mass at a temperature of 30° C. Thereafter, a desmutting treatment was performed using a spray. As the nitric acid aqueous solution used for the desmutting treatment, a waste liquid used for the step of performing the electrochemical roughening treatment using the alternating current in a nitric acid aqueous solution was used.

(d) Electrochemical Roughening Treatment

An electrochemical roughening treatment was continuously performed using an AC voltage of 60 Hz. As an electrolytic solution at this time, an aqueous solution containing 10.5 g/L of nitric acid (containing 5 g/L of aluminum ions and 0.007% by mass of ammonium ions) at a liquid temperature of 50° C. was used. The AC power source waveform is a waveform illustrated in FIG. 1. Further, using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 30 A/dm$^2$ in terms of the peak current value, and the electric quantity was 220 C/dm$^2$ as the total electric quantity at the time of anodization of the aluminum plate. Further, 5% of the current from the power source was separately flowed to the auxiliary anode. Thereafter, washing with water was performed using a spray.

(e) Alkali Etching Treatment

The aluminum plate was subjected to an etching treatment by spraying an aqueous solution in which the concentration of caustic soda was 26% by mass and the concentration of aluminum ions was 6.5% by mass at a temperature of 32° C. so that 0.25 g/m$^2$ of the aluminum plate was dissolved. Further, a smut component mainly containing aluminum hydroxide generated at the time of the electrochemical roughening treatment using the alternating current at the former stage was removed, an edge portion of a generated pit was dissolved to smooth the edge portion. Thereafter, washing with water by spraying was performed.

(f) Desmutting Treatment

A desmutting treatment was performed by spraying an acidic aqueous solution (containing 4.5% by mass of aluminum ions) having a sulfuric acid concentration of 15% by mass at a temperature of 30° C. Thereafter, washing with water was performed using a spray. As the nitric acid aqueous solution used for the desmutting treatment, a waste liquid used for the step of performing the electrochemical roughening treatment using the alternating current in a nitric acid aqueous solution was used.

(g) Electrochemical Roughening Treatment

An electrochemical roughening treatment was continuously performed using an AC voltage of 60 Hz. As an electrolytic solution at this time, an aqueous solution containing 2.5 g/L of hydrochloric acid (containing 5 g/L of aluminum ions) at a liquid temperature of 35° C. was used. The AC power source waveform is a waveform illustrated in FIG. 1. Further, using a trapezoidal rectangular waveform AC having a time tp, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 2 was used as the electrolytic cell. The current density was 25 A/dm² in terms of the peak current value, and the electric quantity was 50 C/dm² as the total electric quantity at the time of anodization of the aluminum plate. Thereafter, washing with water was performed using a spray.

(h) Alkali Etching Treatment

The aluminum plate was subjected to an etching treatment by spraying an aqueous solution in which the concentration of caustic soda was 26% by mass and the concentration of aluminum ions was 6.5% by mass at a temperature of 32° C. so that 0.1 g/m² of the aluminum plate was dissolved. Further, a smut component mainly containing aluminum hydroxide generated at the time of the electrochemical roughening treatment using the alternating current at the former stage was removed, an edge portion of a generated pit was dissolved to smooth the edge portion. Thereafter, washing with water by spraying was performed.

(i) Desmutting Treatment

A desmutting treatment was performed by spraying an acidic aqueous solution (containing 0.5% by mass of aluminum ions) having a sulfuric acid concentration of 25% by mass at a temperature of 60° C. Thereafter, washing with water was performed using a spray.

(j) Anodization Treatment

An anodization treatment was performed with an anodizing device having a structure illustrated in FIG. 3, thereby obtaining a support 14. As the electrolytic solution supplied to first and second electrolysis portions, sulfuric acid was used. The electrolytic solution had a sulfuric acid concentration of 170 g/L (containing 0.5% by mass of aluminum ions) and the temperature thereof was 38° C. Thereafter, washing with water was performed using a spray. The final oxide coating amount was 2.7 g/m².

<Undercoat Layer Coating Solution (1)>
Compound (2) for undercoat layer having structure shown below: 0.18 parts
Tetrasodium ethylenediaminetetraacetate: 0.10 parts
Polyoxyethylene lauryl ether: 0.03 parts
Water: 61.39 parts

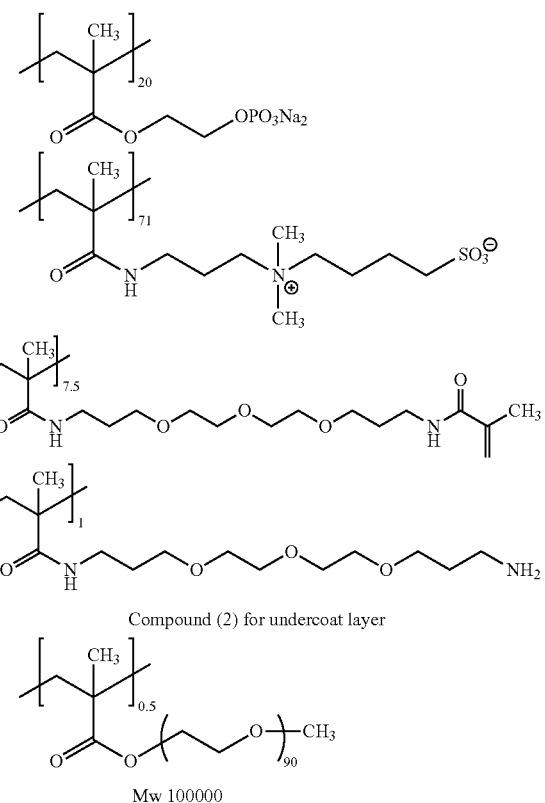

Compound (2) for undercoat layer

Mw 100000

The numerical values on the lower right side of the parentheses of each constitutional unit in the compound (2) for an undercoat layer indicate the mass ratios and the numerical values on the lower right side of the parentheses of each ethyleneoxy unit indicate repetition numbers.

[Preparation of Lithographic Printing Plate Precursor A]

(3) Formation of Image Recording Layer

The undercoat layer on the support 1 formed in the above-described manner was bar-coated with an image recording layer coating solution (1) with the following composition and dried in an oven at 100° for 60 seconds, thereby forming an image recording layer having a drying coating amount of 1.0 g/m².

The image recording layer coating solution (1) was obtained by mixing a photosensitive solution (1) and a microgel solution (1) described below immediately before the coating and then stirring the solution.

<Photosensitive Solution (1)>
Binder polymer (1) [the following structure, Mw: 50000, n: number of ethylene oxide (EO) units: 4]: 0.480 parts
Infrared absorbing agent (1) [the following structure]: 0.030 parts
Borate compound [Sodium tetraphenyl borate]: 0.014 parts
Radical polymerization initiator (1) [the following structure]: 0.234 parts
Radical polymerizable compound [tris(acryloyloxyethyl) isocyanurate, NK ESTER A-9300, manufactured by Shin-Nakamura Chemical Co., Ltd.]: 0.192 parts
Low-molecular weight hydrophilic compound (1) [tris(2-hydroxyethyl)isocyanurate]: 0.052 parts
Anionic surfactant 1 [the following structure]: 0.099 g
Oil sensitizer phosphonium compound (1) [the following structure]: 0.12 parts Oil sensitizer ammonium group-containing polymer (1) [the following structure, reduced specific viscosity of 44 ml/g]: 0.035 parts Oil sensitizer benzyl dimethyl octyl ammonium. $PF_6$ salt: 0.032 parts Colorant ethyl violet [the following structure]: 0.030 part Fluorine-based surfactant (1) [the following structure]: 0.02 parts 2-Butanone: 1.091 parts 1-Methoxy-2-propanol: 8.609 parts

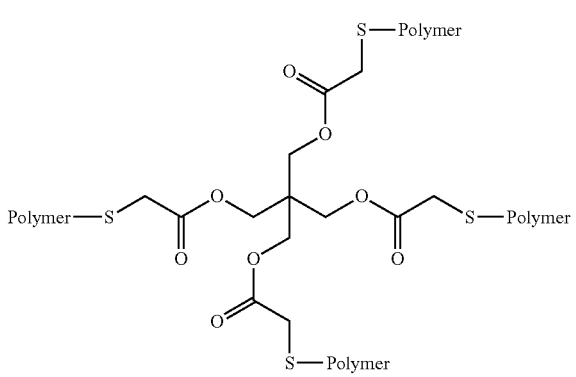

Polymer moiety shown above

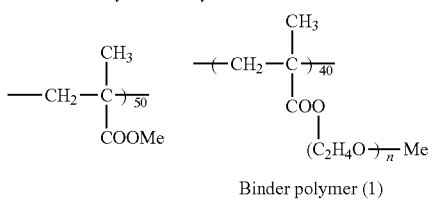

Binder polymer (1)

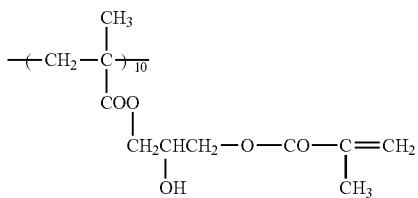

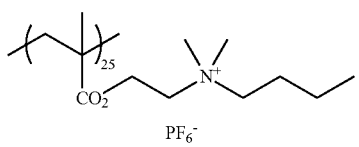

Ammonium group-containing polymer

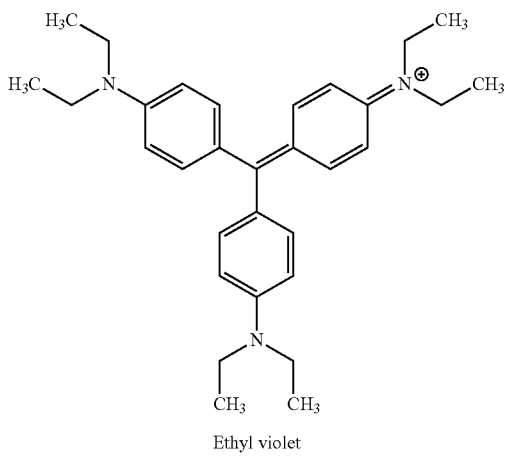

Ethyl violet

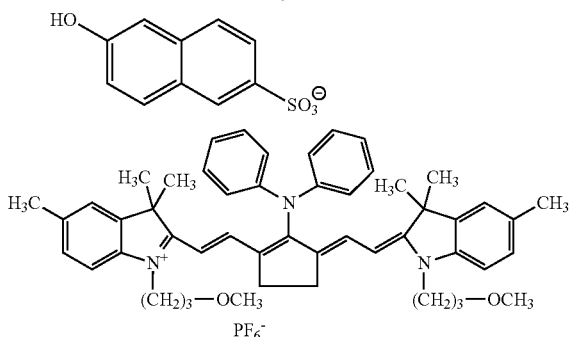

Infrared absorbing agent (1)

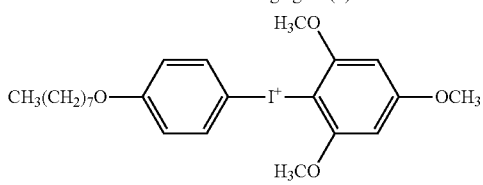

Radical polymerization initiator (1)

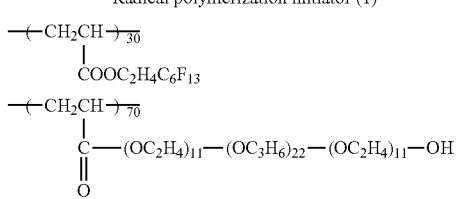

(Mw 13,000)

Fluorine-based surfactant (1)

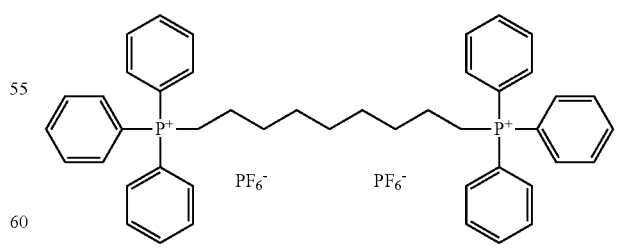

Phosphonium compound (1)

Further, Me represents a methyl group, and the numerical values on the lower right side of the parentheses of each constitutional unit of the binder polymer (1) and the ammonium group-containing polymer indicate molar ratios.

The numerical values on the lower right side of the parentheses of each constitutional unit in the fluorine-based surfactant (1) indicate the molar ratios and the numerical values on the lower right side of the parentheses of the ethyleneoxy unit or the propyleneoxy unit indicate repetition numbers.

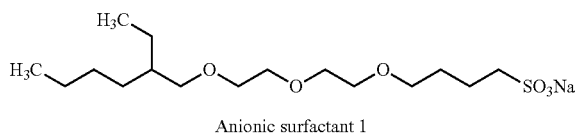

Anionic surfactant 1

<Microgel Solution (1)>

Microgel (1): 1.580 parts

Distilled water: 1.455 parts

A synthesis method of the above-described microgel (1) is as follows.

—Synthesis of Microgel (1)—

10 parts of an adduct (TAKENATE D-110N, manufactured by Mitsui Chemicals Polyurethanes, Inc.) of trimethylolpropane and xylene diisocyanate, 5.54 parts of dipentaerythritol pentaacrylate (SR-399, manufactured by Sartomer Japan Inc.), and 0.1 parts of PIONINE A-41C (manufactured by TAKEMOTO OIL & FAT Co., Ltd.), as oil phase components, were dissolved in 17 parts of ethyl acetate. As a water phase component, 40 parts of a 4 mass % aqueous solution of PVA-205 was prepared. The oil phase components and the water phase components were mixed with each other and emulsified at 12,000 rpm for 10 minutes using a homogenizer. 25 parts of distilled water was added to the obtained emulsion, and the resultant was stirred at room temperature (25° C., the same applies hereinafter) for 30 minutes and stirred at 50° C. for 3 hours. The microgel solution obtained in this manner was diluted with distilled water such that the concentration of solid contents was set to 15% by mass, thereby preparing a microgel (1). The average particle diameter of the microgel measured by a light scattering method was 0.2 µm.

(4) Formation of Protective Layer

The image recording layer was bar-coated with a protective layer coating solution (1) with the following composition and dried in an oven at 120° C. for 60 seconds to form a protective layer having a drying coating amount of 0.15 g/m², thereby preparing a lithographic printing plate precursor of Example 40.

<Protective Layer Coating Solution (1)>

Inorganic layered compound dispersion liquid (1) (obtained below): 1.5 parts

Hydrophilic polymer (1) (solid content) [the following structure, Mw: 30000]: 0.55 parts 6 mass % aqueous solution of polyvinyl alcohol (CKS50, sulfonic acid-modified, saponification degree of 99% by mole or greater, degree of polymerization of 300, manufactured by Nippon Synthetic Chemical Industry Co., Ltd.): 0.10 parts 6 mass % aqueous solution of polyvinyl alcohol (PVA-405, saponification degree of 81.5% by mole, degree of polymerization of 500, manufactured by KURARAY CO., LTD.): 0.03 parts 80 mass % aqueous solution of surfactant (RAPISOL A-80 (trade name), manufactured by NOF Corporation): 0.011 parts Ion exchange water: 6.0 parts

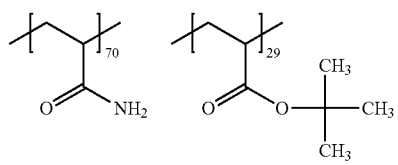

Hydrophilic polymer (1)

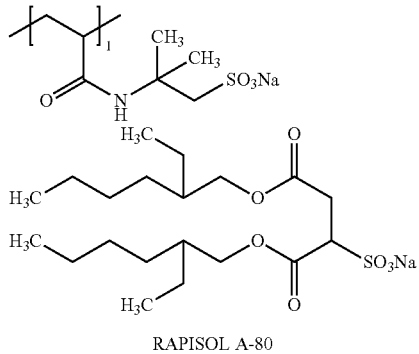

RAPISOL A-80

Further, the numerical values on the lower right side of the parentheses of each constitutional unit in the hydrophilic polymer (1) indicate the molar ratios.

<Preparation of Inorganic Layered Compound Dispersion Liquid (1)>

6.4 parts of synthetic mica SOMASIF ME-100 (manufactured by CO-OP CHEMICAL CO., LTD.) was added to 193.6 g of ion exchange water and dispersed such that the average particle diameter (laser scattering method) was set to 3 µm using a homogenizer. The aspect ratio of the obtained dispersed particles was 100 or greater.

<Exposure and Development>

The lithographic printing plate precursors were exposed under conditions of a laser output of 70%, an external surface drum rotation speed of 1000 rpm (for each time) and a resolution of 2400 dpi (dot per inch) using Luxel PLA-TESETTER T-6000III (manufactured by Fujifilm Corporation) equipped with an infrared semiconductor laser. A solid image and a 50% halftone dot chart were included in the exposed image.

Figure 4:
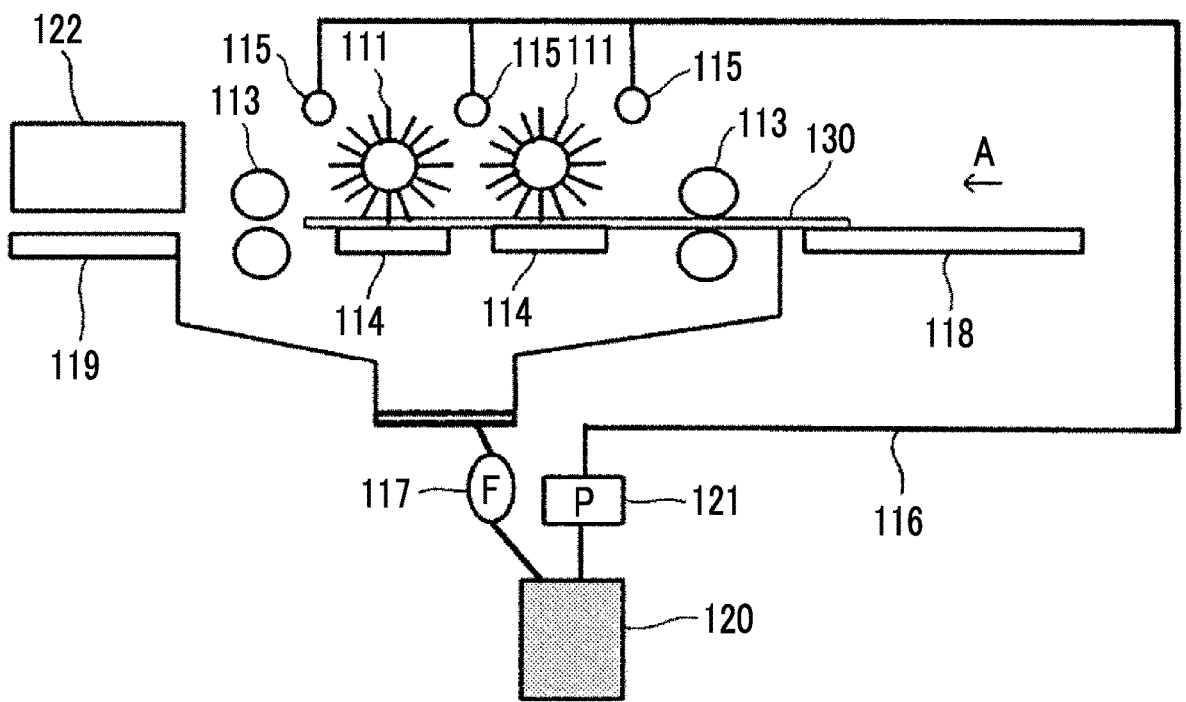
FIG. 4 is a schematic view illustrating a structure of an example of a development treatment device which can be suitably used in the present disclosure.

Next, the development treatment was performed using the developer 1 with the following composition and the automatic development treatment device having a structure illustrated in FIG. 4, thereby obtaining a lithographic printing plate.

The development treatment device exemplified in FIG. 4 is an automatic development treatment device including two rotary brush rolls 111. A brush roll having an external diameter of 55 mm in which polybutylene terephthalate fibers (diameter of bristles: 200 µm, length of bristle: 7 mm) were implanted was used as the rotary brush roll 111, and the roll was allowed to rotate 120 times (the peripheral speed of the brush tip: 0.94 m/s) per minute in the same direction as the transportation direction.

A lithographic printing plate precursor 130 after the exposure was completed was transported in the transportation direction illustrated in the figure between two pairs of transport rolls 113 from a plate feed stand 118 to a plate discharge stand 119 at a transportation speed of 60 cm/min on a transport guide plate 114 such that the lithographic printing plate precursor 130 was allowed to pass through a space between the rotary brush roll 111 and the transport guide plate 114.

In three spray pipes 115, the developer stored in a developer tank 120 was supplied by a circulation pump 121 through a filter 117 using a pipe line 116, and the developer was supplied to the plate surface from each spray pipe 115 by performing showering. Further, the volume of the developer tank 120 was 20 liters, and the developer was recycled. The lithographic printing plate discharged from the development treatment device was dried by a dryer 122 without being washed with water.

<Developer 1>

Surfactant-1 shown below (PELEX NBL, manufactured by Kao Corporation): 7.43 g

Surfactant-2 shown below (NEWCOL B13, manufactured by Nippon Nyukazai Co., Ltd.): 1.45 g Surfactant-3 shown below (SURFYNOL 2502, manufactured by Air Products and Chemicals, Inc.): 0.4 g Benzyl alcohol: 0.6 g Sodium gluconate: 2.77 g Disodium monohydrogenphosphate: 0.3 g Sodium hydrogen carbonate: 0.22 g Antifoaming agent (SILCOLAPSE 432, manufactured by Bluestar Silicones): 0.005 g Water: 86.83 g Surfactant-1

$C_4H_9$—[naphthalene]—$SO_3Na$

Surfactant-2

[naphthalene]—$O(CH_2CH_2)_{13}OH$

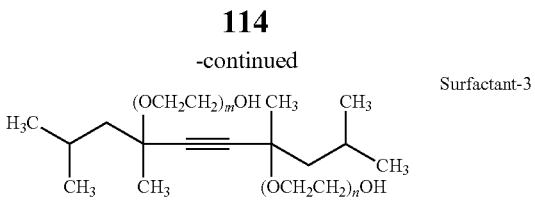

Surfactant-3

<Development Delay Resistance>

After the development was completed, the scoring was performed based on the following standard. The evaluation results are listed in Table 11. Each lithographic printing plate having a size of 5 cm×5 cm after development was observed using a 25 magnification loupe, and the number of residual films was counted.

[Evaluation Standard]

5: The number of residual films was 0.

4: The number of residual films was 1 or 2.

3: The number of residual films was in a range of 3 to 10.

2: The number of residual films was in a range of 11 to 50.

1: The number of residual films was 50 or greater.

Further, evaluations other than the on-press development delay resistance were performed on the lithographic printing plate precursor of Example 40 according to the same method as in Example 1. The evaluation results are listed in Table 11.

Comparative Examples 6 to 8

<Preparation of Lithographic Printing Plate Precursors>

Each lithographic printing plate precursor was obtained according to the same method as in Example 40 except that the image forming layer listed in Table 11 was formed on the support listed in Table 11, the protective layer listed in Table 11 was formed thereon, and unevenness was formed on the outermost layer using the means for forming unevenness listed in Table 11.

Further, exposure, development, and evaluation were performed on the obtained lithographic printing plate precursor according to the same methods as in Example 40. The evaluation results are collectively listed in Table 11.

TABLE 11

| | | Support | | Side where image recording layer is provided | | | | | | |
|---|---|---|---|---|---|---|---|---|---|---|
| | | Type | Elapsed time (days) of support after anodization treatment | Image recording layer | Protective layer | Means for forming unevenness | Unevenness formation position | In-plane density of particles (pcs/mm$^2$) | Sa (μm) | Bekk smoothness (s) |
| Example | 40 | Support 14 | 10 | Image recording layer 4 | Present | Particles | Particles having diameter of 3.2 μm (ARTPEARL J-5P) | Protective layer | 1000 | 1.9 | 80 |
| Comparative Example | 6 | Support 14 | 10 | Image recording layer 4 | Present | Particles | Particles having diameter of 120 μm (ARTPEARL GR-50W) | Protective layer | 1000 | 62 | 0.5 |
| | 7 | Support 14 | 10 | Image recording layer 4 | Present | — | — | Protective layer | Particles were not available | 0.2 | 500 |

TABLE 11-continued

| | | | | | | | | | |
|---|---|---|---|---|---|---|---|---|---|
| 8 | Support 14 | 10 | Image recording layer 4 | Present | Protrusions | Coating with liquid droplets using spray (PVA aqueous solution) | Protective layer | Particles were not available | 30 | 1 |

| | | Side opposite to side where image recording layer is is provided | | | Total reciprocal | Evaluation results | | | | |
|---|---|---|---|---|---|---|---|---|---|---|---|
| | | Means for forming unevenness | Sa (μm) | Bekk smoothness (s) | Total value Sa (μm) | value of Bekk smoothness (1/s) | On-press development delay resistance | Setter plate feeding property | Rubbing and peeling resistance | Scratch resistance | Ease of peeling |
| Example | 40 | None None | 0 | 1200 | 2 | 0.01333 | 5 | 4 | 4 | 5 | 5 |
| Comparative Example | 6 | None None | 0 | 1200 | 62.1 | 2.00083 | 1 | 5 | 1 | 5 | 5 |
| | 7 | None None | 0 | 1200 | 0.3 | 0.00283 | 5 | 1 | 5 | 2 | 1 |
| | 8 | None None | 0 | 1200 | 30.1 | 1.00083 | 1 | 5 | 2 | 5 | 5 |

Based on the results listed in Table 11, it was understood that the lithographic printing plate precursor of Example 40 has an excellent development delay resistance and an excellent plate feeding property of taking out a precursor from a laminate compared to the lithographic printing plate precursors of Comparative Examples 6 to 8. Further, it was understood that the lithographic printing plate precursor according to the present disclosure has excellent rubbing and peeling resistance, scratch resistance, and ease of peeling at the time of lamination without using interleaving paper.

The disclosure of JP2017-072053 filed on Mar. 31, 2017 is incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A lithographic printing plate precursor comprising:
a hydrophilized aluminum support; and
a water-soluble or water-dispersible negative type image recording layer provided on the aluminum support,
wherein an arithmetic average height Sa of a surface of an outermost layer on a side where the image recording layer is provided is in a range of 0.3 μm to 20 μm,
the image recording layer contains a polymer compound having a particle shape,
the polymer compound having a particle shape has a hydrophobic main chain and both of (i) constitutional unit which contains a pendant-cyano group directly bonded to the hydrophobic main chain and (ii) constitutional unit which contains a pendant group having a hydrophilic polyalkylene oxide segment;
the aluminum support includes an aluminum plate and an aluminum anodized film disposed on the aluminum plate,
the anodized film is positioned closer to the image recording layer side than to the aluminum plate,
the anodized film has micropores extending in a depth direction from the surface of the image recording layer side, and
the average diameter of the micropores in the surface of the anodized film is in a range of 7 nm to 150 nm.

2. The lithographic printing plate precursor according to claim 1,
wherein the image recording layer contains an infrared absorbing agent, a polymerization initiator, a polymerizable compound, and the polymer compound having a particle shape.

3. The lithographic printing plate precursor according to claim 1, further comprising:
a protective layer on the image recording layer.

4. The lithographic printing plate precursor according to claim 1,
wherein the image recording layer contains at least one kind of particles having an average particle diameter of 0.5 μm to 20 μm and two or more kinds of particles having different average particle diameters.

5. The lithographic printing plate precursor according to claim 3,
wherein the protective layer contains at least one kind of particles having an average particle diameter of 0.5 pin to 20 μm.

6. The lithographic printing plate precursor according to claim 4,
wherein an in-plane density of the particles having an average particle diameter of 0.5 μm to 20 μm is 10000 pcs/mm$^2$ or less.

7. The lithographic printing plate precursor according to claim 4,
wherein the particles having an average particle diameter of 0.5 μm to 20 μm are at least one kind of particles selected from the group consisting of organic resin particles and inorganic particles.

8. The lithographic printing plate precursor according to claim 2,
wherein the image recording layer is an outermost layer and has a plurality of protrusions containing, as a main component, a polymer compound on the image recording layer.

9. The lithographic printing plate precursor according to claim 3,
wherein the protective layer is an outermost layer and has a plurality of protrusions containing, as a main component, a polymer compound on the protective layer.

10. The lithographic printing plate precursor according to claim 8,
wherein the polymer compound constituting the protrusions contains at least one selected from the group consisting of a phenol formaldehyde resin, an m-cresol formaldehyde resin, a p-cresol formaldehyde resin, an m-/p-mixed cresol formaldehyde resin, or a phenol/ cresol-mixed formaldehyde resin, a resol resin, pyrogallol, an acetone resin, an epoxy resin, a saturated copolymer polyester resin, a phenoxy resin, a polyvinyl acetal resin, a vinylidene chloride copolymer resin, polybutene, polybutadiene, polyamide, an unsaturated copolymer polyester resin, polyurethane, polyurea, polyimide, polysiloxane, polycarbonate, chlorinated polyethylene, an aldehyde condensation resin of alkyl phenol, polyvinyl chloride, polyvinylidene chloride, polystyrene, polyacrylate, a carboxyvinyl polymer, an acrylic resin copolymer resin, hydroxy cellulose, hydroxymethyl cellulose, polyvinyl alcohol, polyvinylpyrrolidone, cellulose acetate, methyl cellulose, and carboxymethyl cellulose.

11. The lithographic printing plate precursor according to claim 1,
wherein an arithmetic average height Sa of a surface of an outermost layer on a side opposite to the side where the image recording layer is provided is in a range of 0.1 μm to 20 μm.

12. The lithographic printing plate precursor according to claim 1,
wherein a total value of the arithmetic average height Sa of the surface of the outermost layer on the side where the image recording layer is provided and the arithmetic average height Sa of the surface of the outermost layer on a side opposite to the side where the image recording layer is provided is greater than 0.3 μm and 20 μm or less.

13. The lithographic printing plate precursor according to claim 1, which satisfies Expression (1) and Expression (2) in a case where a Bekk smoothness of the surface of the outermost layer on the side where the image recording layer is provided is set as a seconds and a Bekk smoothness of a surface of an outermost layer on a side opposite to the side where the image recording layer is provided is set as b seconds $$a \leq 1000, b \leq 1000 \quad (1)$$

$$1/a + 1/b \geq 0.002 \quad (2).$$

14. The lithographic printing plate precursor according to claim 11,
wherein a back coat layer which contains particles having an average particle diameter of 0.1 μm to 20 μm is provided, as the outermost layer, on the side opposite to the side where the image recording layer is provided.

15. The lithographic printing plate precursor according to claim 11,
wherein the surface of the outermost layer on the side opposite to the side where the image recording layer is provided has a plurality of protrusions.

16. The lithographic printing plate precursor according to claim 15, which includes at least one layer between the protrusions, provided on the side opposite to the side where the image recording layer is provided, and the aluminum support.

17. The lithographic printing plate precursor according to claim 1,
wherein the average diameter of the micropores in the surface of the anodized film is in a range of 10 nm to 100 nm.

18. The lithographic printing plate precursor according to claim 1,
wherein the micropores are formed of large-diameter pores extending to a position at a depth of 10 nm to 1000 nm from the surface of the anodized film and small-diameter pores communicating with a bottom of the large-diameter pores and extending to a position at a depth of 20 nm to 2000 nm from a communication position,
the average diameter of the large-diameter pores in the surface of the anodized film is in a range of 15 to 150 nm, and
the average diameter of the small-diameter pores in the communication position is 13 nm or less.

19. A method of producing the lithographic printing plate precursor according to claim 1, comprising:
a step of forming the image recording layer on the aluminum support after one or more days from an anodization treatment performed thereon.

20. A plate-making method for a lithographic printing plate, comprising:
a step of image-exposing the lithographic printing plate precursor according to claim 1; and
a step of supplying at least any of printing ink or dampening water and removing an unexposed portion of an image recording layer on a printing press to prepare a lithographic printing plate.

21. A plate-making method for a lithographic printing plate, comprising:
a step of image-exposing the lithographic printing plate precursor according to claim 1; and
a step of supplying a developer having a pH of 2 to 14 and removing an unexposed portion of an image recording layer to prepare a lithographic printing plate.

22. A lithographic printing method comprising:
a step of image-exposing the lithographic printing plate precursor according to claim 1;
a step of supplying at least any of printing ink or dampening water and removing an unexposed portion of an image recording layer on a printing press to prepare a lithographic printing plate; and
a step of performing printing using the obtained lithographic printing plate.

23. A lithographic printing method comprising:
a step of image-exposing the lithographic printing plate precursor according to claim 1;
a step of supplying a developer having a pH of 2 to 14 and removing the unexposed portion of an image recording layer to prepare a lithographic printing plate; and
a step of performing printing using the obtained lithographic printing plate.

* * * * *